(12) United States Patent
Or-Bach et al.

(10) Patent No.: US 11,682,683 B2
(45) Date of Patent: Jun. 20, 2023

(54) 3D MICRO DISPLAY DEVICE AND STRUCTURE

(71) Applicant: Monolithic 3D Inc., Klamath Falls, OR (US)

(72) Inventors: Zvi Or-Bach, Haifa (IL); Deepak C. Sekar, Sunnyvale, CA (US)

(73) Assignee: MONOLITHIC 3D INC., Klamath Falls, OR (US)

( * ) Notice: Subject to any disclaimer, the term of this patent is extended or adjusted under 35 U.S.C. 154(b) by 5 days.

(21) Appl. No.: 17/967,312

(22) Filed: Oct. 17, 2022

(65) Prior Publication Data
US 2023/0038149 A1    Feb. 9, 2023

Related U.S. Application Data

(63) Continuation-in-part of application No. 17/739,339, filed on May 9, 2022, which is a continuation-in-part of application No. 17/669,099, filed on Feb. 10, 2022, now Pat. No. 11,374,042, which is a continuation-in-part of application No. 17/487,369,
(Continued)

(51) Int. Cl.
| H01L 27/146 | (2006.01) |
| H01L 27/28 | (2006.01) |
| H01L 33/50 | (2010.01) |
| H01L 33/16 | (2010.01) |
| H01L 27/12 | (2006.01) |
| H01L 27/24 | (2006.01) |
| H01L 27/30 | (2006.01) |
| H01L 31/0352 | (2006.01) |
| H01L 27/32 | (2006.01) |

(52) U.S. Cl.
CPC ...... *H01L 27/14603* (2013.01); *H01L 27/124* (2013.01); *H01L 27/2409* (2013.01); *H01L 27/281* (2013.01); *H01L 27/307* (2013.01); *H01L 31/0352* (2013.01); *H01L 33/16* (2013.01); *H01L 33/50* (2013.01); *H01L 27/2436* (2013.01); *H01L 27/3206* (2013.01)

(58) Field of Classification Search
CPC ............ H01L 27/124; H01L 27/14601; H01L 27/14603; H01L 27/14605; H01L 27/156; H01L 27/2409; H01L 27/2436; H01L 27/281; H01L 27/307; H01L 27/3206; H01L 25/042; H01L 25/0756; H01L 24/14603; H01L 31/02016; H01L 31/02327; H01L 31/0352; H01L 31/16; H01L 33/16; H01L 33/50; H01L 33/62
See application file for complete search history.

(56) References Cited

U.S. PATENT DOCUMENTS

2007/0102737 A1*   5/2007   Kashiwabara ...... H01L 51/5218
                                                                  257/291

* cited by examiner

*Primary Examiner* — Cheung Lee
(74) *Attorney, Agent, or Firm* — Patent PC; Bao Tran

(57) ABSTRACT

A 3D micro display, the 3D micro display including: a first level including a first single crystal layer, the first single crystal layer includes a plurality of LED driving circuits; a second level including a first plurality of light emitting diodes (LEDs), the first plurality of LEDs including a second single crystal layer; a third level including a second plurality of light emitting diodes (LEDs), the second plurality of LEDs including a third single crystal layer, where the first level is disposed on top of the second level, where the second level includes at least ten individual first LED pixels; and a bonding structure, where the bonding structure includes oxide to oxide bonding.

20 Claims, 27 Drawing Sheets

Related U.S. Application Data filed on Sep. 28, 2021, now Pat. No. 11,315,965, which is a continuation-in-part of application No. 17/216,597, filed on Mar. 29, 2021, now Pat. No. 11,164,898, which is a continuation-in-part of application No. 17/113,045, filed on Dec. 5, 2020, now Pat. No. 10,998,374, which is a continuation-in-part of application No. 17/027,217, filed on Sep. 21, 2020, now Pat. No. 10,943,934, which is a continuation-in-part of application No. 16/860,027, filed on Apr. 27, 2020, now Pat. No. 10,833,108, which is a continuation-in-part of application No. 15/920,499, filed on Mar. 14, 2018, now Pat. No. 10,679,977, which is a continuation-in-part of application No. 14/936,657, filed on Nov. 9, 2015, now Pat. No. 9,941,319, which is a continuation-in-part of application No. 13/274,161, filed on Oct. 14, 2011, now Pat. No. 9,197,804, which is a continuation-in-part of application No. 12/904,103, filed on Oct. 13, 2010, now Pat. No. 8,163,581.

(60) Provisional application No. 63/256,576, filed on Oct. 17, 2021.

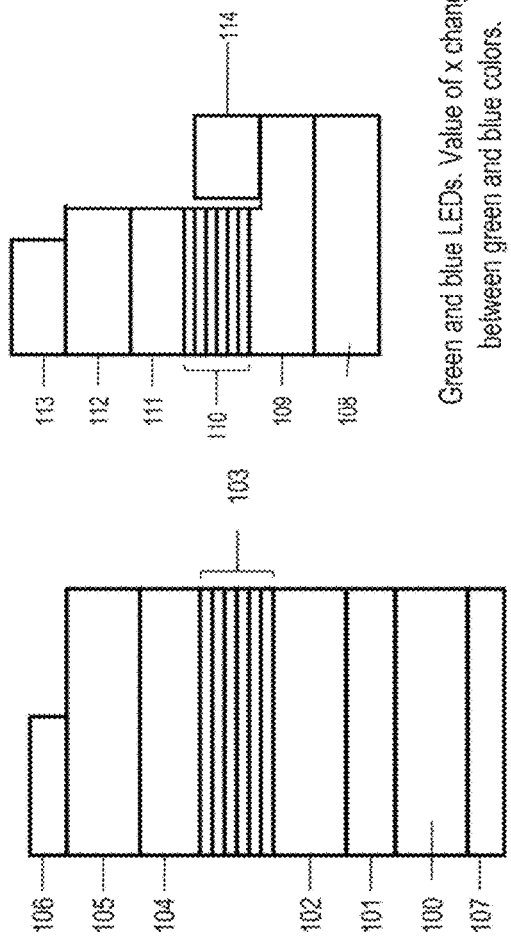
Fig. 1A (Prior Art)
Fig. 1B (Prior Art)
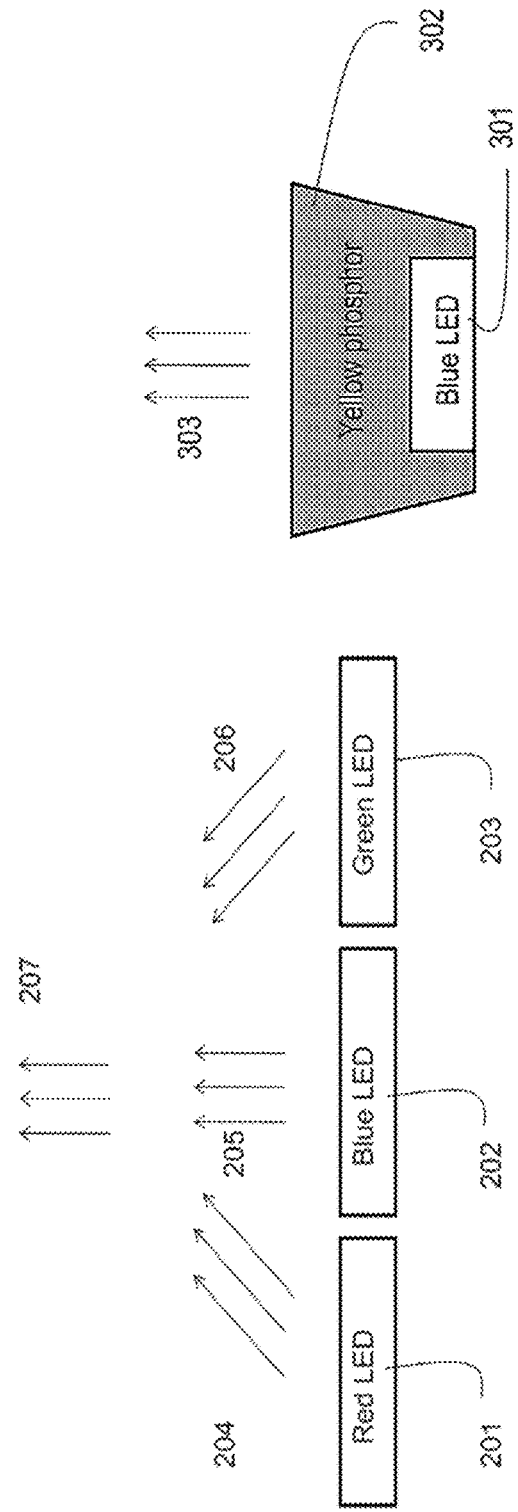
Fig. 2 (Prior Art)
Fig. 3 (Prior Art)

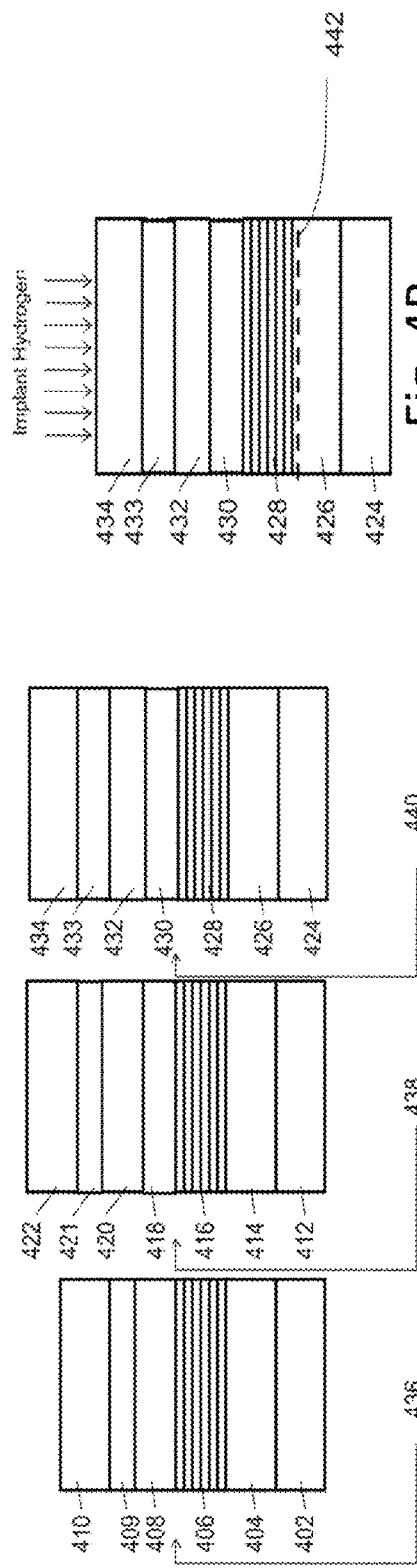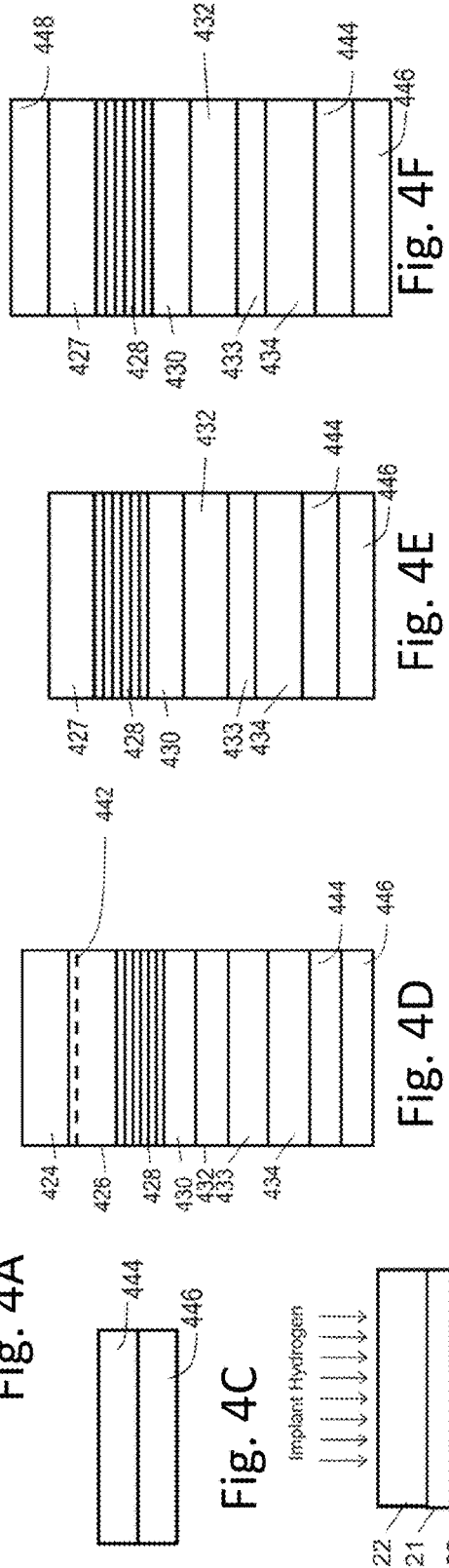

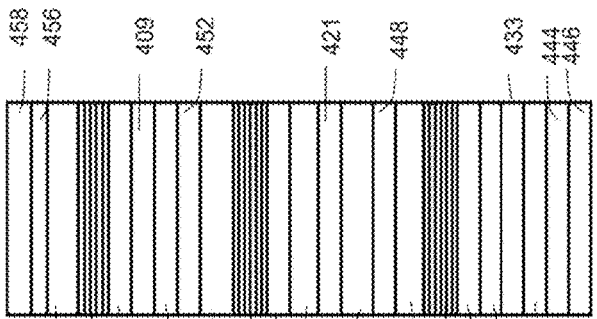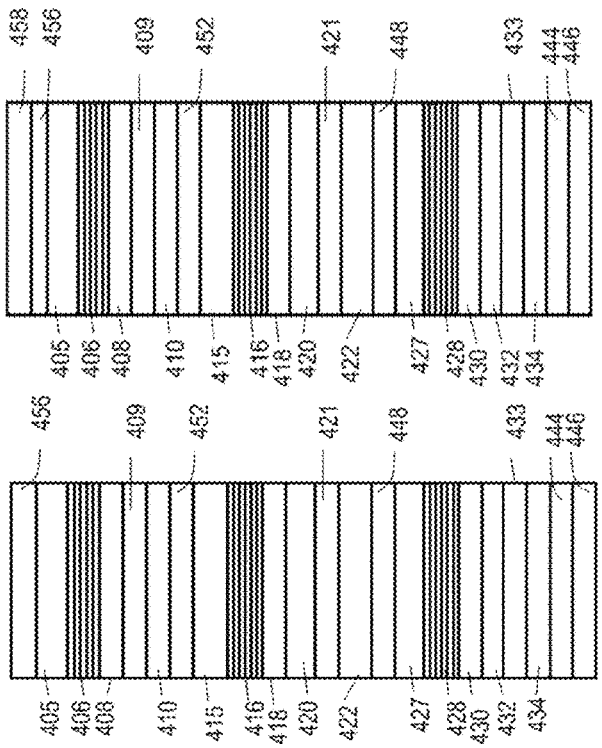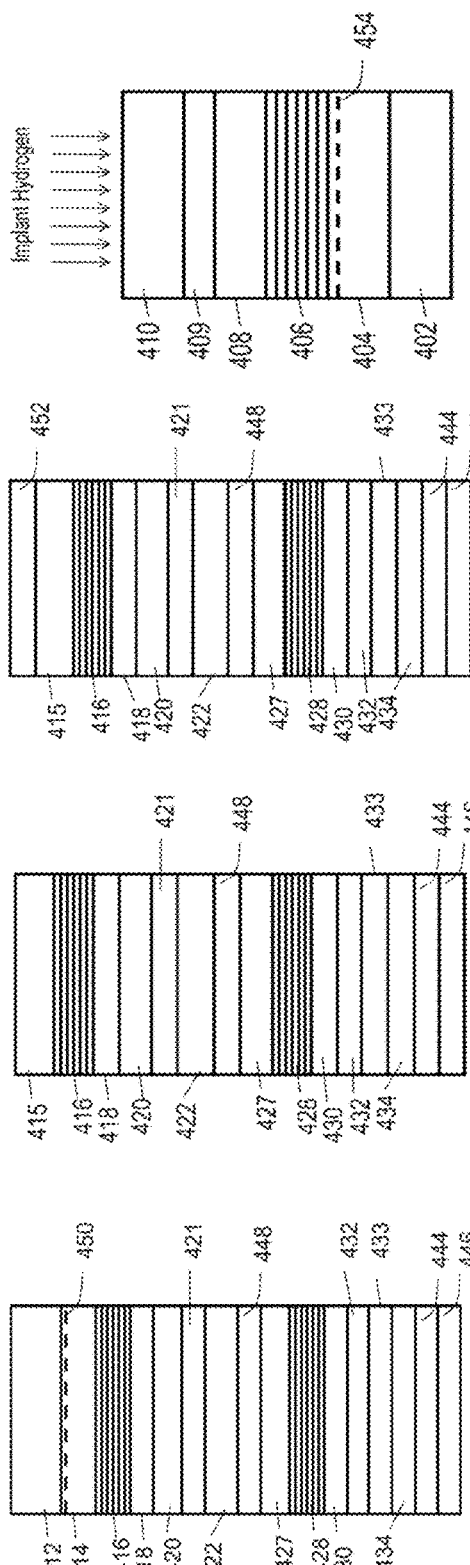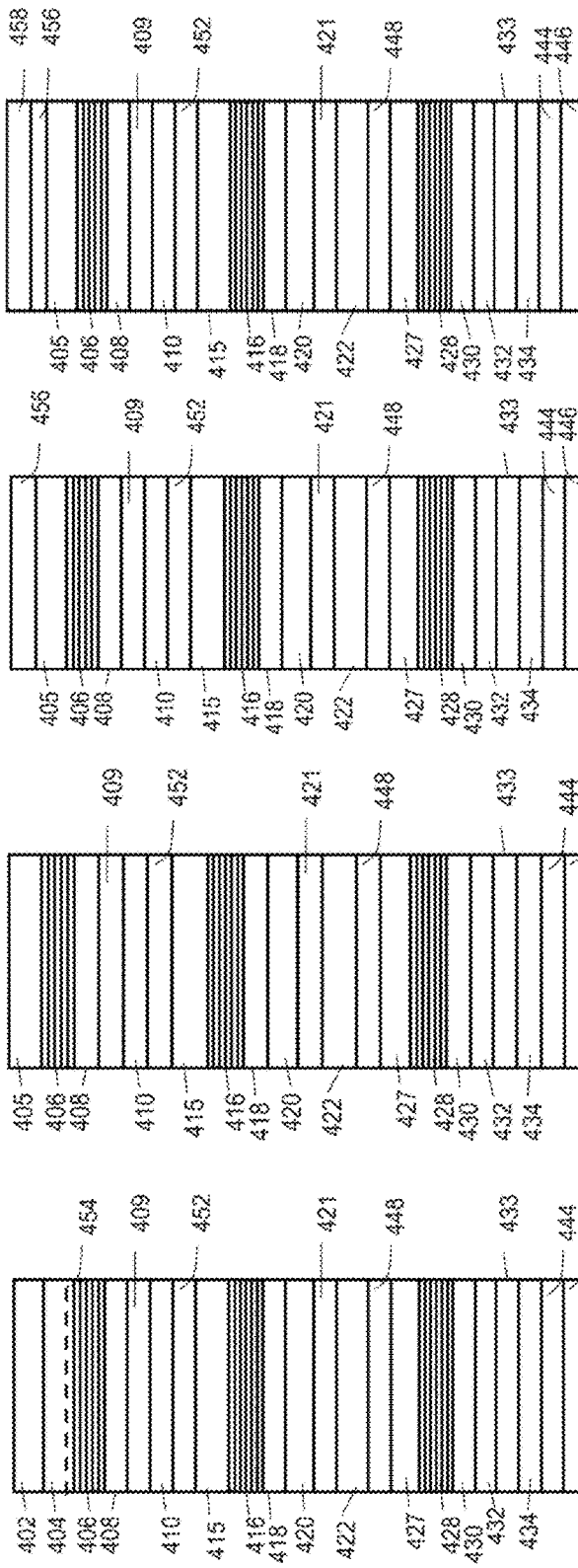

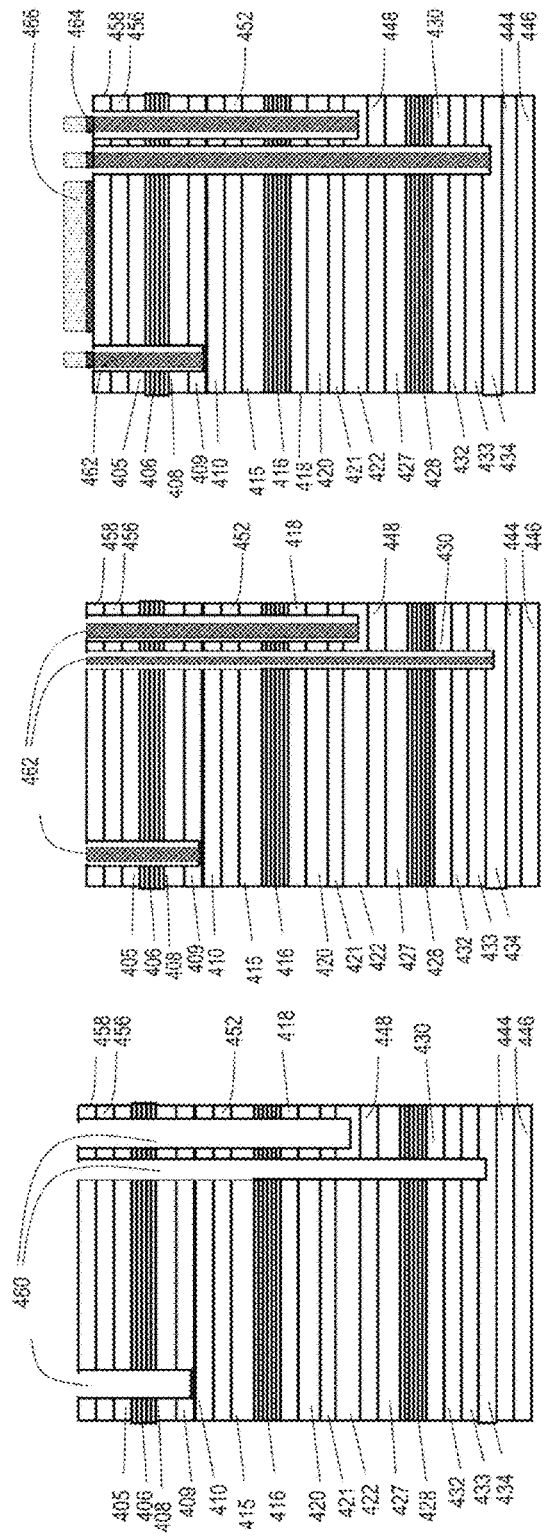
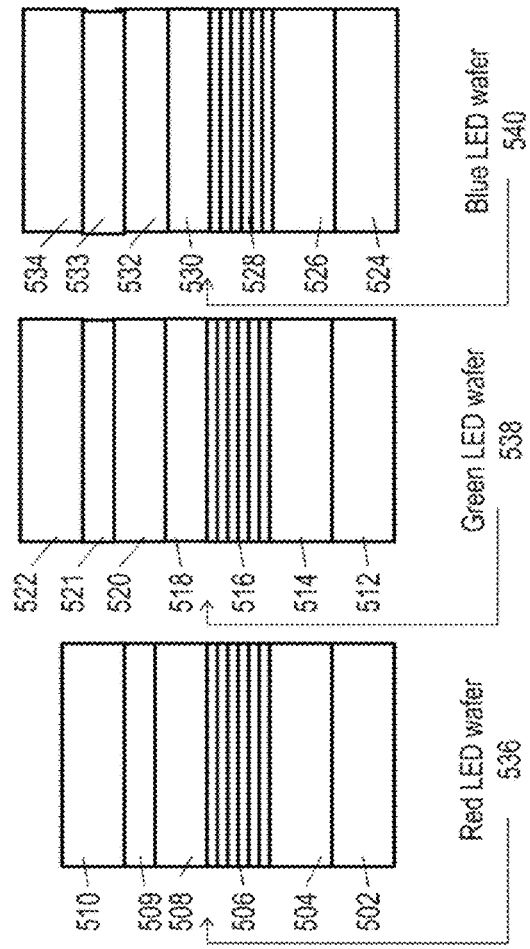
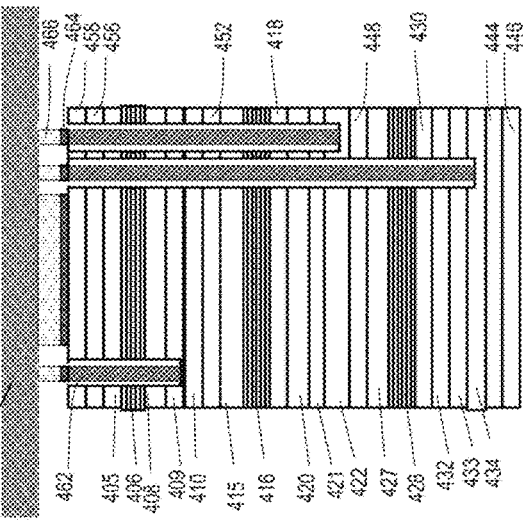

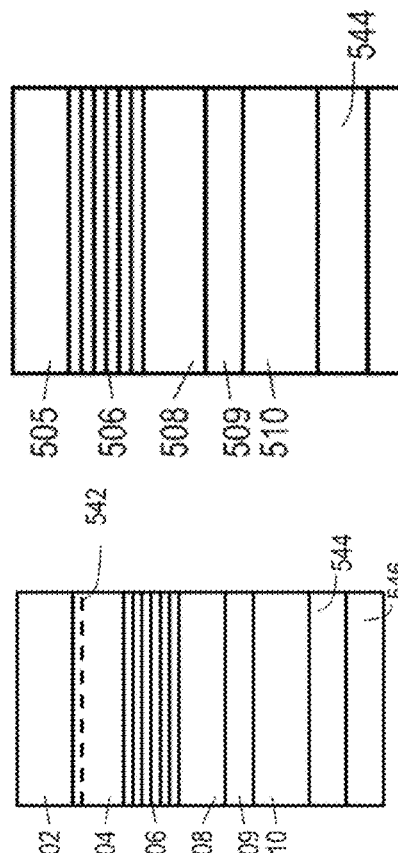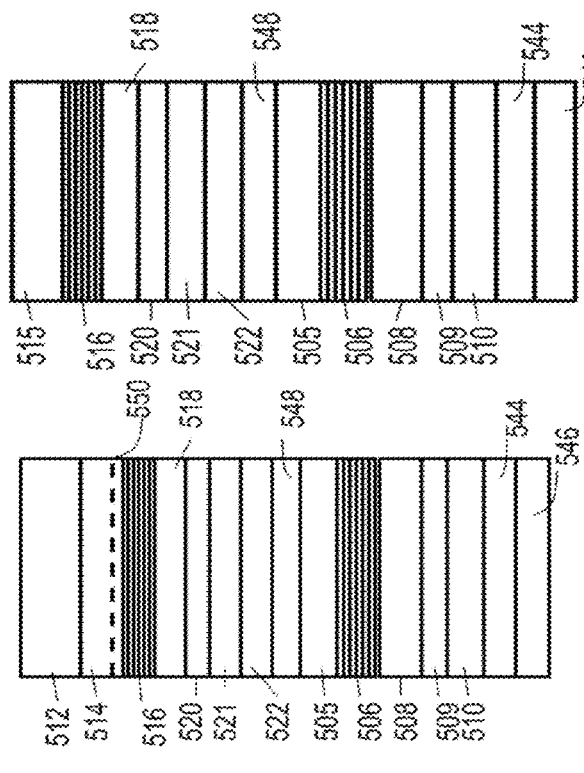

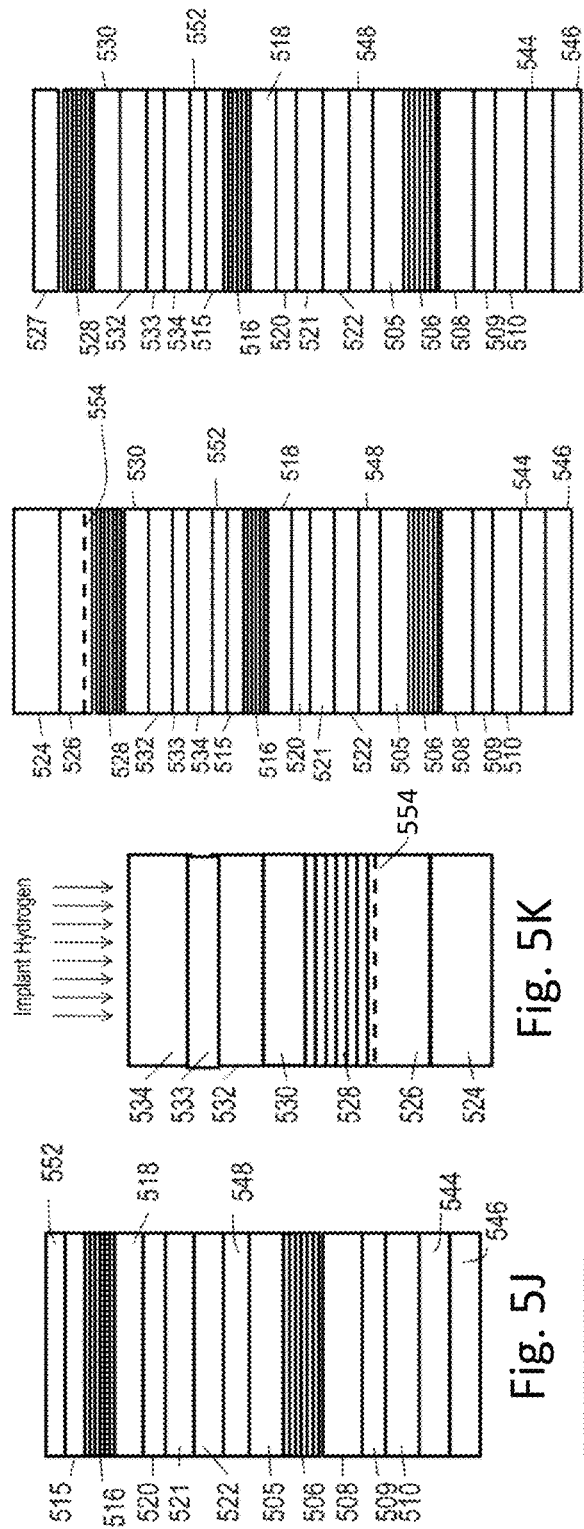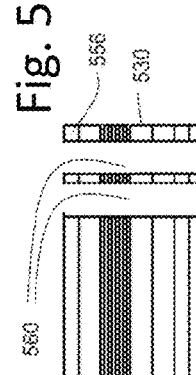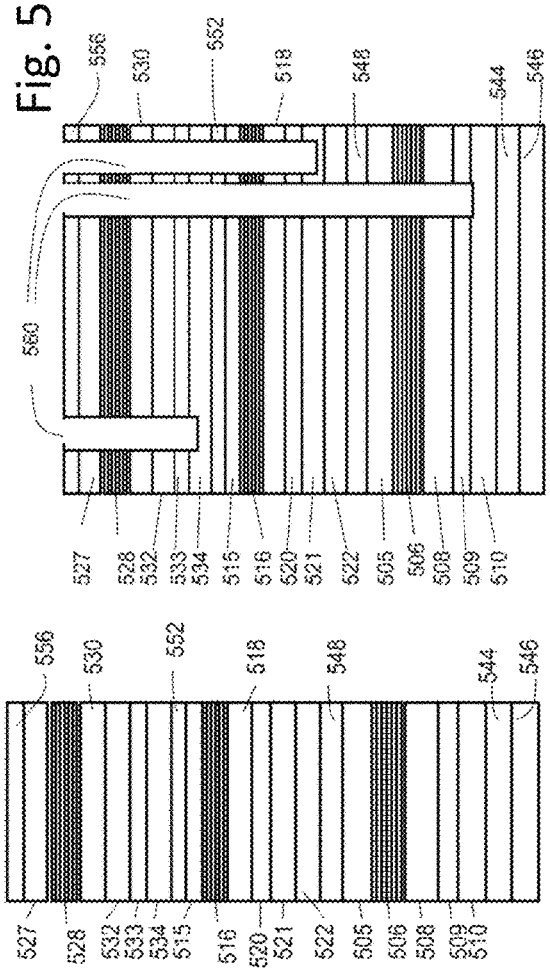

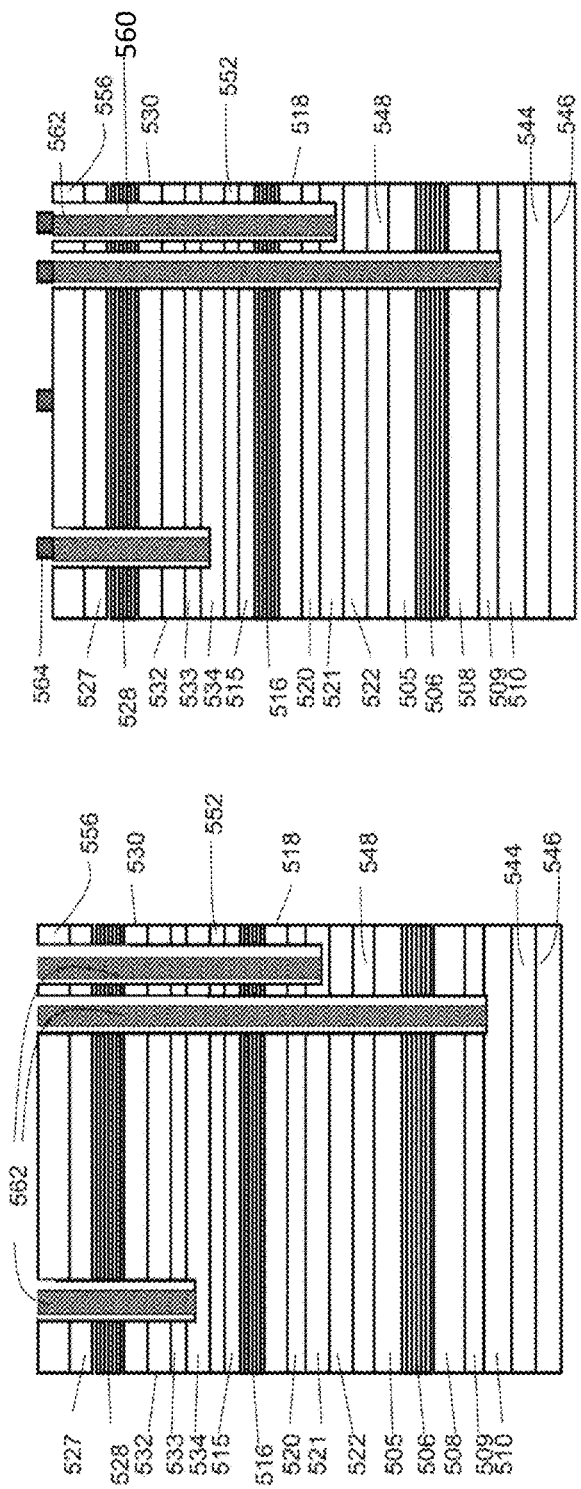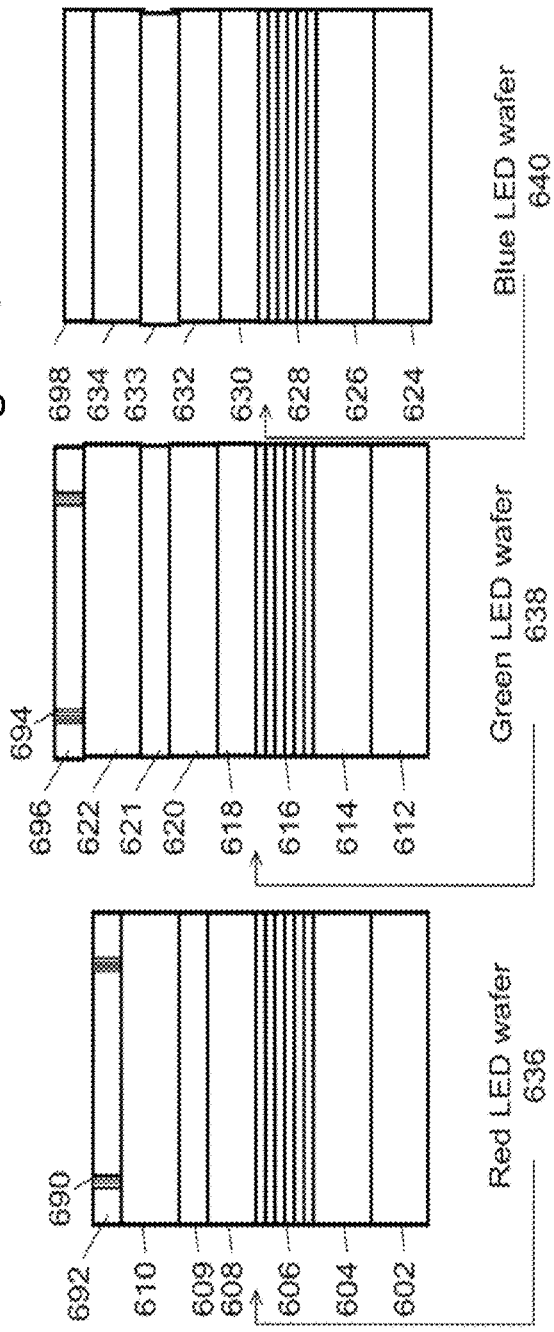

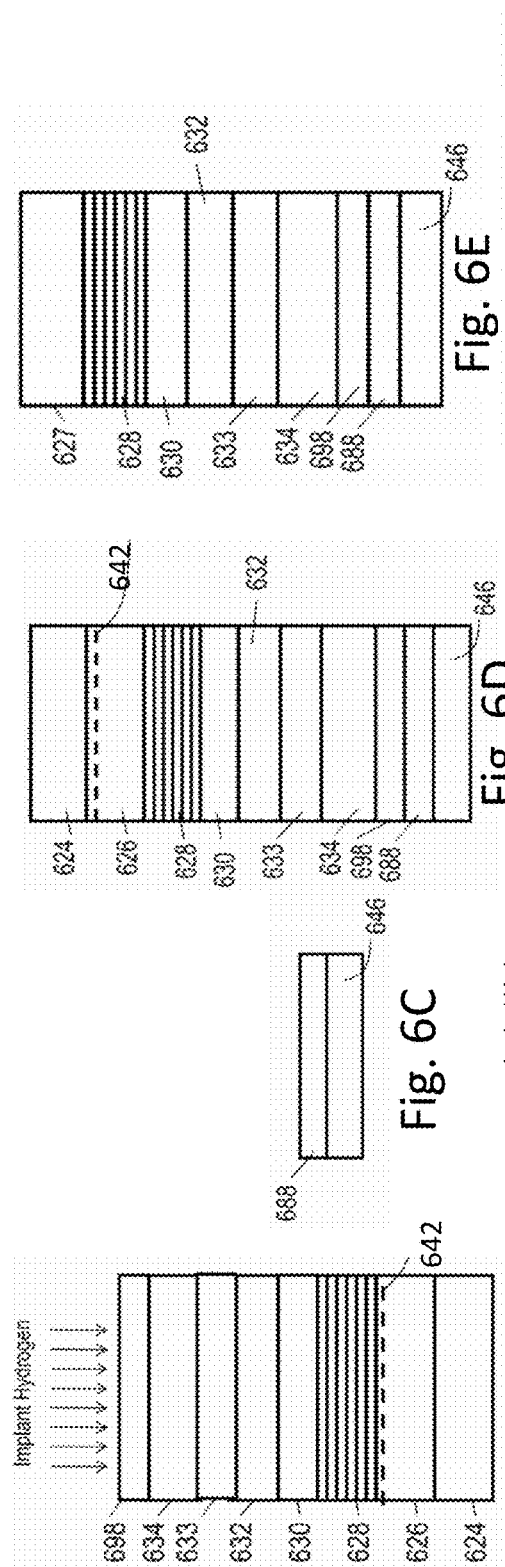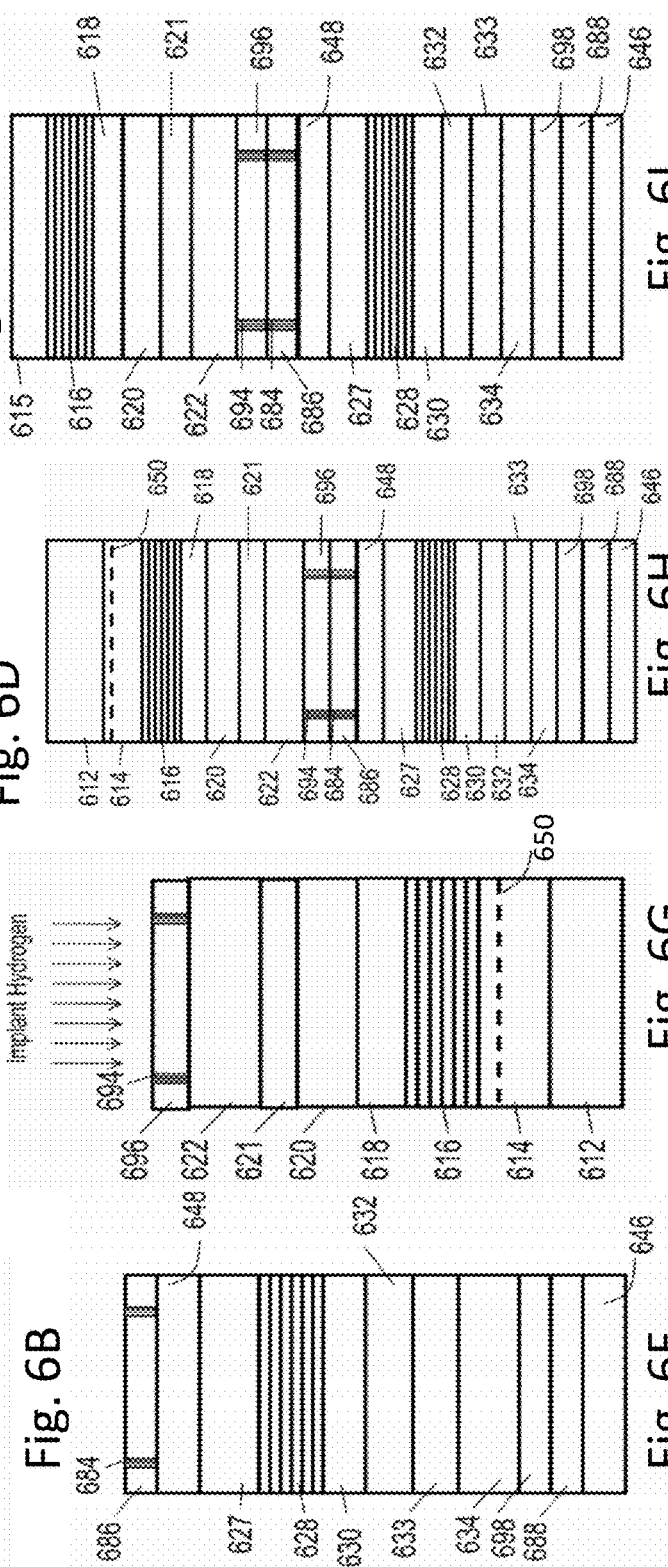

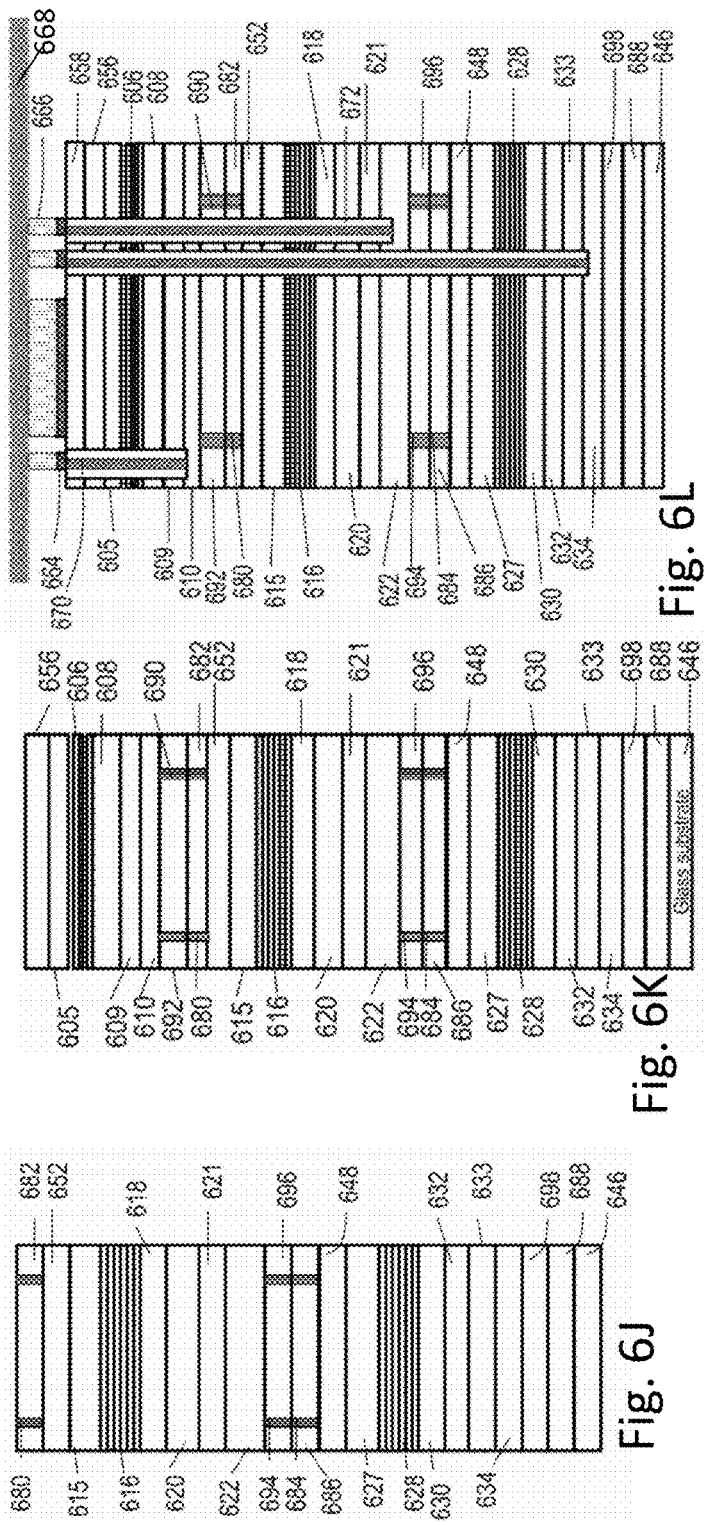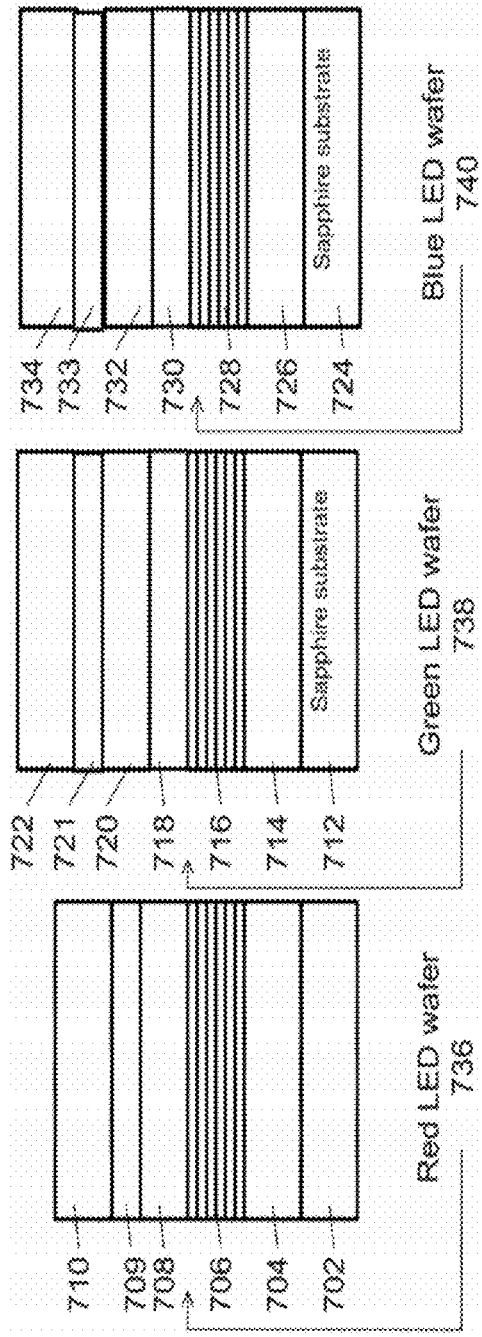

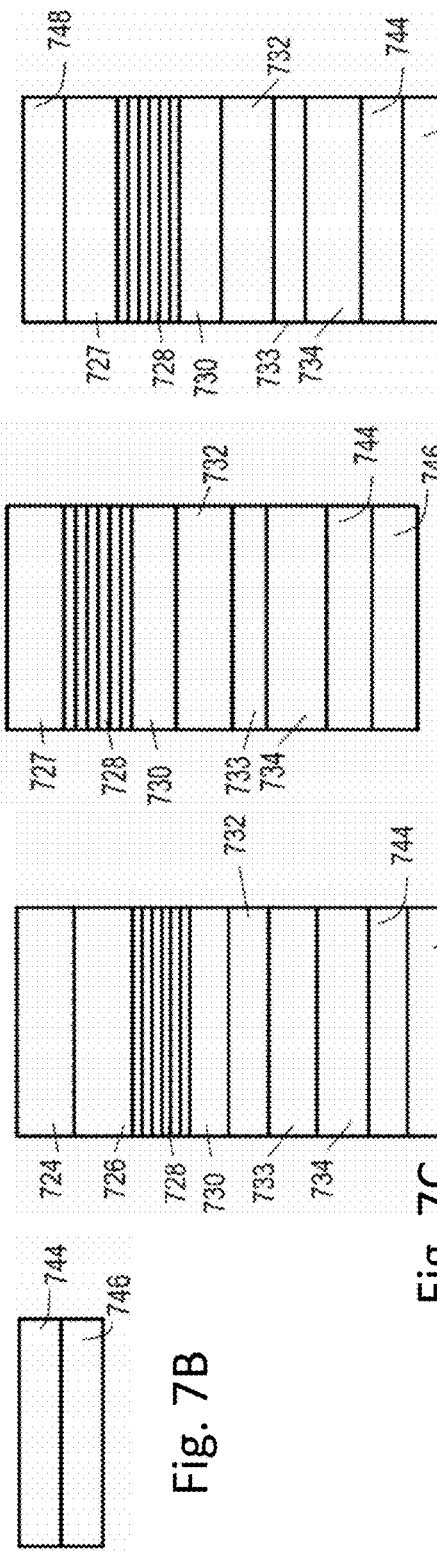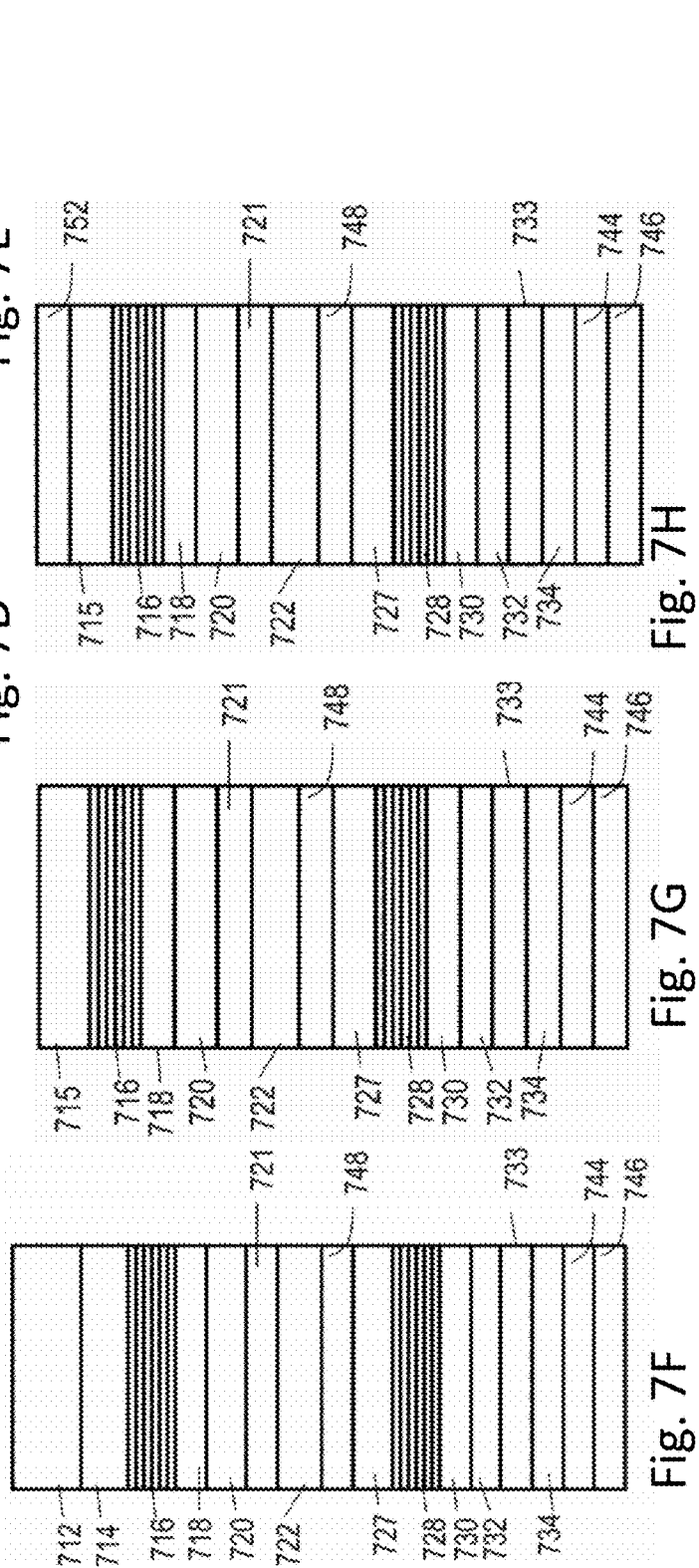

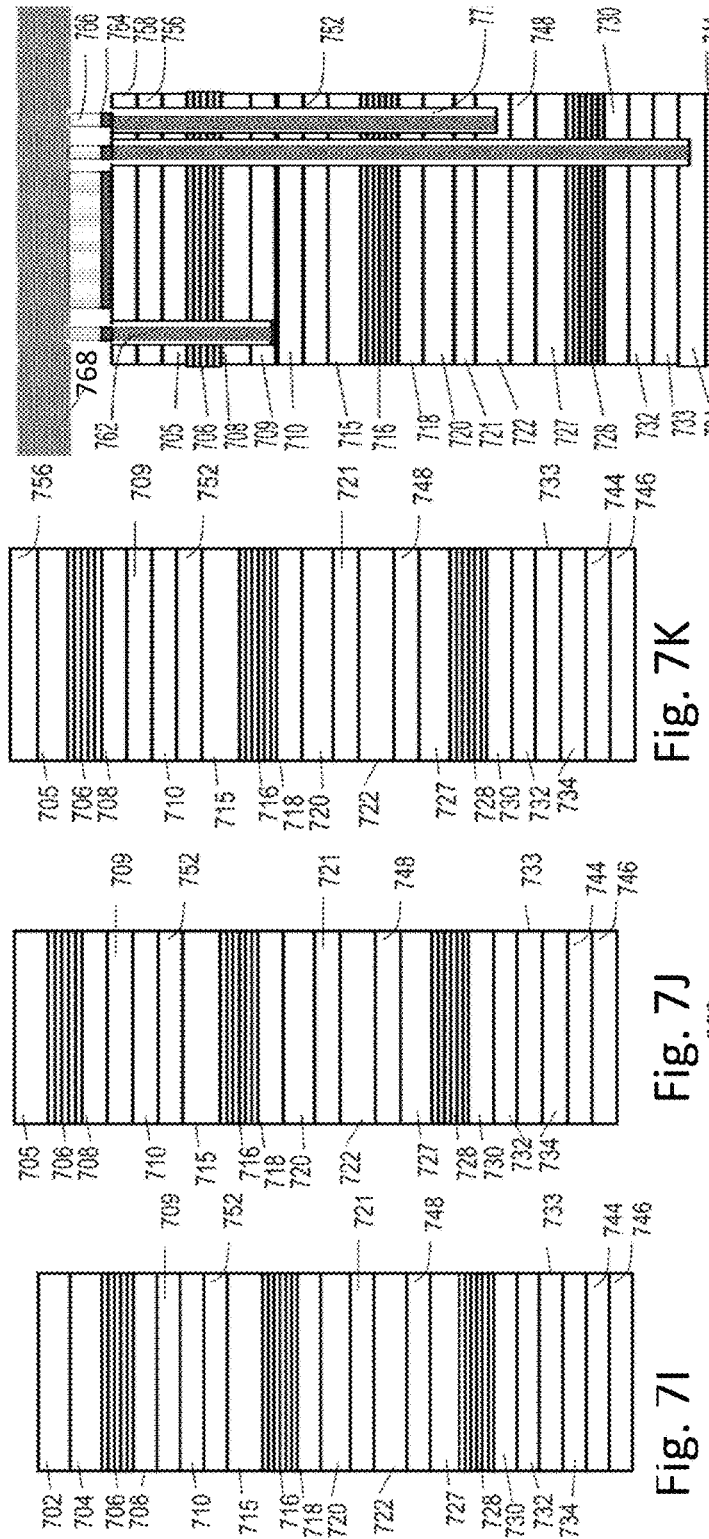

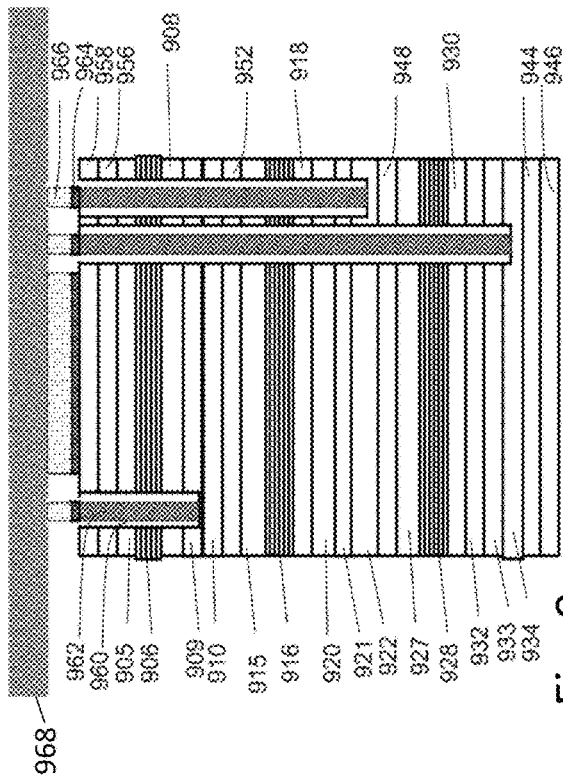
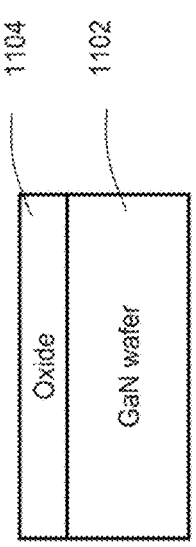
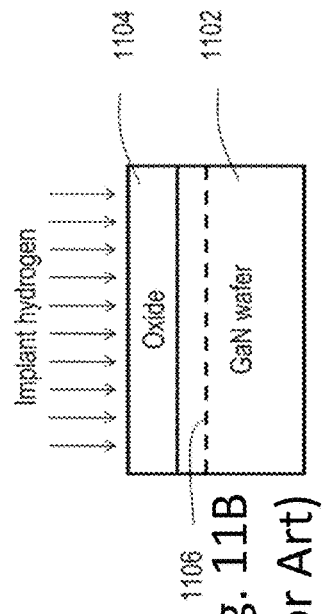
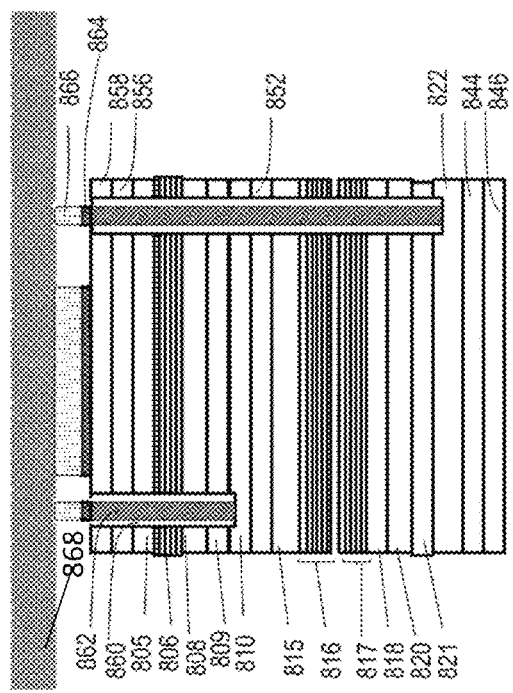
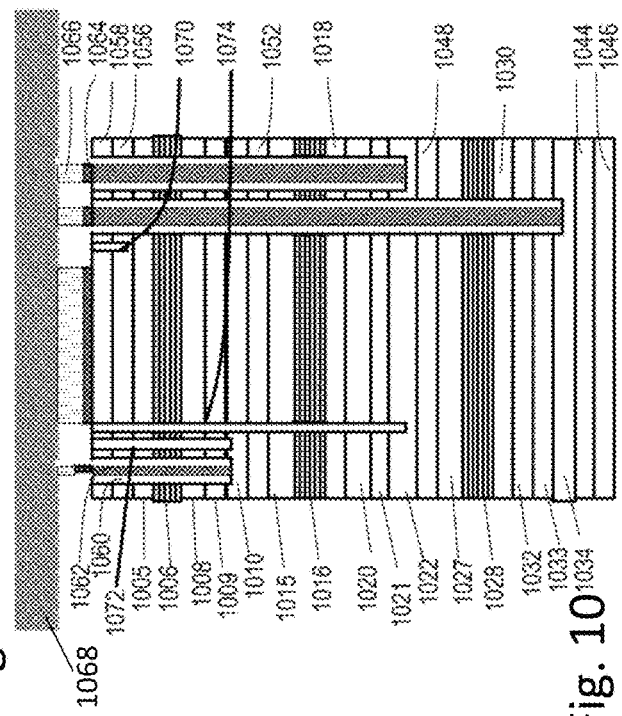
Fig. 9
Fig. 11A (Prior Art)
Fig. 11B (Prior Art)
Fig. 8B
Fig. 10

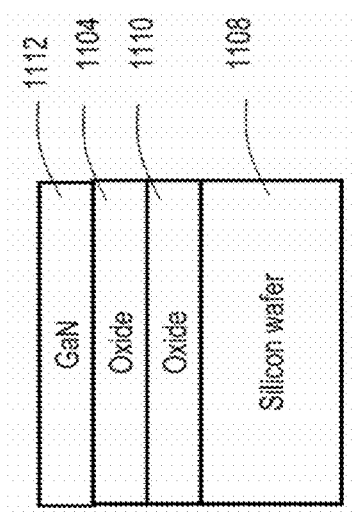
Fig. 11E (Prior Art)
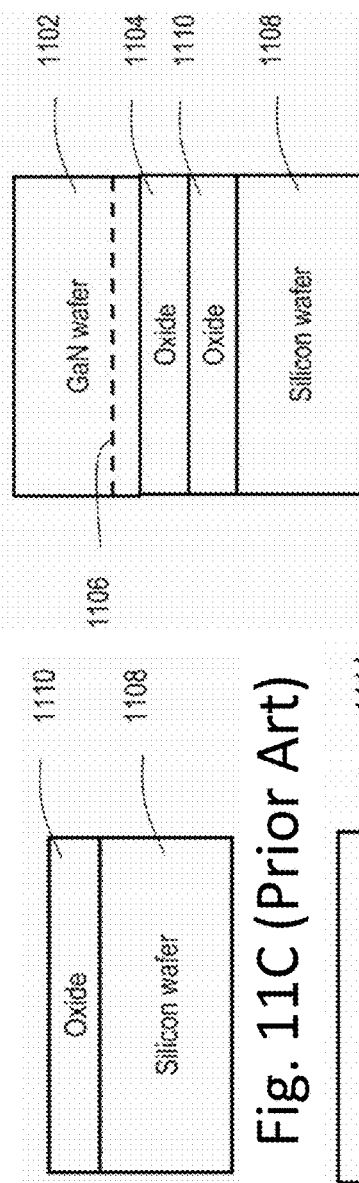
Fig. 11D (Prior Art)
Fig. 11C (Prior Art)
Fig. 11F (Prior Art)
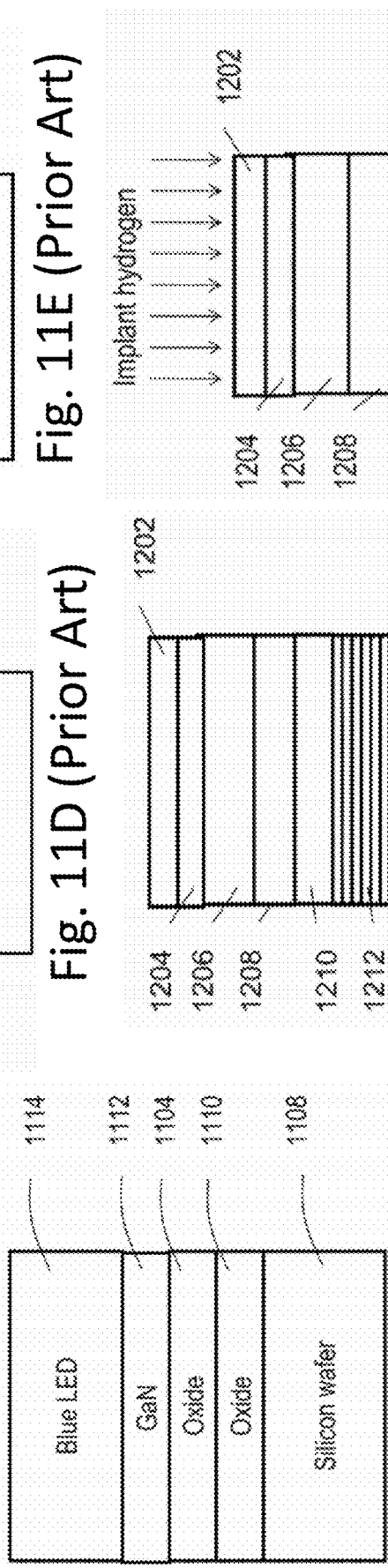
Fig. 12B
Fig. 12A
Fig. 12C

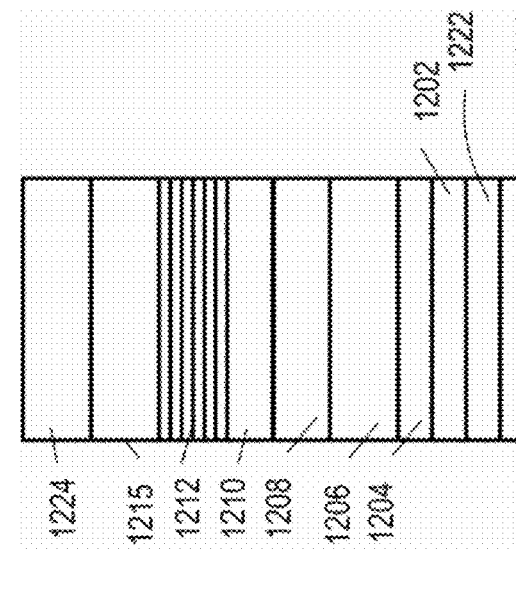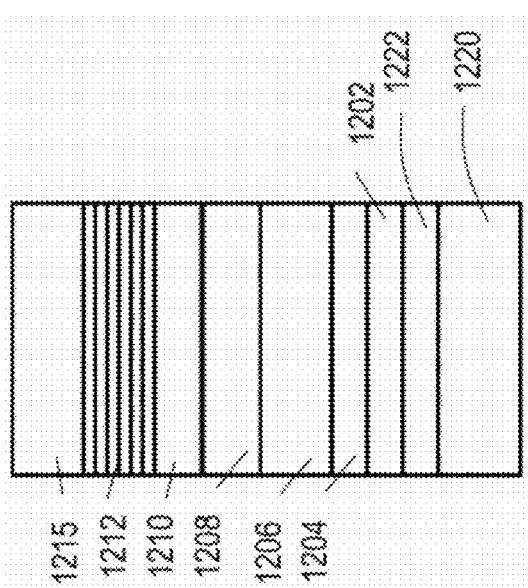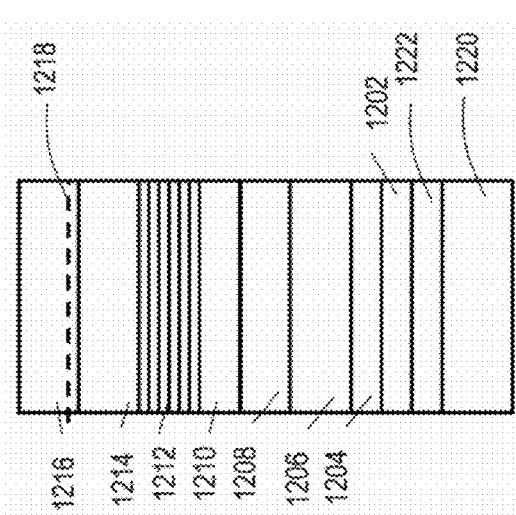

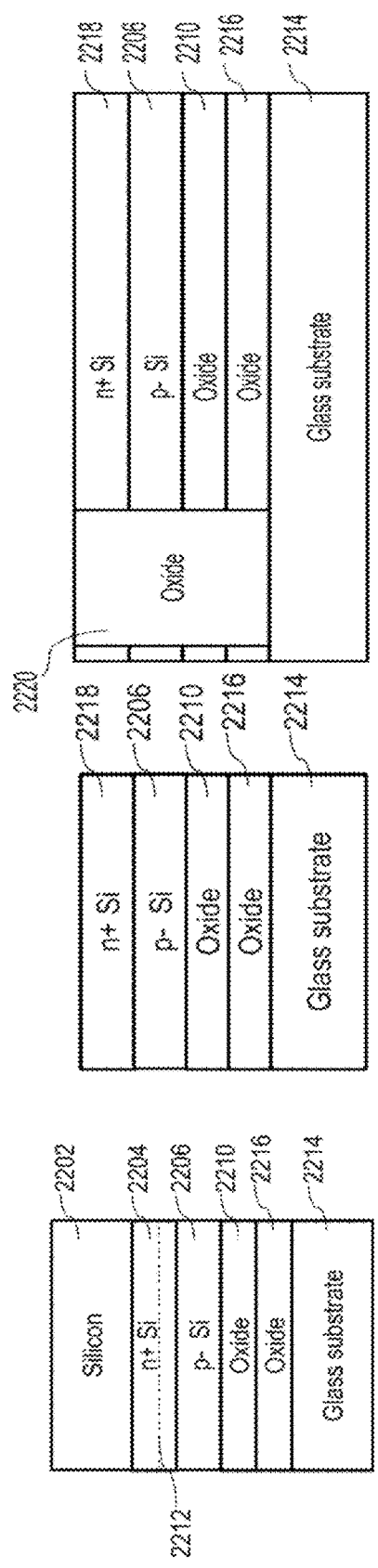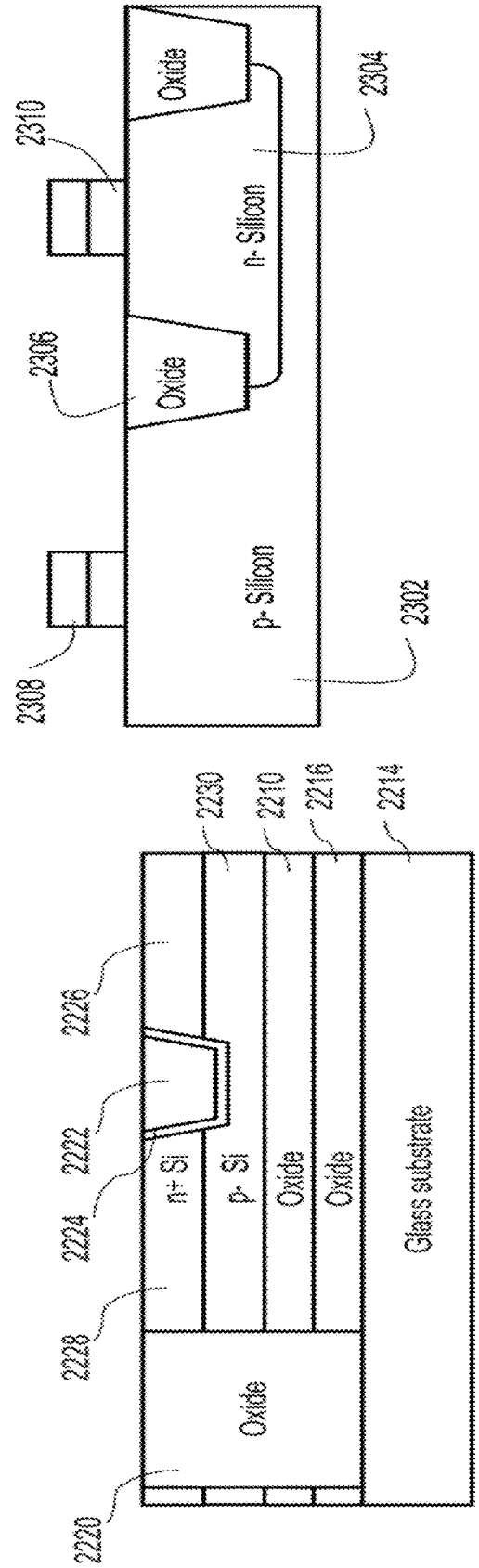

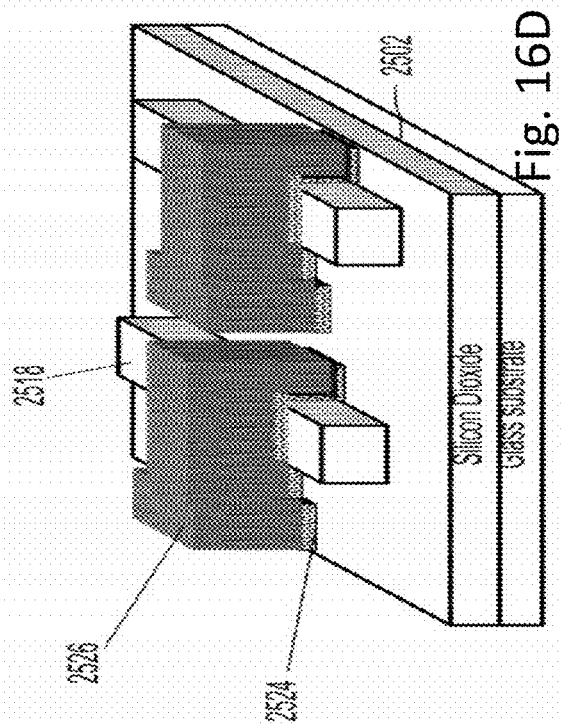
Fig. 16C
Fig. 16D
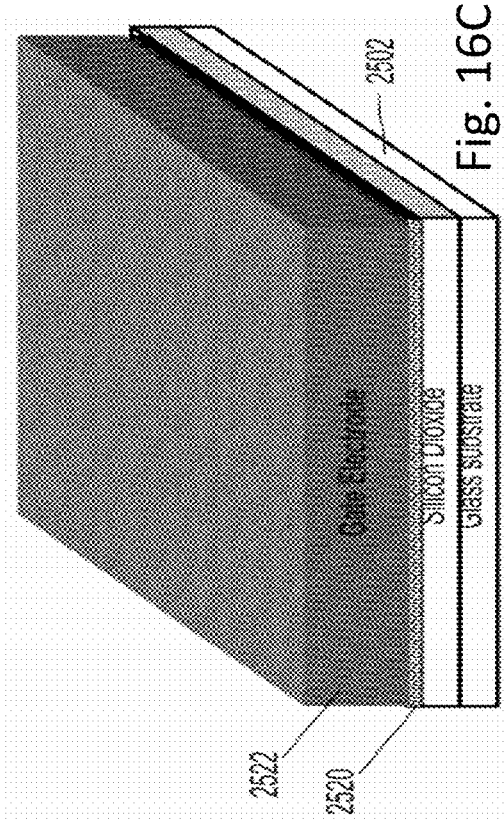
Fig. 17A
Fig. 17B

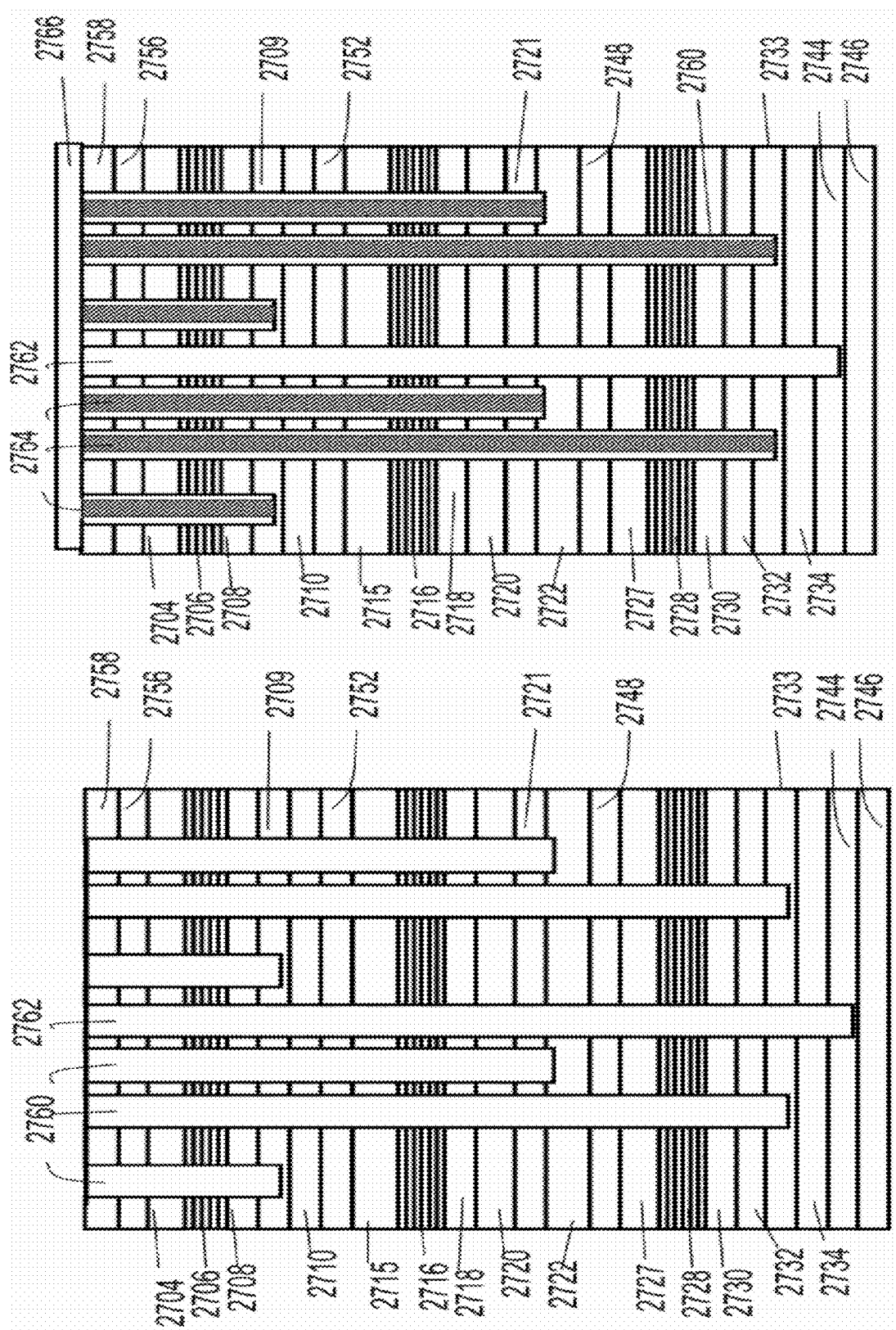

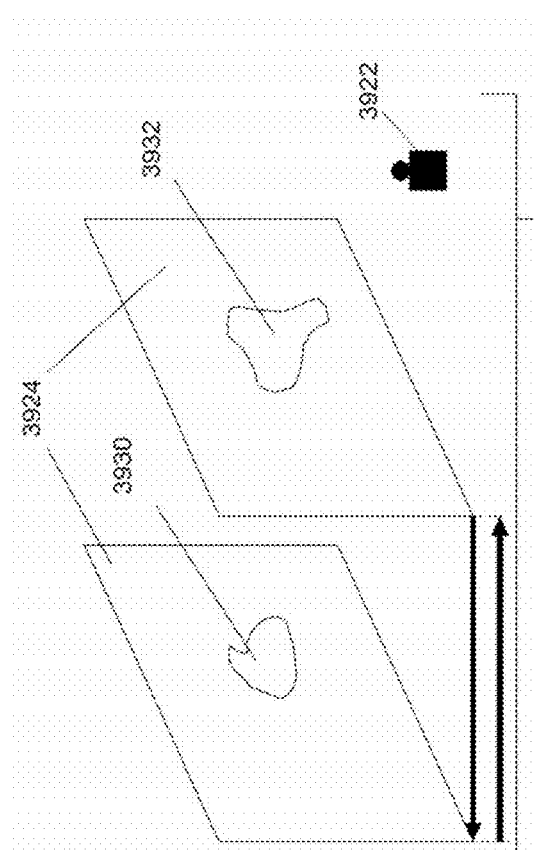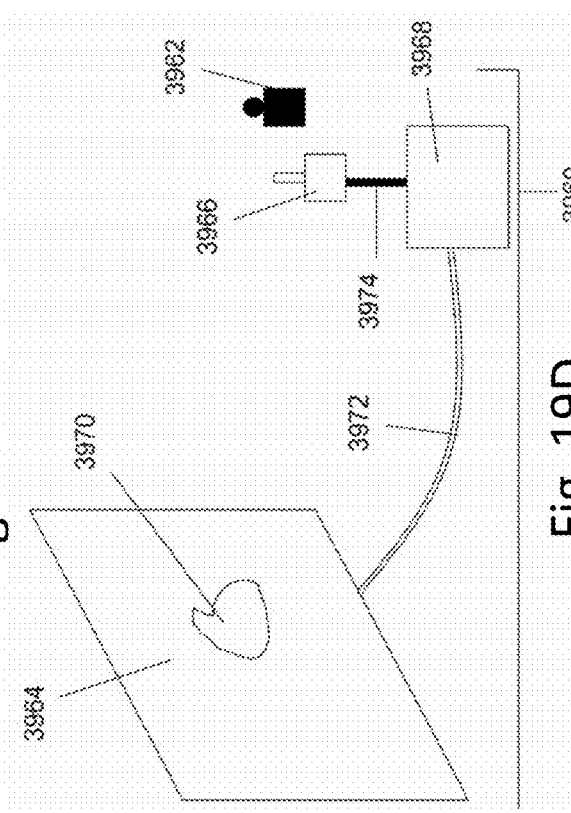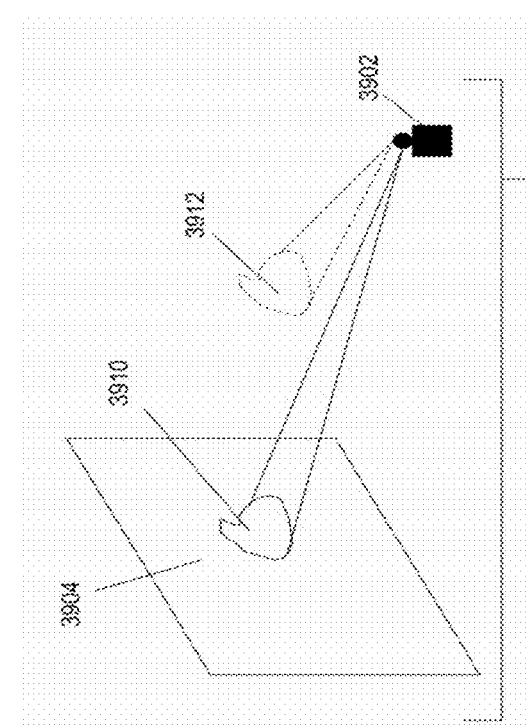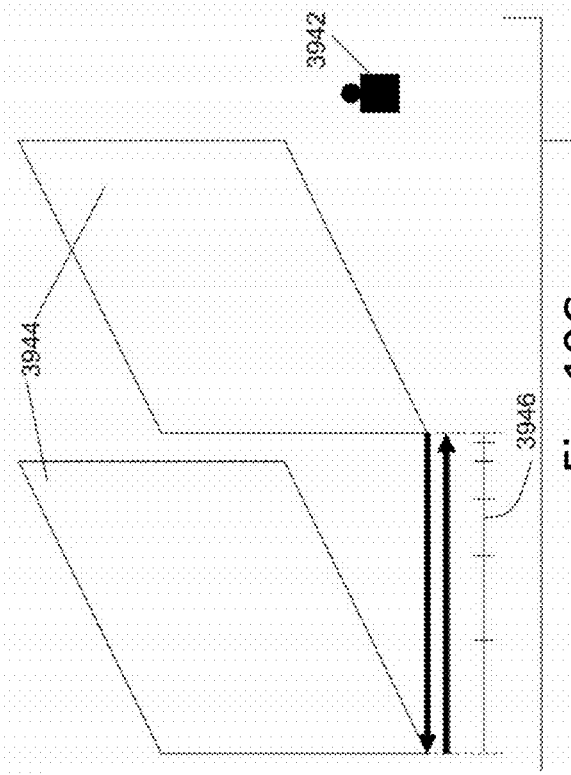
Fig. 19A
Fig. 19B
Fig. 19C
Fig. 19D

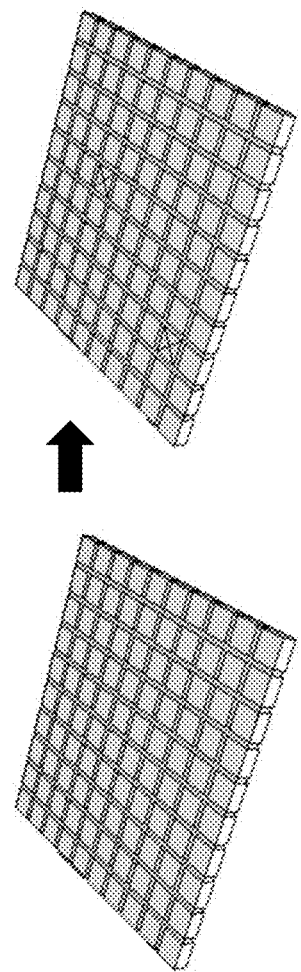
Monolithic microLED display
Fig. 20A
Inspection and bad pixel mapping
Fig. 20B
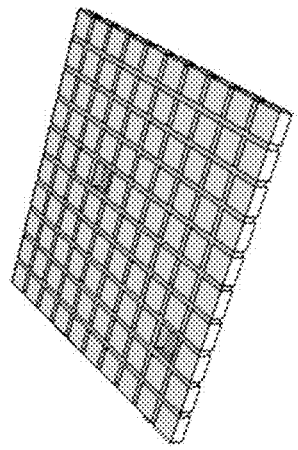
Focused ion beam etching of bad pixel
Fig. 20C
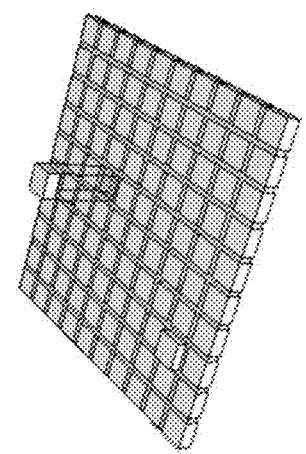
Pick and transfer singulated microLED
Fig. 20D

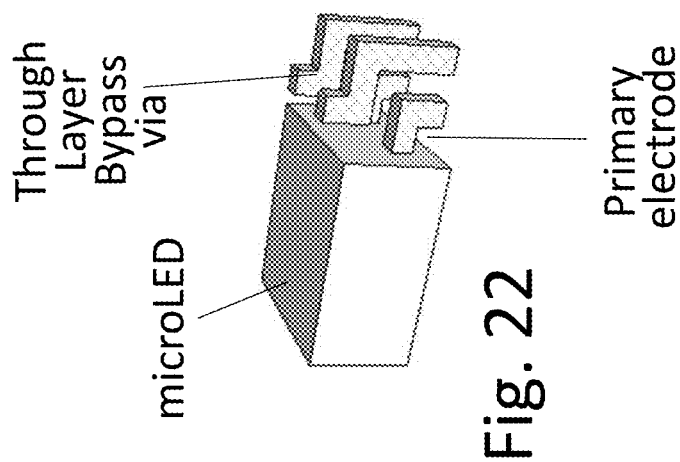
Fig. 22
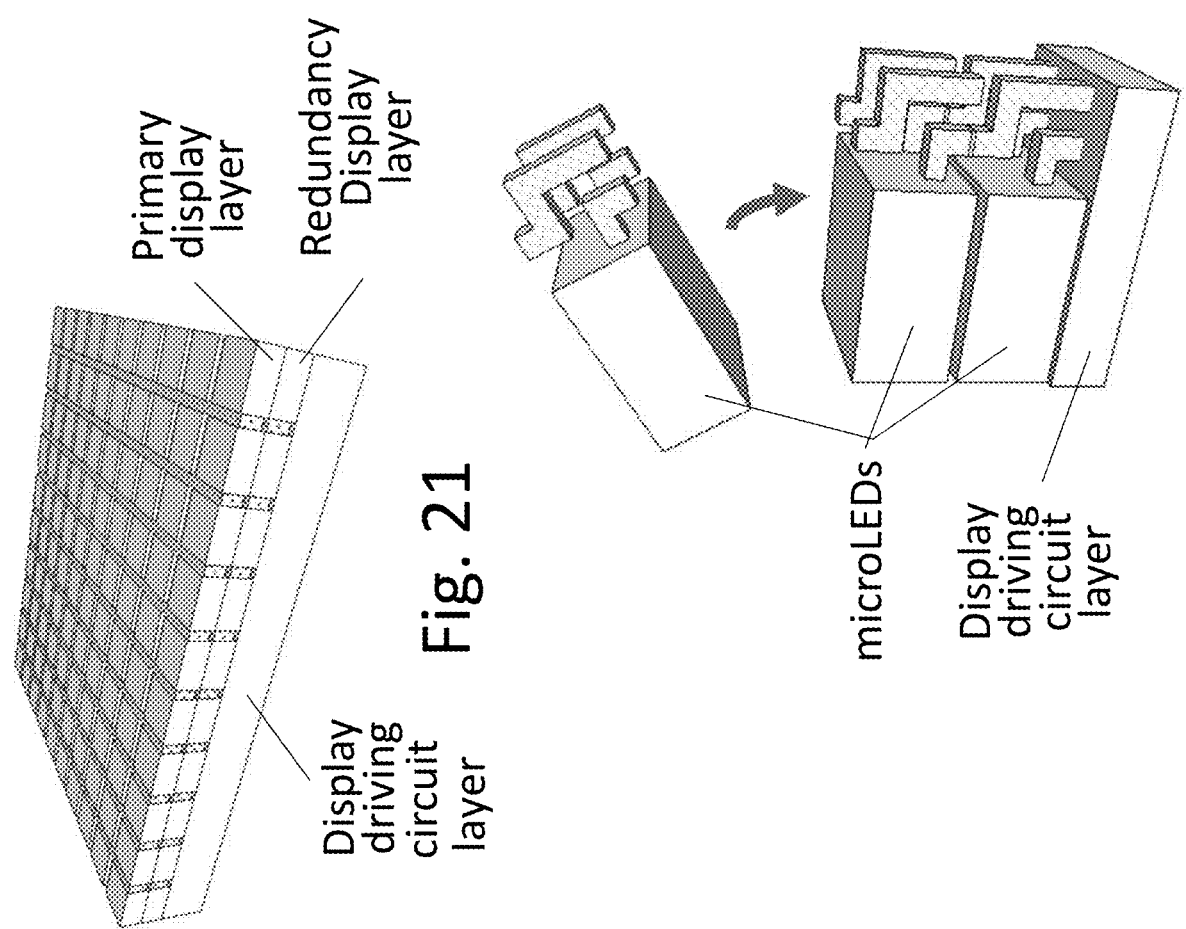
Fig. 21
Fig. 23

3D MICRO DISPLAY DEVICE AND STRUCTURE

CROSS-REFERENCE OF RELATED APPLICATION

This application claims priority of and is a continuation of U.S. patent application Ser. No. 17/669,099 filed on Mar. 19, 2022; which is a continuation of U.S. patent application Ser. No. 17/487,369 filed on Sep. 28, 202, now U.S. Pat. No. 11,315,965 issued on Apr. 26, 2022; which is a continuation of U.S. patent application Ser. No. 17/216,597 filed on Mar. 29, 2021, now U.S. Pat. No. 11,164,898 issued on Nov. 2, 2021; which is a continuation-in-part of U.S. patent application Ser. No. 17/113,045 filed on Dec. 5, 2020, now U.S. Pat. No. 10,998,374 issued on May 4, 2021; which is a continuation-in-part of U.S. patent application Ser. No. 17/027,217 filed on Sep. 21, 2020; which is a continuation-in-part of U.S. patent application Ser. No. 16/860,027 filed on Apr. 27, 2020, now U.S. Pat. No. 10,833,108 issued on Nov. 10, 2020; which is a continuation-in-part of U.S. patent application Ser. No. 15/920,499 filed on Mar. 14, 2018, now U.S. Pat. No. 10,679,977 issued on Jun. 9, 2020; which is a continuation-in-part of U.S. patent application Ser. No. 14/936,657 filed on Nov. 9, 2015, now U.S. Pat. No. 9,941,319 issued on Apr. 10, 2018; which is a continuation-in-part of U.S. patent application Ser. No. 13/274,161 filed on Oct. 14, 2011, now U.S. Pat. No. 9,197,804 issued on Nov. 24, 2015; and this application is a continuation-in-part of U.S. patent application Ser. No. 12/904,103 filed on Oct. 13, 2010, now U.S. Pat. No. 8,163,581 issued on Apr. 24, 2012.

BACKGROUND OF THE INVENTION

(A) Field of the Invention

This invention describes applications of monolithic 3D integration to various disciplines, including but not limited to, for example, light-emitting diodes and displays.

(B) Discussion of Background Art

Semiconductor and optoelectronic devices often require thin monocrystalline (or single-crystal) films deposited on a certain wafer. To enable this deposition, many techniques, generally referred to as layer transfer technologies, have been developed. These include:

Ion-cut, variations of which are referred to as smart-cut, nano-cleave and smart-cleave: Further information on ion-cut technology is given in "Frontiers of silicon-on-insulator," J. Appl. Phys. 93, 4955-4978 (2003) by G. K. Celler and S. Cristolovean ("Celler") and also in "Mechanically induced Si layer transfer in hydrogen-implanted Si wafers," Appl. Phys. Lett., vol. 76, pp. 2370-2372, 2000 by K. Henttinen, I. Suni, and S. S. Lau ("Hentinnen").

Porous silicon approaches such as ELTRAN: These are described in "Eltran, Novel SOI Wafer Technology", JSAP International, Number 4, July 2001 by T. Yonehara and K. Sakaguchi ("Yonehara").

Lift-off with a temporary substrate, also referred to as epitaxial lift-off. This is described in "Epitaxial lift-off and its applications", 1993 Semicond. Sci. Technol. 8 1124 by P. Demeester, et al ("Demeester").

Bonding a substrate with single crystal layers followed by Polishing, Time-controlled etch-back or Etch-stop layer controlled etch-back to thin the bonded substrate: These are described in U.S. Pat. No. 6,806,171 by A. Ulyashin and A. Usenko ("Ulyashin") and "Enabling SOI-Based Assembly Technology for Three-Dimensional (3D) Integrated Circuits (ICs)," IEDM Tech. Digest, p. 363 (2005) by A. W. Topol, D. C. La Tulipe, L. Shi, S. M. Alam, D. J. Frank, S. E. Steen, J. Vichiconti, D. Posillico, M. Cobb, S. Medd, J. Patel, S. Goma, D. DiMilia, M. T. Robson, E. Duch, M. Farinelli, C. Wang, R. A. Conti, D. M. Canaperi, L. Deligianni, A. Kumar, K. T. Kwietniak, C. D'Emic, J. Ott, A. M. Young, K. W. Guarini, and M. Ieong ("Topol").

Bonding a wafer with a Gallium Nitride film epitaxially grown on a sapphire substrate followed by laser lift-off for removing the transparent sapphire substrate: This method may be suitable for deposition of Gallium Nitride thin films, and is described in U.S. Pat. No. 6,071,795 by Nathan W. Cheung, Timothy D. Sands and William S. Wong ("Cheung").

Rubber stamp layer transfer: This is described in "Solar cells sliced and diced", 19 May 2010, Nature News.

With novel applications of these methods and recognition of their individual strengths and weaknesses, one can significantly enhance today's light-emitting diode (LED), display, image-sensor and solar cell technologies.

Background on LEDs

Light emitting diodes (LEDs) are used in many applications, including automotive lighting, incandescent bulb replacements, and as backlights for displays. Red LEDs are typically made on Gallium Arsenide (GaAs) substrates, and include quantum wells constructed of various materials such as AlInGaP and GaInP. Blue and green LEDs are typically made on Sapphire or Silicon Carbide (SiC) or bulk Gallium Nitride (GaN) substrates, and include quantum wells constructed of various materials such as GaN and InGaN.

A white LED for lighting and display applications can be constructed by either using a blue LED coated with phosphor (called phosphor-coated LED or pcLED) or by combining light from red, blue, and green LEDs (called RGB LED). RGB LEDs are typically constructed by placing red, blue, and green LEDs side-by-side. While RGB LEDs are more energy-efficient than pcLEDs, they are less efficient in mixing red, blue and green colors to form white light. They also are much more costly than pcLEDs. To tackle issues with RGB LEDs, several proposals have been made.

One RGB LED proposal from Hong Kong University is described in "Design of vertically stacked polychromatic light emitting diodes", Optics Express, June 2009 by K. Hui, X. Wang, et al ("Hui"). It involves stacking red, blue, and green LEDs on top of each other after individually packaging each of these LEDs. While this solves light mixing problems, this RGB-LED is still much more costly than a pcLED solution since three LEDs for red, blue, and green color need to be packaged. A pcLED, on the other hand, requires just one LED to be packaged and coated with phosphor.

Another RGB LED proposal from Nichia Corporation is described in "Phosphor Free High-Luminous-Efficiency White Light-Emitting Diodes Composed of InGaN Multi-Quantum Well", Japanese Journal of Applied Physics, 2002 by M. Yamada, Y. Narukawa, et al. ("Yamada"). It involves constructing and stacking red, blue and green LEDs of GaN-based materials on a sapphire or SiC substrate. However, red LEDs are not efficient when constructed with GaN-based material systems, and that hampers usefulness of this implementation. It is not possible to deposit defect-free AlInGaP/InGaP for red LEDs on the same substrate as GaN based blue and green LEDs, due to a mismatch in thermal expansion co-efficient between the various material systems.

Yet another RGB-LED proposal is described in "Cascade Single chip phosphor-free while light emitting diodes", Applied Physics Letters, 2008 by X. Guo, G. Shen, et al. ("Guo"). It involves bonding GaAs based red LEDs with GaN based blue-green LEDs to produce white light. Unfortunately, this bonding process requires 600° C. temperatures, causing issues with mismatch of thermal expansion co-efficients and cracking. Another publication on this topic is "A trichromatic phosphor-free white light-emitting diode by using adhesive bonding scheme", Proc. SPIE, Vol. 7635, 2009 by D. Chuai, X. Guo, et al. ("Chuai"). It involves bonding red LEDs with green-blue LED stacks. Bonding is done at the die level after dicing, which is more costly than a wafer-based approach.

U.S. patent application Ser. No. 12/130,824 describes various stacked RGB LED devices. It also briefly mentions a method for construction of a stacked LED where all layers of the stacked LED are transferred using lift-off with a temporary carrier and Indium Tin Oxide (ITO) to semiconductor bonding. This method has several issues for constructing a RGB LED stack. First, it is difficult to manufacture a lift-off with a temporary carrier of red LEDs for producing a RGB LED stack, especially for substrates larger than 2 inch. This is because red LEDs are typically constructed on non-transparent GaAs substrates, and lift-off with a temporary carrier is done by using an epitaxial lift-off process. Here, the thin film to be transferred typically sits atop a "release-layer" (eg. AlAs), this release layer is removed by etch procedures after the thin film is attached to a temporary substrate. Scaling this process to 4 inch wafers and bigger is difficult. Second, it is very difficult to perform the bonding of ITO to semiconductor materials of a LED layer at reasonable temperatures, as described in the patent application Ser. No. 12/130,824.

It is therefore clear that a better method for constructing RGB LEDs will be helpful. Since RGB LEDs are significantly more efficient than pcLEDs, they can be used as replacements of today's phosphor-based LEDs for many applications, provided a cheap and effective method of constructing RGB LEDs can be invented.

Background on Displays

Liquid Crystal Displays (LCDs) can be classified into two types based on manufacturing technology utilized: (1) Large-size displays that are made of amorphous/polycrystalline silicon thin-film-transistors (TFTs), and (2) Microdisplays that utilize single-crystal silicon transistors. Microdisplays are typically used where very high resolution is needed, such as camera/camcorder view-finders, projectors and wearable computers.

Microdisplays are made in semiconductor fabs with 200 mm or 300 mm wafers. They are typically constructed with LCOS (Liquid-Crystal-on-Silicon) Technology and are reflective in nature. An exception to this trend of reflective microdisplays is technology from Kopin Corporation (U.S. Pat. No. 5,317,236, filed December 1991). This company utilizes transmittive displays with a lift-off layer transfer scheme. Transmittive displays may be generally preferred for various applications.

While lift-off layer transfer schemes are viable for transmittive displays, they are frequently not used for semiconductor manufacturing due to yield issues. Therefore, other layer transfer schemes will be helpful. However, it is not easy to utilize other layer transfer schemes for making transistors in microdisplays. For example, application of "smart-cut" layer transfer to attach monocrystalline silicon transistors to glass is described in "Integration of Single Crystal Si TFTs and Circuits on a Large Glass Substrate", IEDM 2009 by Y. Takafuji, Y. Fukushima, K. Tomiyasu, et al. ("Takafuji"). Unfortunately, hydrogen is implanted through the gate oxide of transferred transistors in the process, and this degrades performance. Process temperatures are as high as 600° C. in this paper, and this requires costly glass substrates. Several challenges therefore need to be overcome for efficient layer transfer, and require innovation.

Over the past 40 years, there has been a dramatic increase in functionality and performance of Integrated Circuits (ICs). This has largely been due to the phenomenon of "scaling"; i.e., component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

SUMMARY

Techniques to utilize layer transfer schemes such as ion-cut to form novel light emitting diodes (LEDs), displays, and microdisplays are discussed.

In one aspect, a 3D micro display, the 3D micro display comprising: a first level comprising a first single crystal layer, said first single crystal layer comprises a plurality of LED driving circuits; a second level comprising a first plurality of light emitting diodes (LEDs), said first plurality of LEDs comprising a second single crystal layer, wherein said first level is disposed on top of said second level, wherein said second level comprises at least ten individual first LED pixels; and bonding structure, wherein said bonding structure comprises oxide to oxide bonding.

In another aspect, a 3D micro display, the 3D micro display comprising: a first level comprising a first single crystal layer, said first single crystal layer comprises a plurality of LED driving circuits; a second level comprising a first plurality of light emitting diodes (LEDs), said first plurality of LEDs comprising a second single crystal layer, wherein said first level is disposed on top of said second level, wherein said second level comprises at least ten individual first LED pixels; and a bonding structure, wherein said first level is bonded to said second level, and wherein said bonded comprises oxide to oxide bonding.

In another aspect, a 3D micro display, the 3D micro display including: a first single crystal layer including at least one LED driving circuit; a second single crystal layer including a first plurality of light emitting diodes (LEDs), where the second single crystal layer is on top of the first single crystal layer, where the second single crystal layer includes at least ten individual first LED pixels; and a second plurality of light emitting diodes (LEDs), where the 3D micro display includes an oxide to oxide bonding structure.

In another aspect, a 3D micro display, the 3D micro display comprising: a first level comprising a first single crystal layer, said first single crystal layer comprises a plurality of LED driving circuits; a second level comprising a first plurality of light emitting diodes (LEDs), said first plurality of LEDs comprising a second single crystal layer, wherein said first level is disposed on top of said second level, wherein said second level comprises at least ten individual first LED pixels; and a bonding structure, wherein said first level is bonded to said second level, and wherein said bonded comprises oxide to oxide bonding.

In another aspect, a light-emitting integrated wafer structure includes three overlying layers, where each of the three overlying layers emits light at a different wavelength and where at least one of the three overlying layers is transferred to the light-emitting integrated wafer structure using one of atomic species implants assisted cleaving, laser lift-off, etch-back, or chemical-mechanical-polishing (CMP).

In another aspect, an integrated image sensor includes two overlying layers, where one of the two overlying layers is an image sensor layer and at least one of the two overlying layers is less than 5 microns thick, and where the two overlying layers are constructed at a temperature not exceeding 450° C.

In another aspect, a display device with junction-less transistors is disclosed.

In yet another aspect, a method for fabricating a light-emitting integrated device, includes overlying three layers, where each of the three layers emits light at a different wavelength, and where the overlying includes one of: performing an atomic species implantation, performing a laser lift-off, performing an etch-back, or chemical-mechanical polishing (CMP).

In another aspect, a method for fabricating an integrated image sensor, includes overlying a first layer on a second layer to form a combined layer, where one of the first and second layers is an image sensor layer and at least one of the first and second layers is less than 5 microns thick, and where the overlying is performed at a temperature not exceeding 450° C.

In yet another aspect, a method is disclosed for forming a display whose pixels are controlled by junction-less transistors.

In another aspect, a method for enabling 3D viewing of objects in an image through actual physical distances of individual objects to the viewer displayed separately on a display screen actuated by a fast motor.

In another aspect, a 3D micro display, the 3D micro display including: a first single crystal layer including a first plurality of light emitting diodes (LEDs), a second single crystal layer including a second plurality of light emitting diodes (LEDs), where the first single crystal layer includes at least ten individual first LED pixels, where the second single crystal layer includes at least ten individual second LED pixels, where the first plurality of light emitting diodes (LEDs) emits a first light with a first wavelength, where the second plurality of light emitting diodes (LEDs) emits a second light with a second wavelength, where the first wavelength and the second wavelength differ by greater than 10 nm, and where the 3D micro display includes an oxide to oxide bonding structure.

In another aspect, a 3D micro display, the 3D micro display including: a first single crystal layer including at least one LED driving circuit; a second single crystal layer including a first plurality of light emitting diodes (LEDs), where the second single crystal layer is on top of the first single crystal layer, where the second single crystal layer includes at least ten individual first LED pixels; and a second plurality of light emitting diodes (LEDs), where the 3D micro display includes a bonding structure.

In another aspect, a 3D micro display, the 3D micro display including: a first single crystal layer including at least one LED driving circuit; a second single crystal layer including a first plurality of light emitting diodes (LEDs), where the second single crystal layer includes at least ten individual first LED pixels; and a second plurality of light emitting diodes (LEDs), where the first plurality of light emitting diodes (LEDs) emits a first light with a first wavelength, where the second plurality of light emitting diodes (LEDs) emits a second light with a second wavelength, where the first wavelength and the second wavelength differ by greater than 10 nm, and where the 3D micro display includes a bonding structure.

In another aspect, a 3D micro display, the 3D micro display including: a first single crystal layer including a first plurality of light emitting diodes (LEDs); a second single crystal layer including a second plurality of light emitting diodes (LEDs), where the first single crystal layer includes at least ten individual first LED pixels, where the second single crystal layer includes at least ten individual second LED pixels, where the first plurality of light emitting diodes (LEDs) emits a first light with a first wavelength, where the second plurality of light emitting diodes (LEDs) emits a second light with a second wavelength, where the first wavelength and the second wavelength differ by greater than 10 nm; and further including a third single crystal layer including at least one LED driving circuit.

In another aspect, a 3D micro display, the 3D micro display including: a first single crystal layer including at least one LED driving circuit; a second single crystal layer including a first plurality of light emitting diodes (LEDs), where the second single crystal layer is disposed on top of the first single crystal layer, where the second single crystal layer includes at least ten individual first LED pixels, where the 3D micro display includes a bonding structure, and where the bonding structure includes oxide to oxide bonding.

In another aspect, a 3D micro display, the 3D micro display including: a first single crystal layer including a plurality of LED driving circuits; a second single crystal layer including a first plurality of light emitting diodes (LEDs), where the second single crystal layer includes at least ten individual first LED pixels; and a second plurality of light emitting diodes (LEDs), where the first plurality of light emitting diodes (LEDs) emits a first light with a first wavelength, where the second plurality of light emitting diodes (LEDs) emits a second light with a second wavelength, where the first wavelength and the second wavelength differ by greater than 10 nm, where the plurality of LED driving circuit include individual control of each of the first plurality of light emitting diodes (LEDs), and where the 3D micro display includes a bonding structure.

In another aspect, a 3D micro display, the 3D micro display including: a first level comprising a first single crystal layer, said first single crystal layer comprises at least one LED driving circuit; a second level comprising a first plurality of light emitting diodes (LEDs), said first plurality of LEDs comprising a second single crystal layer, wherein said second level is disposed on top of said first level, wherein said second level comprises at least ten individual first LED pixels; and a bonding structure, wherein said bonding structure comprises oxide to oxide bonding.

In another aspect, a 3D micro display, the 3D micro display including: a first level comprising a first single crystal layer, said first single crystal layer comprises at least one LED driving circuit; a second level comprising a first plurality of light emitting diodes (LEDs), said first plurality of LEDs comprising a second single crystal layer, wherein said second level is disposed on top of said first level, wherein said second level comprises at least ten individual first LED pixels; and a bonding structure, wherein said first level is bonded to said second level, and wherein said bonded comprises oxide to oxide bonding.

In another aspect, a 3D micro display, the 3D micro display including: a first level comprising a first single crystal layer, said first single crystal layer comprises at least one LED driving circuit; a second level comprising a first plurality of light emitting diodes (LEDs), said first plurality of LEDs comprising a second single crystal layer, wherein said second level is disposed on top of said first level, wherein said second level comprises at least ten individual first LED pixels, wherein said first plurality of LEDs comprise at least 10 individual LED pixels, wherein said at least 10 individual LED pixels been made individual by an etch process; and a bonding structure, wherein said first level is bonded to said second level, and wherein said bonded comprises oxide to oxide bonding.

In another aspect, a 3D micro display, the 3D micro display including: a first level including a first single crystal layer, the first single crystal layer includes a plurality of LED driving circuits; a second level including a first plurality of light emitting diodes (LEDs), the first plurality of LEDs including a second single crystal layer; a third level including a second plurality of light emitting diodes (LEDs), the second plurality of LEDs including a third single crystal layer, where the first level is disposed on top of the second level, where the second level includes at least ten individual first LED pixels; and a bonding structure, where the bonding structure includes oxide to oxide bonding.

In another aspect, a 3D micro display, the 3D micro display including: a first level including a first single crystal layer, the first single crystal layer includes a plurality of LED driving circuits; a second level including a first plurality of light emitting diodes (LEDs), the first plurality of LEDs including a second single crystal layer; a third level including a second plurality of light emitting diodes (LEDs), the second plurality of LEDs including a third single crystal layer, where the first level is disposed on top of the second level, where the first level is bonded to the second level, and where the bonded includes oxide to oxide bonding.

In another aspect, a 3D micro display, the 3D micro display including: a first level including a first single crystal layer, the first single crystal layer includes a plurality of LED driving circuits; a second level including a first plurality of light emitting diodes (LEDs), the first plurality of LEDs including a second single crystal layer; a third level including a second plurality of light emitting diodes (LEDs), the second plurality of LEDs including a third single crystal layer, a bonding structure, where the first level is bonded to the second level, and where the bonded includes oxide to oxide bonding.

BRIEF DESCRIPTION OF THE DRAWINGS

Various embodiments of the invention will be understood and appreciated more fully from the following detailed description, taken in conjunction with the drawings in which:

FIGS. 1A-1B illustrate red, green and blue type LEDs (prior art);

FIG. 2 illustrates a conventional RGB LED where red, green, and blue LEDs are placed side-by-side (prior art);

FIG. 3 illustrates a prior-art phosphor-based LED (pcLED);

FIGS. 4A-4S illustrate an embodiment of this invention, where RGB LEDs are stacked with ion-cut technology, flip-chip packaging and conductive oxide bonding;

FIGS. 5A-5Q illustrate an embodiment of this invention, where RGB LEDs are stacked with ion-cut technology, wire bond packaging and conductive oxide bonding;

FIGS. 6A-6L illustrate an embodiment of this invention, where stacked RGB LEDs are formed with ion-cut technology, flip-chip packaging and aligned bonding;

FIGS. 7A-7L illustrate an embodiment of this invention, where stacked RGB LEDs are formed with laser lift-off, substrate etch, flip-chip packaging and conductive oxide bonding;

FIGS. 8A-8B illustrate an embodiment of this invention, where stacked RGB LEDs are formed from a wafer having red LED layers and another wafer having both green and blue LED layers;

FIG. 9 illustrates an embodiment of this invention, where stacked RGB LEDs are formed with control and driver circuits for the LED built on the silicon sub-mount;

FIG. 10 illustrates an embodiment of this invention, where stacked RGB LEDs are formed with control and driver circuits as well as image sensors for the LED built on the silicon sub-mount;

FIGS. 11A-11F is a prior art illustration of pcLEDs constructed with ion-cut processes;

FIGS. 12A-12F illustrate an embodiment of this invention, where pcLEDs are constructed with ion-cut processes;

FIGS. 13A-13G are exemplary drawn illustrations of a display constructed using sub-400° C. processed single crystal silicon recessed channel transistors on a glass substrate;

FIGS. 14A-14H are exemplary drawn illustrations of a display constructed using sub-400° C. processed single crystal silicon replacement gate transistors on a glass substrate;

FIGS. 16A-16D are exemplary drawn illustrations of a display constructed using sub-400° C. processed amorphous silicon or polysilicon junction-less transistors on a glass substrate;

FIGS. 17A-17C are exemplary drawn illustrations of a microdisplay constructed using stacked RGB LEDs and control circuits are connected to each pixel with solder bumps;

FIGS. 18A-18D are exemplary drawn illustrations of a microdisplay constructed using stacked RGB LEDs and control circuits are monolithically stacked above the LED;

FIGS. 19A-19D illustrate embodiments of this invention, where multiple screens which may be actuated by motors are used to render displays in 3D;

FIG. 20A is an exemplary drawn illustration of the backbone of an example microLED display which is fabricated based on monolithic integration;

FIG. 20B is an exemplary drawn illustration of an inspection wherein bad pixel address(es) are captured for repair;

FIG. 20C is an exemplary drawn illustration of an etch applied to the previously (FIG. 1B) determined bad pixel to remove/eliminate it;

FIG. 20D is an exemplary drawn illustration of a singulated microLED which has undergone and passed testing and then is picked and placed into the etched pixel hole of one of the bad pixels determined and etched in FIGS. 1B and 1C;

FIG. 21 is an exemplary drawn illustration of an array of redundancy pairs of microLEDs vertically stacked, wherein at least two independent primary colors per pixel are aligned vertically;

FIG. 22 is an exemplary drawn illustration of an individual microLED pixel which may include primary electrodes as well as through layer bypass vias;

FIG. 23 is an exemplary drawn illustration of vertically stacking the microLEDs with redundant through layer bypass vias.

DETAILED DESCRIPTION

Figure 14B:
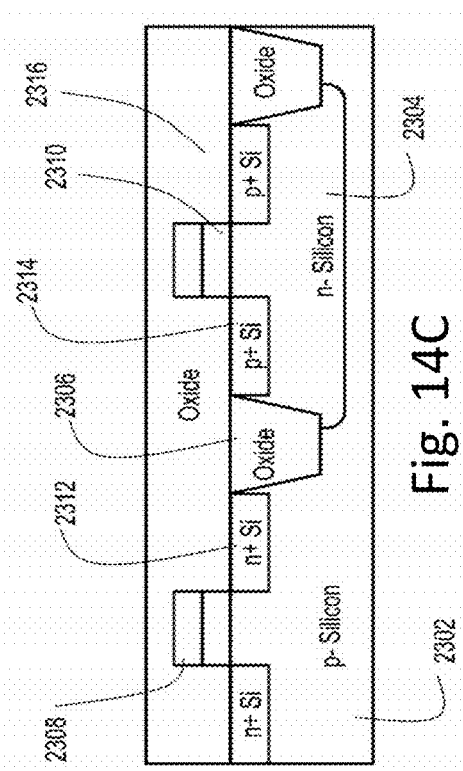

Embodiments of the present invention are now described with reference to at least FIGS. 1-24, it being appreciated that the figures illustrate the subject matter not to scale or to measure.

NuLED Technology:

FIG. 1A illustrates a cross-section of prior art red LEDs. Red LEDs are typically constructed on a Gallium Arsenide substrate 100. Alternatively, Gallium Phosphide or some other material can be used for the substrate. Since Gallium Arsenide 100 is opaque, a Bragg Reflector 101 is added to ensure light moves in the upward direction. Red light is produced by a p-n junction with multiple quantum wells (MQW). A p-type confinement layer 104, a n-type confinement layer 102 and a multiple quantum well 103 form this part of the device. A current spreading region 105 ensures current flows throughout the whole device and not just close to the contacts. Indium Tin Oxide (ITO) could be used for the current spreading region 105. A top contact 106 and a bottom contact 107 are used for making connections to the LED. It will be obvious to one skilled in the art based on the present disclosure that many configurations and material combinations for making red LEDs are possible. This invention is not limited to one particular configuration or set of materials.

FIG. 1B also illustrates green and blue LED cross-sections. These are typically constructed on a sapphire, SiC or bulk-GaN substrate, indicated by 108. Light is produced by a p-n junction with multiple quantum wells made of $In_xGa_{1-x}N/GaN$. A p-type confinement layer 111, a n-type confinement layer 109 and a multiple quantum well 110 form this part of the device. The value of subscript x in $In_xGa_{1-x}N$ determines whether blue light or green light is produced. For example, blue light typically corresponds to x ranging from 10% to 20% while green light typically corresponds to x ranging from 20% to 30%. A current spreader 112 is typically used as well. ITO could be a material used for the current spreader 112. An alternative material for current spreading could be ZnO. A top contact 113 and a bottom contact 114 are used for making connections to the LED. It will be obvious to one skilled in the art based on the present disclosure that many configurations and material combinations for making blue and green LEDs are possible. This invention is not limited to one particular configuration or set of materials.

White LEDs for various applications can be constructed in two ways. Method 1 is described in FIG. 2 which shows Red LED 201, blue LED 202, and green LED 203 that are constructed separately and placed side-by-side. Red light 204, blue light 205 and green light 206 are mixed to form white light 207. While these "RGB LEDs" are efficient, they suffer from cost issues and have problems related to light mixing. Method 2 is described in FIG. 3 which shows a blue LED 301 constructed and coated with a phosphor layer 302. The yellow phosphor layer converts blue light into white light 303. These "Phosphor-based LEDs" or "pcLEDs" are cheaper than RGB LEDs but are typically not as efficient.

FIG. 4A-S illustrate an embodiment of this invention where Red, Blue, and Green LEDs are stacked on top of each other with smart layer transfer techniques. A smart layer transfer may be defined as one or more of the following processes:

Ion-cut, variations of which are referred to as smart-cut, nano-cleave and smart-cleave: Further information on ion-cut technology is given in "Frontiers of silicon-on-insulator," J. Appl. Phys. 93, 4955-4978 (2003) by G. K. Celler and S. Cristolovean ("Celler") and also in "Mechanically induced Si layer transfer in hydrogen-implanted Si wafers," Appl. Phys. Lett., vol. 76, pp. 2370-2372, 2000 by K. Henttinen, I. Suni, and S. S. Lau ("Hentinnen").

Porous silicon approaches such as ELTRAN: These are described in "Eltran, Novel SOI Wafer Technology," JSAP International, Number 4, July 2001 by T. Yonehara and K. Sakaguchi ("Yonehara").

Bonding a substrate with single crystal layers followed by Polishing, Time-controlled etch-back or Etch-stop layer controlled etch-back to thin the bonded substrate: These are described in U.S. Pat. No. 6,806,171 by A. Ulyashin and A. Usenko ("Ulyashin") and "Enabling SOI-Based Assembly Technology for Three-Dimensional (3D) Integrated Circuits (ICs)," IEDM Tech. Digest, p. 363 (2005) by A. W. Topol, D. C. La Tulipe, L. Shi, S. M. Alam, D. J. Frank, S. E. Steen, J. Vichiconti, D. Posillico, M. Cobb, S. Medd, J. Patel, S. Goma, D. DiMilia, M. T. Robson, E. Duch, M. Farinelli, C. Wang, R. A. Conti, D. M. Canaperi, L. Deligianni, A. Kumar, K. T. Kwietniak, C. D'Emic, J. Ott, A. M. Young, K. W. Guarini, and M. Ieong ("Topol").

Bonding a wafer with a Gallium Nitride film epitaxially grown on a sapphire substrate followed by laser lift-off for removing the transparent sapphire substrate: This method may be suitable for deposition of Gallium Nitride thin films, and is described in U.S. Pat. No. 6,071,795 by Nathan W. Cheung, Timothy D. Sands and William S. Wong ("Cheung").

Rubber stamp layer transfer: This is described in "Solar cells sliced and diced," 19 May 2010, Nature News.

This process of constructing RGB LEDs could include several steps that occur in a sequence from Step (A) to Step (S). Many of them share common characteristics, features, modes of operation, etc. When the same reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 4A. A red LED wafer 436 is constructed on a GaAs substrate 402 and includes a N-type confinement layer 404, a multiple quantum well (MQW) 406, a P-type confinement layer 408, an optional reflector 409 and an ITO current spreader 410. Examples of materials used to construct these layers, include, but are not limited to, doped AlInGaP for the N-type confinement layer 404 and P-type confinement layer 408, the multiple quantum well layer 406 could be of AlInGaP and GaInP and the optional reflector 409 could be a distributed Bragg Reflector. A double heterostructure configuration or single quantum well configuration could be used instead of a multiple quantum well configuration. Various other material types and configurations could be used for constructing the red LEDs for this process. Yet another wafer is constructed with a green LED. The green LED wafer 438 is constructed on a sapphire or SiC or bulk-GaN substrate 412 and includes a N-type confinement layer 414, a multiple quantum well (MQW) 416, a buffer layer 418, a P-type confinement layer 420, an optional reflector 421 and an ITO current spreader 422. Yet another wafer is constructed with a blue LED. The blue LED wafer 440 is constructed on a sapphire or SiC or bulk-GaN substrate 424 and includes a N-type confinement layer 426, a multiple quantum well (MQW) 428, a buffer layer 430, a P-type confinement layer 432, an optional reflector 433 and an ITO current spreader 434. Examples of materials used to construct these blue and green LED layers, include, but are not limited to, doped GaN for the N-type and P-type confinement layers 414, 420, 426 and 432, AlGaN for the buffer layers 430 and 418 and InGaN/GaN for the multiple quantum wells 416 and 428. The optional reflectors 421 and 433 could be distributed Bragg Reflectors or some other type of reflectors. Various other material types and configurations could be used for constructing blue and green LEDs for this process.

Step (B) is illustrated in FIG. 4B. The blue LED wafer 440 from FIG. 4A is used for this step. Various elements in FIG. 4B such as, for example, 424, 426, 428, 430, 432, 433, and 434 have been previously described. Hydrogen is implanted into the wafer at a certain depth indicated by dotted lines 442. Alternatively, helium could be used for this step.

Step (C) is illustrated in FIG. 4C. A glass substrate 446 is taken and an ITO layer 444 is deposited atop it.

Step (D) is illustrated in FIG. 4D. The wafer shown in FIG. 4B is flipped and bonded atop the wafer shown in FIG. 4C using ITO-ITO bonding. Various elements in FIG. 4D such as 424, 426, 428, 430, 432, 433, 434, 442, 446, and 444 have been previously described. The ITO layer 444 is essentially bonded to the ITO layer 434 using an oxide-to-oxide bonding process.

Step (E) is illustrated in FIG. 4E. Various elements in FIG. 4E such as 424, 426, 428, 430, 432, 433, 434, 442, 446, and 444 have been previously described. An ion-cut process is conducted to cleave the structure shown in FIG. 4D at the hydrogen implant plane 442. This ion-cut process may use a mechanical cleave. An anneal process could be utilized for the cleave as well. After the cleave, a chemical mechanical polish (CMP) process is conducted to planarize the surface. The N-type confinement layer present after this cleave and CMP process is indicated as 427.

Step (F) is illustrated in FIG. 4F. Various elements in FIG. 4F such as 446, 444, 434, 433, 432, 430, 428, and 427 have been previously described. An ITO layer 448 is deposited atop the N-type confinement layer 427.

Step (G) is illustrated in FIG. 4G. The green LED wafer 438 shown in Step (A) is used for this step. Various elements in FIG. 4G such as 412, 414, 416, 418, 420, 421, and 422 have been described previously. Hydrogen is implanted into the wafer at a certain depth indicated by dotted lines 450. Alternatively, helium could be used for this step.

Step (H) is illustrated in FIG. 4H. The structure shown in FIG. 4G is flipped and bonded atop the structure shown in FIG. 4F using ITO-ITO bonding. Various elements in FIG. 4H such as 446, 444, 434, 433, 432, 430, 428, 427, 448, 412, 414, 416, 418, 420, 421, 422, and 450 have been described previously.

Step (I) is illustrated in FIG. 4I. The structure shown in FIG. 4H is cleaved at the hydrogen plane indicated by 450. This cleave process may be preferably done with a mechanical force. Alternatively, an anneal could be used. A CMP process is conducted to planarize the surface. Various elements in FIG. 4I such as 446, 444, 434, 433, 432, 430, 428, 427, 448, 416, 418, 420, 421, and 422 have been described previously. The N-type confinement layer present after this cleave and CMP process is indicated as 415.

Step (J) is illustrated in FIG. 4J. An ITO layer 452 is deposited atop the structure shown in FIG. 4I. Various elements in FIG. 4J such as 446, 444, 434, 433, 432, 430, 428, 427, 448, 416, 418, 420, 421, 415, and 422 have been described previously.

Step (K) is illustrated in FIG. 4K. The red LED wafer 436 shown in Step (A) is used for this step. Various elements in FIG. 4K such as 402, 404, 406, 408, 409, and 410 have been described previously. Hydrogen is implanted into the wafer at a certain depth indicated by dotted lines 454. Alternatively, helium could be used for this step.

Step (L) is illustrated in FIG. 4L. The structure shown in FIG. 4K is flipped and bonded atop the structure shown in FIG. 4J using ITO-ITO bonding. Various elements in FIG. 4L such as 446, 444, 434, 433, 432, 430, 428, 427, 448, 416, 418, 420, 421, 415, 422, 452, 402, 404, 406, 408, 409, 410, and 454 have been described previously.

Step (M) is illustrated in FIG. 4M. The structure shown in FIG. 4L is cleaved at the hydrogen plane 454. A mechanical force could be used for this cleave. Alternatively, an anneal could be used. A CMP process is then conducted to planarize the surface. The N-type confinement layer present after this process is indicated as 405. Various elements in FIG. 4M such as 446, 444, 434, 433, 432, 430, 428, 427, 448, 416, 418, 420, 421, 415, 422, 452, 406, 408, 409, and 410 have been described previously.

Step (N) is illustrated in FIG. 4N. An ITO layer 456 is deposited atop the structure shown in FIG. 4M. Various elements in FIG. 4M such as 446, 444, 434, 433, 432, 430, 428, 427, 448, 416, 418, 420, 421, 415, 422, 452, 406, 408, 409, 410, and 405 have been described previously.

Step (O) is illustrated in FIG. 4O. A reflecting material layer 458, constructed for example with Aluminum or Silver, is deposited atop the structure shown in FIG. 4N. Various elements in FIG. 4O such as 446, 444, 434, 433, 432, 430, 428, 427, 448, 416, 418, 420, 421, 415, 422, 452, 406, 408, 409, 410, 456, and 405 have been described previously.

Step (P) is illustrated in FIG. 4P. The process of making contacts to various layers and packaging begins with this step. A contact and bonding process similar to the one used in "High-power AlGaInN flip-chip light-emitting diodes," Applied Physics Letters, vol. 78, no. 22, pp. 3379-3381, May 2001, by Wierer, J. J.; Steigerwald, D. A.; Krames, M. R.; OShea, J. J.; Ludowise, M. J.; Christenson, G.; Shen, Y.-C.; Lowery, C.; Martin, P. S.; Subramanya, S.; Gotz, W.; Gardner, N. F.; Kern, R. S.; Stockman, S. A. is used. Vias 460 are etched to different layers of the LED stack. Various elements in FIG. 4P such as 446, 444, 434, 433, 432, 430, 428, 427, 448, 416, 418, 420, 421, 415, 422, 452, 406, 408, 409, 410, 456, 405, and 458 have been described previously. After the via holes 460 are etched, they may optionally be filled with an oxide layer and polished with CMP. This fill with oxide may be optional, and the preferred process may be to leave the via holes as such without fill. Note that the term contact holes could be used instead of the term via holes. Similarly, the term contacts could be used instead of the term vias.

Step (Q) is illustrated in FIG. 4Q. Aluminum is deposited to fill via holes 460 from FIG. 4P. Following this deposition, a lithography and etch process is utilized to define the aluminum metal to form vias 462. The vias 462 are smaller in diameter than the via holes 460 shown in FIG. 4P. Various elements in FIG. 4Q such as 446, 444, 434, 433, 432, 430, 428, 427, 448, 416, 418, 420, 421, 415, 422, 452, 406, 408, 409, 410, 456, 405, 460, and 458 have been described previously.

Step (R) is illustrated in FIG. 4R. A nickel layer 464 and a solder layer 466 are formed using standard procedures. Various elements in FIG. 4R such as 446, 444, 434, 433, 432, 430, 428, 427, 448, 416, 418, 420, 421, 415, 422, 452, 406, 408, 409, 410, 456, 405, 460, 462, and 458 have been described previously.

Step (S) is illustrated in FIG. 4S. The solder layer 466 is then bonded to pads on a silicon sub-mount 468. Various elements in FIG. 4S such as 446, 444, 434, 433, 432, 430, 428, 427, 448, 416, 418, 420, 421, 415, 422, 452, 406, 408, 409, 410, 456, 405, 460, 462, 458, 464, and 466 have been described previously. The configuration of optional reflectors 433, 421, and 409 determines light output coming from the LED. A preferred embodiment of this invention may not have a reflector 433, and may have the reflector 421 (reflecting only the blue light produced by multiple quantum well 428) and the reflector 409 (reflecting only the green light produced by multiple quantum well 416). In the process described in FIG. 4A-FIG. 4S, the original substrates in FIG. 4A, namely 402, 412 and 424, can be reused after ion-cut. This reuse may make the process more cost-effective.

FIGS. 5A-Q describe an embodiment of this invention, where RGB LEDs are stacked with ion-cut technology, wire bond packaging and conductive oxide bonding. Essentially, smart-layer transfer is utilized to construct this embodiment of the invention. This process of constructing RGB LEDs could include several steps that occur in a sequence from Step (A) to Step (Q). Many of the steps share common characteristics, features, modes of operation, etc. When the same reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A): This is illustrated using FIG. 5A. A red LED wafer 536 is constructed on a GaAs substrate 502 and includes a N-type confinement layer 504, a multiple quantum well (MQW) 506, a P-type confinement layer 508, an optional reflector 509 and an ITO current spreader 510. Examples of materials used to construct these layers, include, but are not limited to, doped AlInGaP for the N-type confinement layer 504 and P-type confinement layer 508, the multiple quantum well layer 506 could be of AlInGaP and GaInP and the optional reflector 509 could be a distributed Bragg Reflector. A double heterostructure configuration or single quantum well configuration could be used instead of a multiple quantum well configuration. Various other material types and configurations could be used for constructing the red LEDs for this process. Yet another wafer is constructed with a green LED. The green LED wafer 538 is constructed on a sapphire or SiC or bulk-GaN substrate 512 and includes a N-type confinement layer 514, a multiple quantum well (MQW) 516, a buffer layer 518, a P-type confinement layer 520, an optional reflector 521 and an ITO current spreader 522. Yet another wafer is constructed with a blue LED. The blue LED wafer 540 is constructed on a sapphire or SiC or bulk-GaN substrate 524 and includes a N-type confinement layer 526, a multiple quantum well (MQW) 528, a buffer layer 530, a P-type confinement layer 532, an optional reflector 533 and an ITO current spreader 534. Examples of materials used to construct these blue and green LED layers, include, but are not limited to, doped GaN (for the N-type and P-type confinement layers 514, 520, 526, and 532), AlGaN (for the buffer layers 530 and 518), and InGaN/GaN (for the multiple quantum wells 516 and 528). The optional reflectors 521 and 533 could be distributed Bragg Reflectors or some other type of reflectors. Various other material types and configurations could be used for constructing blue and green LEDs for this process.

Step (B) is illustrated in FIG. 5B. The red LED wafer 536 from FIG. 5A is used for this step. Various elements in FIG. 5B such as 502, 504, 506, 508, 509, and 510 have been previously described. Hydrogen is implanted into the wafer at a certain depth indicated by dotted lines 542. Alternatively, helium could be used for this step.

Step (C) is illustrated in FIG. 5C. A silicon substrate 546 is taken and an ITO layer 544 is deposited atop it.

Step (D) is illustrated in FIG. 5D. The wafer shown in FIG. 5B is flipped and bonded atop the wafer shown in FIG. 5C using ITO-ITO bonding. Various elements in FIG. 5D such as 502, 504, 506, 508, 509, 510, 542, 544, and 546 have been previously described. The ITO layer 544 is essentially bonded to the ITO layer 510 using an oxide-to-oxide bonding process.

Step (E) is illustrated in FIG. 5E. Various elements in FIG. 5E such as 506, 508, 509, 510, 544 and 546 have been previously described. An ion-cut process is conducted to cleave the structure shown in FIG. 5D at the hydrogen implant plane 542. This ion-cut process could preferably use a mechanical cleave. An anneal process could be utilized for the cleave as well. After the cleave, a chemical mechanical polish (CMP) process is conducted to planarize the surface. The N-type confinement layer present after this cleave and CMP process is indicated as 505.

Step (F) is illustrated in FIG. 5F. Various elements in FIG. 5F such as 505, 506, 508, 509, 510, 544, and 546 have been previously described. An ITO layer 548 is deposited atop the N-type confinement layer 505.

Step (G) is illustrated in FIG. 5G. The green LED wafer 538 shown in Step (A) is used for this step. Various elements in FIG. 5G such as 512, 514, 516, 518, 520, 521, and 522 have been described previously. Hydrogen is implanted into the wafer at a certain depth indicated by dotted lines 550. Alternatively, helium could be used for this step.

Step (H) is illustrated in FIG. 5H. The structure shown in FIG. 5G is flipped and bonded atop the structure shown in FIG. 5F using ITO-ITO bonding. Various elements in FIG. 5H such as 505, 506, 508, 509, 510, 544, 546, 548, 512, 514, 516, 518, 520, 521, 550, and 522 have been described previously.

Step (I) is illustrated in FIG. 5I. The structure shown in FIG. 5H is cleaved at the hydrogen plane indicated by 550. This cleave process may be preferably done with a mechanical force. Alternatively, an anneal could be used. A CMP process is conducted to planarize the surface. Various elements in FIG. 5I such as 505, 506, 508, 509, 510, 544, 546, 548, 516, 518, 520, 521, and 522 have been described previously. The N-type confinement layer present after this cleave and CMP process is indicated as 515.

Step (J) is illustrated using FIG. 5J. An ITO layer 552 is deposited atop the structure shown in FIG. 5I. Various elements in FIG. 5J such as 505, 506, 508, 509, 510, 544, 546, 548, 516, 518, 520, 521, 515, and 522 have been described previously.

Step (K) is illustrated using FIG. 5K. The blue LED wafer 540 from FIG. 5A is used for this step. Various elements in FIG. 5K such as 524, 526, 528, 530, 532, 533, and 534 have been previously described. Hydrogen is implanted into the wafer at a certain depth indicated by dotted lines 554. Alternatively, helium could be used for this step.

Step (L) is illustrated in FIG. 5L. The structure shown in FIG. 5K is flipped and bonded atop the structure shown in FIG. 5J using ITO-ITO bonding. Various elements in FIG. 4L such as 505, 506, 508, 509, 510, 544, 546, 548, 516, 518, 520, 521, 515, 522, 552, 524, 526, 528, 530, 532, 533, 554, and 534 have been described previously.

Step (M) is illustrated in FIG. 5M. The structure shown in FIG. 5L is cleaved at the hydrogen plane 554. A mechanical force could be used for this cleave. Alternatively, an anneal could be used. A CMP process is then conducted to planarize the surface. The N-type confinement layer present after this process is indicated as 527. Various elements in FIG. 5M such as 505, 506, 508, 509, 510, 544, 546, 548, 516, 518, 520, 521, 515, 522, 552, 528, 530, 532, 533, and 534 have been described previously.

Step (N) is illustrated in FIG. 5N. An ITO layer 556 is deposited atop the structure shown in FIG. 5M. Various elements in FIG. 5N such as 505, 506, 508, 509, 510, 544, 546, 548, 516, 518, 520, 521, 515, 522, 552, 528, 530, 532, 533, and 534 have been described previously.

Step (O) is illustrated in FIG. 5O. The process of making contacts to various layers and packaging begins with this step. Various elements in FIG. 5O such as 505, 506, 508, 509, 510, 544, 546, 548, 516, 518, 520, 521, 515, 522, 552, 528, 530, 532, 533, 556, and 534 have been described previously. Via holes 560 are etched to different layers of the LED stack. After the via holes 560 are etched, they may optionally be filled with an oxide layer and polished with CMP. This fill with oxide may be optional, and the preferred process may be to leave the via holes as such without fill.

Step (P) is illustrated in FIG. 5P. Aluminum is deposited to fill via holes 560 from FIG. 5O. Following this deposition, a lithography and etch process is utilized to define the aluminum metal to form via holes 562. Various elements in FIG. 5P such as 505, 506, 508, 509, 510, 544, 546, 548, 516, 518, 520, 521, 515, 522, 552, 528, 530, 532, 533, 556, 560, and 534 have been described previously.

Step (Q) is illustrated in FIG. 5Q. Bond pads 564 are constructed and wire bonds are attached to these bond pads following this step. Various elements in FIG. 5Q such as 505, 506, 508, 509, 510, 544, 546, 548, 516, 518, 520, 521, 515, 522, 552, 528, 530, 532, 533, 556, 560, 562, and 534 have been described previously. The configuration of optional reflectors 533, 521 and 509 determines light output coming from the LED. The preferred embodiment of this invention is to have reflector 533 reflect only blue light produced by multiple quantum well 528, to have the reflector 521 reflecting only green light produced by multiple quantum well 516 and to have the reflector 509 reflect light produced by multiple quantum well 506. In the process described in FIG. 5A-FIG. 5Q, the original substrates in FIG. 5A, namely 502, 512 and 524, can be re-used after ion-cut. This may make the process more cost-effective.

FIGS. 6A-6L show an alternative embodiment of this invention, where stacked RGB LEDs are formed with ion-cut technology, flip-chip packaging and aligned bonding. A smart layer transfer process, ion-cut, is therefore utilized. This process of constructing RGB LEDs could include several steps that occur in a sequence from Step (A) to Step (K). Many of the steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 6A. A red LED wafer 636 is constructed on a GaAs substrate 602 and includes a N-type confinement layer 604, a multiple quantum well (MQW) 606, a P-type confinement layer 608, an optional reflector 609 and an ITO current spreader 610. Above the ITO current spreader 610, a layer of silicon oxide 692 is deposited, patterned, etched and filled with a metal 690 (e.g., tungsten) which is then CMPed. Examples of materials used to construct these layers, include, but are not limited to, doped AlInGaP for the N-type confinement layer 604 and P-type confinement layer 608, the multiple quantum well layer 606 could be of AlInGaP and GaInP and the optional reflector 609 could be a distributed Bragg Reflector. A double heterostructure configuration or single quantum well configuration could be used instead of a multiple quantum well configuration. Various other material types and configurations could be used for constructing the red LEDs for this process. Yet another wafer is constructed with a green LED. The green LED wafer 638 is constructed on a sapphire or SiC or bulk-GaN substrate 612 and includes a N-type confinement layer 614, a multiple quantum well (MQW) 616, a buffer layer 618, a P-type confinement layer 620, an optional reflector 621 and an ITO current spreader 622. Above the ITO current spreader 622, a layer of silicon oxide 696 is deposited, patterned, etched and filled with a metal 694 (e.g., tungsten) which is then CMPed. Yet another wafer is constructed with a blue LED. The blue LED wafer 640 is constructed on a sapphire or SiC or bulk-GaN substrate 624 and includes a N-type confinement layer 626, a multiple quantum well (MQW) 628, a buffer layer 630, a P-type confinement layer 632, an optional reflector 633 and an ITO current spreader 634. Above the ITO current spreader 634, a layer of silicon dioxide 698 is deposited. Examples of materials used to construct these blue and green LED layers, include, but are not limited to, doped GaN for the N-type and P-type confinement layers 614, 620, 626 and 632, AlGaN for the buffer layers 630 and 618 and InGaN/GaN for the multiple quantum wells 616 and 628. The optional reflectors 621 and 633 could be distributed Bragg Reflectors or some other type of reflectors. Various other material types and configurations could be used for constructing blue and green LEDs for this process.

Step (B) is illustrated in FIG. 6B. The blue LED wafer 640 from FIG. 6A is used for this step. Various elements in FIG. 6B such as 624, 626, 628, 630, 632, 633, 698, and 634 have been previously described. Hydrogen is implanted into the wafer at a certain depth indicated by dotted lines 642. Alternately, helium could be used for this step.

Step (C) is illustrated in FIG. 6C. A glass substrate 646 is taken and a silicon dioxide layer 688 is deposited atop it.

Step (D) is illustrated in FIG. 6D. The wafer shown in FIG. 6B is flipped and bonded atop the wafer shown in FIG. 6C using oxide-oxide bonding. Various elements in FIG. 6D such as 624, 626, 628, 630, 632, 633, 698, 642, 646, 688, and 634 have been previously described. The oxide layer 688 is essentially bonded to the oxide layer 698 using an oxide-to-oxide bonding process.

Step (E) is illustrated in FIG. 6E. Various elements in FIG. 6E such as 628, 630, 632, 633, 698, 646, 688, and 634 have been previously described. An ion-cut process is conducted to cleave the structure shown in FIG. 6D at the hydrogen implant plane 642. This ion-cut process may be preferably using a mechanical cleave. An anneal process could be utilized for the cleave as well. After the cleave, a chemical mechanical polish (CMP) process is conducted to planarize the surface. The N-type confinement layer present after this cleave and CMP process is indicated as 627.

Step (F) is illustrated in FIG. 6F. Various elements in FIG. 6F such as 628, 630, 632, 633, 698, 646, 688, 627, and 634 have been previously described. An ITO layer 648 is deposited atop the N-type confinement layer 627. Above the ITO layer 648, a layer of silicon oxide 686 is deposited, patterned, etched and filled with a metal 684 (e.g., tungsten) which is then CMPed.

Step (G) is illustrated in FIG. 6G. The green LED wafer 638 shown in Step (A) is used for this step. Various elements in FIG. 6G such as 612, 614, 616, 618, 620, 621, 696, 694, and 622 have been described previously. Hydrogen is implanted into the wafer at a certain depth indicated by dotted lines 650. Alternatively, helium could be used for this step.

Step (H) is illustrated in FIG. 6H. The structure shown in FIG. 6G is flipped and bonded atop the structure shown in FIG. 6F using oxide-oxide bonding. The metal regions 694 and 684 on the bonded wafers are aligned to each other. Various elements in FIG. 6H such as 628, 630, 632, 633, 698, 646, 688, 627, 634, 648, 686, 684, 612, 614, 616, 618, 620, 621, 696, 694, 650, and 622 have been described previously.

Step (I) is illustrated in FIG. 6I. The structure shown in FIG. 6H is cleaved at the hydrogen plane indicated by 650. This cleave process may be preferably done with a mechanical force. Alternatively, an anneal could be used. A CMP process is conducted to planarize the surface. Various elements in FIG. 6I such as 628, 630, 632, 633, 698, 646, 688, 627, 634, 648, 686, 684, 616, 618, 620, 621, 696, 694, and 622 have been described previously. The N-type confinement layer present after this cleave and CMP process is indicated as 615.

Step (J) is illustrated in FIG. 6J. An ITO layer 652 is deposited atop the structure shown in FIG. 6I. Above the ITO layer 652, a layer of silicon oxide 682 is deposited, patterned, etched and filled with a metal 680 (e.g., tungsten) which is then CMPed.

Various elements in FIG. 6J such as 628, 630, 632, 633, 698, 646, 688, 627, 634, 648, 686, 684, 616, 618, 620, 621, 696, 694, 615, and 622 have been described previously.

Step (K) is illustrated in FIG. 6K. Using procedures similar to Step (G)-Step (J), the red LED layer is transferred atop the structure shown in FIG. 6J. The N-type confinement layer after ion-cut is indicated by 605. An ITO layer 656 is deposited atop the N-type confinement layer 605. Various elements in FIG. 6K such as 628, 630, 632, 633, 698, 646, 688, 627, 634, 648, 686, 684, 616, 618, 620, 621, 696, 694, 615, 690, 692, 610, 609, 608, 606, and 622 have been described previously.

Step (L) is illustrated in FIG. 6L. Using flip-chip packaging procedures similar to those described in FIG. 4A-FIG. 4S, the RGB LED stack shown in FIG. 6K is attached to a silicon sub-mount 668. 658 indicates a reflecting material, 664 is a nickel layer, 666 represents solder bumps, 670 is an aluminum via, and 672 is either an oxide layer or an air gap. Various elements in FIG. 6K such as 628, 630, 632, 633, 698, 646, 688, 627, 634, 648, 686, 684, 616, 618, 620, 621, 696, 694, 615, 690, 692, 610, 609, 608, 606, 605, 656, and 622 have been described previously. The configuration of optional reflectors 633, 621 and 609 determines light output coming from the LED. A preferred embodiment of this invention may not have a reflector 633, but may have the reflector 621 (reflecting only the blue light produced by multiple quantum well 628) and the reflector 609 (reflecting only the green light produced by multiple quantum well 616). In the process described in FIG. 6A-FIG. 6L, the original substrates in FIG. 6A, namely 602, 612, and 624, can be re-used after ion-cut. This may make the process more cost-effective.

FIGS. 7A-L illustrate an embodiment of this invention, where stacked RGB LEDs are formed with laser lift-off, substrate etch, flip-chip packaging and conductive oxide bonding. Essentially, smart layer transfer techniques are used. This process could include several steps that occur in a sequence from Step (A) to Step (M). Many of the steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A): This is illustrated using FIG. 7A. A red LED wafer 736 is constructed on a GaAs substrate 702 and includes a N-type confinement layer 704, a multiple quantum well (MQW) 706, a P-type confinement layer 708, an optional reflector 709 and an ITO current spreader 710. Examples of materials used to construct these layers, include, but are not limited to, doped AlInGaP for the N-type confinement layer 704 and P-type confinement layer 708, the multiple quantum well layer 706 could be of AlInGaP and GaInP and the optional reflector 409 could be a distributed Bragg Reflector. A double heterostructure configuration or single quantum well configuration could be used instead of a multiple quantum well configuration. Various other material types and configurations could be used for constructing the red LEDs for this process. Yet another wafer is constructed with a green LED. The green LED wafer 738 is constructed on a sapphire substrate 712 (or some other transparent substrate) and includes a N-type confinement layer 714, a multiple quantum well (MQW) 716, a buffer layer 718, a P-type confinement layer 720, an optional reflector 721 and an ITO current spreader 722. Yet another wafer is constructed with a blue LED. The blue LED wafer 740 is constructed on a sapphire substrate 724 (or some other transparent substrate) and includes a N-type confinement layer 726, a multiple quantum well (MQW) 728, a buffer layer 730, a P-type confinement layer 732, an optional reflector 733 and an ITO current spreader 734. Examples of materials used to construct these blue and green LED layers, include, but are not limited to, doped GaN for the N-type and P-type confinement layers 714, 720, 726 and 732, AlGaN for the buffer layers 730 and 718 and InGaN/GaN for the multiple quantum wells 716 and 728. The optional reflectors 721 and 733 could be distributed Bragg Reflectors or some other type of reflectors. Various other material types and configurations could be used for constructing blue and green LEDs for this process.

Step (B) is illustrated in FIG. 7B. A glass substrate 746 is taken and an ITO layer 744 is deposited atop it.

Step (C) is illustrated in FIG. 7C. The blue LED wafer 740 shown in FIG. 7A is flipped and bonded atop the wafer shown in FIG. 7B using ITO-ITO bonding. Various elements in FIG. 7C such as 724, 726, 728, 730, 732, 733, 734, 746, and 744 have been previously described. The ITO layer 744 is essentially bonded to the ITO layer 734 using an oxide-to-oxide bonding process.

Step (D) is illustrated in FIG. 7D. A laser is used to shine radiation through the sapphire substrate 724 of FIG. 7C and a laser lift-off process is conducted. The sapphire substrate 724 of FIG. 7C is removed with the laser lift-off process. Further details of the laser lift-off process are described in U.S. Pat. No. 6,071,795 by Nathan W. Cheung, Timothy D. Sands and William S. Wong ("Cheung"). A CMP process is conducted to planarize the surface of the N confinement layer 727 after laser lift-off of the sapphire substrate. Various elements in FIG. 7D such as 728, 730, 732, 733, 734, 746, and 744 have been previously described.

Step (E) is illustrated in FIG. 7E. Various elements in FIG. 7E such as 728, 730, 732, 733, 734, 746, 727, and 744 have been previously described. An ITO layer 748 is deposited atop the N confinement layer 727.

Step (F) is illustrated in FIG. 7F. The green LED wafer 738 is flipped and bonded atop the structure shown in FIG. 7E using ITO-ITO bonding of layers 722 and 748. Various elements in FIG. 7F such as 728, 730, 732, 733, 734, 746, 727, 748, 722, 721, 720, 718, 716, 714, 712 and 744 have been previously described.

Step (G) is illustrated in FIG. 7G. A laser is used to shine radiation through the sapphire substrate 712 of FIG. 7F and a laser lift-off process is conducted. The sapphire substrate 712 of FIG. 7F is removed with the laser lift-off process. A CMP process is conducted to planarize the surface of the N-type confinement layer 715 after laser lift-off of the sapphire substrate. Various elements in FIG. 7G such as 728, 730, 732, 733, 734, 746, 727, 748, 722, 721, 720, 718, 716, and 744 have been previously described.

Step (H) is illustrated in FIG. 7H. An ITO layer 752 is deposited atop the N-type confinement layer 715. Various elements in FIG. 7H such as 728, 730, 732, 733, 734, 746, 727, 748, 722, 721, 720, 718, 716, 715, and 744 have been previously described.

Step (I) is illustrated in FIG. 7I. The red LED wafer 736 from FIG. 7A is flipped and bonded atop the structure shown in FIG. 7H using ITO-ITO bonding of layers 710 and 752. Various elements in FIG. 7I such as 728, 730, 732, 733, 734, 746, 727, 748, 722, 721, 720, 718, 716, 715, 752, 710, 709, 708, 706, 704, 702, and 744 have been previously described.

Step (J) is illustrated in FIG. 7J. The GaAs substrate 702 from FIG. 7I is removed using etch and/or CMP. Following this etch and/or CMP process, the N-type confinement layer 704 of FIG. 7I is planarized using CMP to form the N-type confinement layer 705. Various elements in FIG. 7J such as 728, 730, 732, 733, 734, 746, 727, 748, 722, 721, 720, 718, 716, 715, 752, 710, 709, 708, 706, and 744 have been previously described.

Step (K) is illustrated in FIG. 7K. An ITO layer 756 is deposited atop the N confinement layer 705 of FIG. 7J. Various elements in FIG. 7K such as 728, 730, 732, 733, 734, 746, 727, 748, 722, 721, 720, 718, 716, 715, 752, 710, 709, 708, 706, 705, and 744 have been previously described.

Step (L) is illustrated in FIG. 7L. Using flip-chip packaging procedures similar to those described in FIG. 4A-FIG. 4S, the RGB LED stack shown in FIG. 7K is attached to a silicon sub-mount 768. 758 indicates a reflecting material, 764 is a nickel layer, 766 represents solder bumps, 762 is an aluminum via, and 772 is either an oxide layer or an air gap. Various elements in FIG. 7L such as 728, 730, 732, 733, 734, 746, 727, 748, 722, 721, 720, 718, 716, 715, 752, 710, 709, 708, 706, 705, and 756 have been described previously. The configuration of optional reflectors 733, 721 and 709 determines light output coming from the LED. The preferred embodiment of this invention may not have a reflector 733, but may have the reflector 721 (reflecting only the blue light produced by multiple quantum well 728) and the reflector 709 (reflecting only the green light produced by multiple quantum well 716).

FIGS. 8A-B show an embodiment of this invention, where stacked RGB LEDs are formed from a wafer having red LED layers and another wafer having both green and blue LED layers. Therefore, a smart layer transfer process is used to form the stacked RGB LED. FIG. 8A shows that a red LED wafer 836 and another wafer called a blue-green LED wafer 836 are used. The red LED wafer 836 is constructed on a GaAs substrate 802 and includes a N-type confinement layer 804, a multiple quantum well (MQW) 806, a P-type confinement layer 808, an optional reflector 809 and an ITO current spreader 810. Examples of materials used to construct these layers, include, but are not limited to, doped AlInGaP for the N-type confinement layer 804 and P-type confinement layer 808, the multiple quantum well layer 806 could be of AlInGaP and GaInP and the optional reflector 809 could be a distributed Bragg Reflector. A double heterostructure configuration or single quantum well configuration could be used instead of a multiple quantum well configuration. Various other material types and configurations could be used for constructing the red LEDs for this process. The blue-green LED wafer 838 is constructed on a sapphire or bulk GaN or SiC substrate 812 (or some other transparent substrate) and includes a N-type confinement layer 814, a green multiple quantum well (MQW) 816, a blue multiple quantum well 817, a buffer layer 818, a P-type confinement layer 820, an optional reflector 821, and an ITO current spreader 822. Examples of materials used to construct the blue-green LED wafers, include, but are not limited to, doped GaN for the N-type and P-type confinement layers 814, 820, AlGaN for the buffer layer 818 and InGaN/GaN for the multiple quantum wells 816 and 817. The optional reflector 821 could be a distributed Bragg Reflector or some other type of reflector. The optional reflector 821 could alternatively be built between the N-type confinement layer 814 or below it, and this is valid for all LEDs discussed in the patent application. Various other material types and configurations could be used for constructing blue-green LED wafers for this process. Using smart layer transfer procedures similar to those shown in FIG. 4-FIG. 7, the stacked RGB LED structure shown in FIG. 8B is constructed. Various elements in FIG. 8B such as 806, 808, 809, 810, 816, 817, 818, 820, 821, and 822 have been described previously. 846 is a glass substrate, 844 is an ITO layer, 815 is a N-type confinement layer for a blue-green LED, 852 is an ITO layer, 805 is a N-type confinement layer for a red LED, 856 is an ITO layer, 858 is a reflecting material such as, for example, silver or aluminum, 864 is a nickel layer, 866 is a solder layer, 862 is a contact layer constructed of aluminum or some other metal, 860 may be preferably an air gap but could be an oxide layer and 868 is a silicon sub-mount. The configuration of optional reflectors 821 and 809 determines light produced by the LED. For the configuration shown in FIG. 8B, the preferred embodiment may not have the optional reflector 821 and may have the optional reflector 809 reflecting light produced by the blue and green quantum wells 816 and 817.

FIG. 9 illustrates an embodiment of this invention, where stacked RGB LEDs are formed with control and driver circuits for the LED built on the silicon sub-mount. Procedures similar to those described in FIG. 4-FIG. 7 are utilized for constructing and packaging the LED. Control and driver circuits are integrated on the silicon sub-mount 968 and can be used for controlling and driving the stacked RGB LED. 946 is a glass substrate, 944 and 934 are ITO layers, 933 is an optional reflector, 932 is a P-type confinement layer for a blue LED, 930 is a buffer layer for a blue LED, 928 is a blue multiple quantum well, 927 is a N-type confinement layer for a blue LED, 948 and 922 are ITO layers, 921 is an optional reflector, 920 is a P-type confinement layer for a green LED, 918 is a buffer layer for a green LED, 916 is a multiple quantum well for a green LED, 915 is a N-type confinement layer for a green LED, 952 and 910 are ITO layers, 909 is a reflector, 908 is a P-type confinement layer for a red LED, 906 is a red multiple quantum well, 905 is a N-type confinement layer for a red LED, 956 is an ITO layer, 958 is a reflecting layer such as aluminum or silver, 962 is a metal via constructed, for example, out of aluminum, 960 is an air-gap or an oxide layer, 964 is a nickel layer, and 966 is a solder bump.

FIG. 10 illustrates an embodiment of this invention, where stacked RGB LEDs are formed with control and driver circuits as well as image sensors for the LED built on the silicon sub-mount 1068. Image sensors essentially monitor the light coming out of the LED and tune the voltage and current given by control and driver circuits such that light output of the LED is the right color and intensity. 1046 is a glass substrate, 1044 and 1034 are ITO layers, 1033 is an optional reflector, 1032 is a P-type confinement layer for a blue LED, 1030 is a buffer layer for a blue LED, 1028 is a blue multiple quantum well, 1027 is a N-type confinement layer for a blue LED, 1048 and 1022 are ITO layers, 1021 is an optional reflector, 1020 is a P-type confinement layer for a green LED, 1018 is a buffer layer for a green LED, 1016 is a multiple quantum well for a green LED, 1015 is a N-type confinement layer for a green LED, 1052 and 1010 are ITO layers, 1009 is a reflector, 1008 is a P-type confinement layer for a red LED, 1006 is a red multiple quantum well, 1005 is a N-type confinement layer for a red LED, 1056 is an ITO layer, 1058 is a reflecting layer such as aluminum or silver, 1062 is a metal via constructed for example out of aluminum, 1060 is an air-gap or an oxide layer, 1064 is a nickel layer and 1066 is a solder bump. The via hole 1074 helps transfer light produced by the blue multiple quantum well 1028 reach an image sensor on the silicon sub-mount 1068. The via hole 1072 helps transfer light produced by the green multiple quantum well 1016 to an image sensor on the silicon sub-mount 1068. The via hole 1070 helps transfer light produced by the red multiple quantum well 1006 reach an image sensor on the silicon sub-mount 1068. By sampling the light produced by each of the quantum wells on the LED, voltage and current drive levels to different terminals of the LED can be determined. Color tunability, temperature compensation, better color stability, and many other features can be obtained with this scheme. Furthermore, circuits to communicate wirelessly with the LED can be constructed on the silicon sub-mount. Light output of the LED can be modulated by a signal from the user delivered wirelessly to the light.

While three LED layers, namely, red, green, and blue, are shown as stacked in various embodiments of this invention, it will be clear to one skilled in the art based on the present disclosure that more than three LED layers can also be stacked. For example, red, green, blue and yellow LED layers can be stacked.

The embodiments of this invention described in FIG. 4-FIG. 10 share a few common features. They have multiple stacked (or overlying) layers, they are constructed using smart layer transfer techniques and at least one of the stacked layers has a thickness less than 50 microns. When cleave is done using ion-cut, substrate layers that are removed using cleave can be reused after a process flow that often includes a CMP.

FIGS. 11A-F show a prior art illustration of phosphor-coated LEDs (pcLEDs) constructed with ion-cut processes. The process begins in FIG. 11A with a bulk-GaN substrate 1102, and an oxide layer 1104 is deposited atop it. The oxide layer 1104 is an oxide compatible with GaN. FIG. 11B depicts hydrogen being implanted into the structure shown in FIG. 11A at a certain depth (for ion-cut purposes). 1102 and 1104 have been described previously with respect to FIG. 11A. Dotted lines 1106 indicate the plane of hydrogen ions. Alternatively, helium can be implanted instead of hydrogen or hydrogen and helium can be co-implanted. FIG. 11C shows a silicon wafer 1108 with an oxide layer 1110 atop it. The structure shown in FIG. 11B is flipped and bonded atop the structure shown in FIG. 11C using oxide-to-oxide bonding of layers 1104 and 1110. This is depicted in FIG. 11D. 1108, 1110 and 1106 have been described previously. FIG. 11E shows the next step in the process. Using an anneal, a cleave is conducted at the plane of hydrogen atoms 1106 shown in FIG. 11D, and a CMP is done to form GaN layer 1112. 1104, 1110 and 1108 have been described previously. FIG. 11F shows the following step in the process. A blue LED 1114 is grown epitaxially above the GaN layer 1112. 1104, 1108 and 1110 have been described previously. A phosphor layer can be coated atop the blue LED 1114 to form a white phosphor coated LED.

There may be some severe challenges with the prior art process shown in FIGS. 11A-F. The thermal expansion coefficients for GaN layers 1112 in FIG. 11F are very different from that for silicon layers 1108. This difference can cause cracks and defects while growing the blue LED layer 1114 at high temperatures (>600° C.), which usually occurs. These cracks and defects, in turn, cause bad efficiency and can in turn cause the phosphor coated LED process in FIG. 11A-F to be difficult to manufacture. Furthermore, an anneal (typically >400° C.) is typically used in FIG. 11E to cleave the bulk GaN layers. This can again cause issues with mismatch of thermal expansion co-efficients and cause cracking and defects.

FIGS. 12A-F describe an embodiment of this invention, where phosphor coated LEDs are formed with an ion-cut process (i.e. a smart layer transfer process). It minimizes the problem with mismatch of thermal expansion co-efficients that is inherent to the process described in FIGS. 11A-F. This process could include several steps as described in the following sequence:

Step (A): FIG. 12A illustrates this step. A blue LED wafer is constructed on a bulk-GaN substrate 1216. For discussions within this document, the bulk-GaN substrate could be semi-polar or non-polar or polar. The blue LED wafer includes a N-type confinement layer 1214, a multiple quantum well (MQW) 1212, a buffer layer 1210, a P-type confinement layer 1208, an optional reflector 1204 and an ITO current spreader 1206. Examples of materials used to construct these blue LED layers, include, but are not limited to, doped GaN for the N-type and P-type confinement layers 1214 and 1208, AlGaN for the buffer layer 1210 and InGaN/GaN for the multiple quantum wells 1212. The optional reflector 1204 could be distributed Bragg Reflector, an Aluminum or silver layer or some other type of reflectors. A silicon dioxide layer 1202 is deposited atop the optional reflector 1204.

Step (B): FIG. 12B illustrates this step. The blue LED wafer described in FIG. 12A has hydrogen implanted into it at a certain depth. The dotted lines 1218 depict the hydrogen implant. Alternatively, helium can be implanted. Various elements in FIG. 12B such as 1216, 1214, 1212, 1210, 1208, 1206, 1204, and 1202 have been described previously.

Step (C): FIG. 12C illustrates this step. A wafer 1220, preferably of silicon, having the same wafer size as the structure in FIG. 12B is taken and an oxide layer 1222 is grown or deposited atop it.

Step (D): FIG. 12D illustrates this step. The structure shown in FIG. 12B is flipped and bonded atop the structure shown in FIG. 12C using oxide-to-oxide bonding of layers 1202 and 1222. Various elements in FIG. 12D such as 1216, 1214, 1212, 1210, 1208, 1206, 1204, 1220, 1222, 1218 and 1202 have been described previously.

Step (E): FIG. 12E illustrates this step. The structure shown in FIG. 12D is cleaved at its hydrogen plane 1218. A mechanical cleave may be preferably used for this process. However, an anneal could be used as well. The mechanical cleave process typically happens at room temperatures, and therefore can avoid issues with thermal expansion co-efficients mismatch. After cleave, the wafer is planarized and the N-type confinement layer 1215 is formed. Various elements in FIG. 12E such as 1212, 1210, 1208, 1206, 1204, 1220, 1222, and 1202 have been described previously. The bulk GaN substrate 1216 from FIG. 12D that has been cleaved away can be reused. This may be attractive from a cost perspective, since bulk GaN substrates are quite costly.

Step (F): This is illustrated in FIG. 12F. An ITO layer 1224 is deposited atop the structure shown in FIG. 12E. Various elements in FIG. 12F such as 1212, 1210, 1208, 1206, 1204, 1220, 1222, 1215, 1224, and 1202 have been described previously.

A phosphor coating can be applied over the structure shown in FIG. 12F to produce a phosphor-coated LED. The advantage of the process shown in FIG. 12A-F over the process shown in FIG. 11A-F may include low process temperatures, even less than 250° C. Therefore, issues with thermal expansion co-efficients mismatch are substantially mitigated. While the description in FIG. 12A-F is for a LED, many other devices, such as, for example, laser diodes, high power transistors, high frequencies transistors, special transmitter circuits and many other devices can be constructed, according to a similar description, with bulk-GaN.

In the description of FIG. 12A-F, silicon is described as a preferred material for the substrate 1220. Silicon has a co-efficient of thermal expansion of about 2.6 ppm/° C., while bulk-GaN, which is the substrate 1216 on which the LED is epitaxially grown, has a co-efficient of thermal expansion of 5.6 ppm/° C. In an alternate embodiment of this invention, the substrate 1220 used in FIG. 12A-F could be constructed of a material that has a co-efficient of thermal expansion (CTE) fairly close to bulk-GaN. Preferably, the CTE of the substrate 1220 could be any value in between (the CTE of bulk GaN−2 ppm/° C.) and (the CTE of bulk GaN+2 ppm/° C.). Examples of materials that could be used for the substrate 1220 could include, but are not limited to, Germanium, that has a CTE of 5.8 ppm/° C., and various ceramic materials. Having CTE for the substrate 1220 close to bulk-GaN prevents defects and cracks being formed due to issues with mismatch of CTE, even if higher temperature processing (>250° C.) is used.

In an alternative embodiment of this invention, the flow in FIG. 11A-F can be used with the substrate 1108 having a CTE fairly close to the CTE of bulk GaN. Preferably, the CTE of the substrate 1108 could be any value in between (the CTE of bulk GaN−2 ppm/° C.) and (the CTE of bulk GaN+2 ppm/° C.). Examples of materials that could be used for the substrate 1108 could include, but are not limited to, Germanium, that has a CTE of 5.8 ppm/° C., and various ceramic materials.

NuDisplay Technology:

In displays and microdisplays (small size displays where optical magnification is needed), transistors need to be formed on glass or plastic substrates. These substrates typically cannot withstand high process temperatures (e.g., >400° C.). Layer transfer can be advantageously used for constructing displays and microdisplays as well, since it may enable transistors to be processed on these substrates at <400° C. Various embodiments of transistors constructed on glass substrates are described in this patent application. These transistors constructed on glass substrates could form part of liquid crystal displays (LCDs) or other types of displays. It will be clear to those skilled in the art based on the present disclosure that these techniques can also be applied to plastic substrates.

FIGS. 22A-G describe a process for forming recessed channel single crystal (or monocrystalline) transistors on glass substrates at a temperature approximately less than 400° C. for display and microdisplay applications. This process could include several steps that occur in a sequence from Step (A) to Step (G). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 13A. A silicon wafer 2202 is taken and a n+ region 2204 is formed by ion implantation. Following this formation, a layer of p− Silicon 2206 is epitaxially grown. An oxide layer 2210 is then deposited. Following this deposition, an anneal is performed to activate dopants in various layers. It will be clear to one skilled in the art based on the present disclosure that various other procedures can be used to get the structure shown in FIG. 13A. Step (B) is illustrated in FIG. 22B. Hydrogen is implanted into the structure shown in FIG. 13A at a certain depth indicated by 2212. Alternatively, Helium can be used for this purpose. Various elements in FIG. 22B, such as 2202, 2204, 2006, and 2210 have been described previously. Step (C) is illustrated in FIG. 13C. A glass substrate 2214 is taken and a silicon oxide layer 2216 is deposited atop it at compatible temperatures. Step (D) is illustrated in FIG. 13D. Various elements in FIG. 13D, such as 2202, 2204, 2206, 2210, 2214, and 2216 have been described previously. The structure shown in FIG. 13B is flipped and bonded to the structure shown in FIG. 13C using oxide-to-oxide bonding of layers 2210 and 2216. Step (E) is illustrated in FIG. 13E. The structure shown in FIG. 13D is cleaved at the hydrogen plane 2212 of FIG. 13D. A CMP is then done to planarize the surface and yield the n+ Si layer 2218. Various other elements in FIG. 13E, such as 2214, 2216, 2210 and 2206 have been described previously. Step (F) is illustrated in FIG. 13F. Various elements in FIG. 13F such as 2214, 2216, 2210, and 2206 have been described previously. An oxide layer 2220 is formed using a shallow trench isolation (STI) process. This helps isolate transistors. Step (G) is illustrated in FIG. 13G. Various elements in FIG. 13G such as 2210, 2216, 2220 and 2214 have been described previously. Using etch techniques, part of the n+ Silicon layer from FIG. 13F and optionally p− Silicon layer from FIG. 13F are etched. After this a thin gate dielectric is deposited, after which a gate dielectrode is deposited. The gate dielectric and gate electrode are then polished away to form the gate dielectric layer 2224 and gate electrode layer 2222. The n+ Silicon layers 2228 and 2226 form the source and drain regions of the transistors while the p− Silicon region after this step is indicated by 2230. Contacts and other parts of the display/microdisplay are then fabricated. It can be observed that during the whole process, the glass substrate substantially always experiences temperatures less than 400° C., or even lower. This is because the crystalline silicon can be transferred atop the glass substrate at a temperature less than 400° C., and dopants are pre-activated before layer transfer to glass.

FIG. 14A-H describes a process of forming both nMOS and pMOS transistors with single-crystal silicon on a glass substrate at temperatures less than 400° C., and even lower. Ion-cut technology (which is a smart layer transfer technology) is used. While the process flow described is shown for both nMOS and pMOS on a glass substrate, it could also be used for just constructing nMOS devices or for just constructing pMOS devices. This process could include several steps that occur in a sequence from Step (A) to Step (H). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 14C:
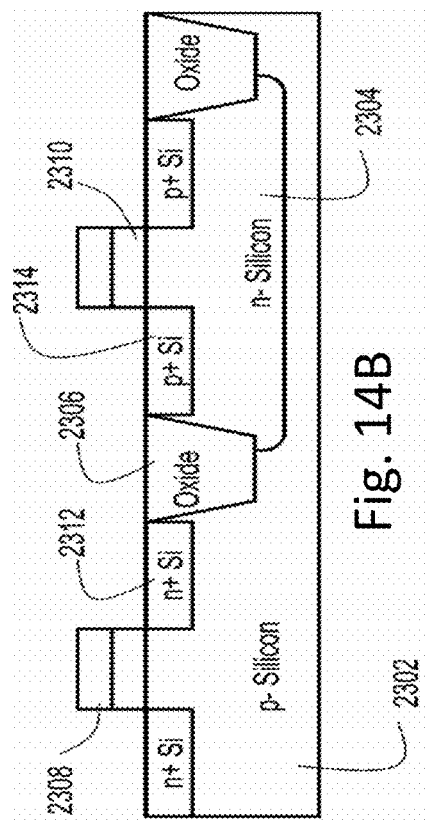
Figure 14D:
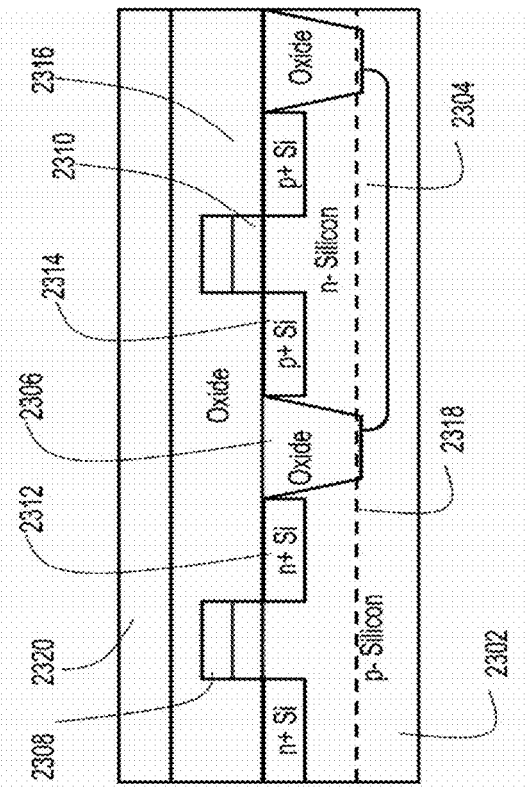
Figure 14E:
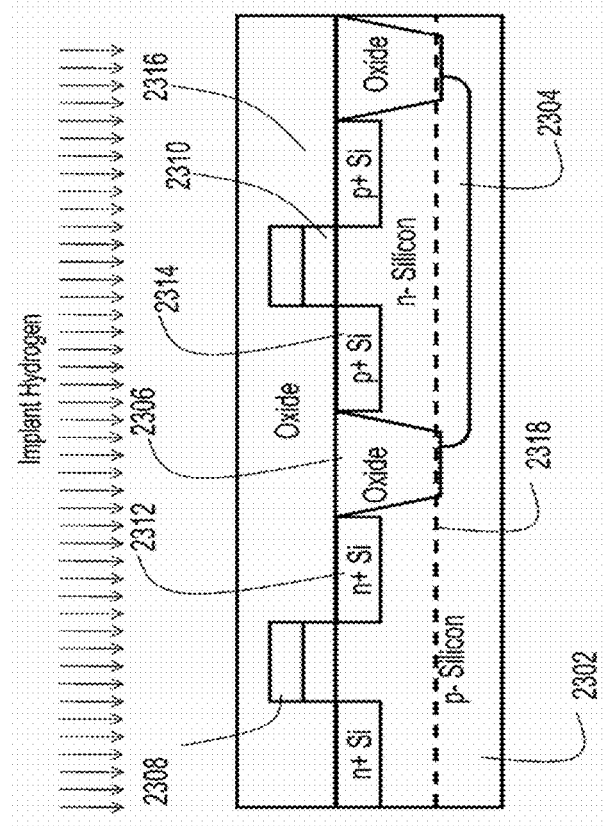
Figure 14F:
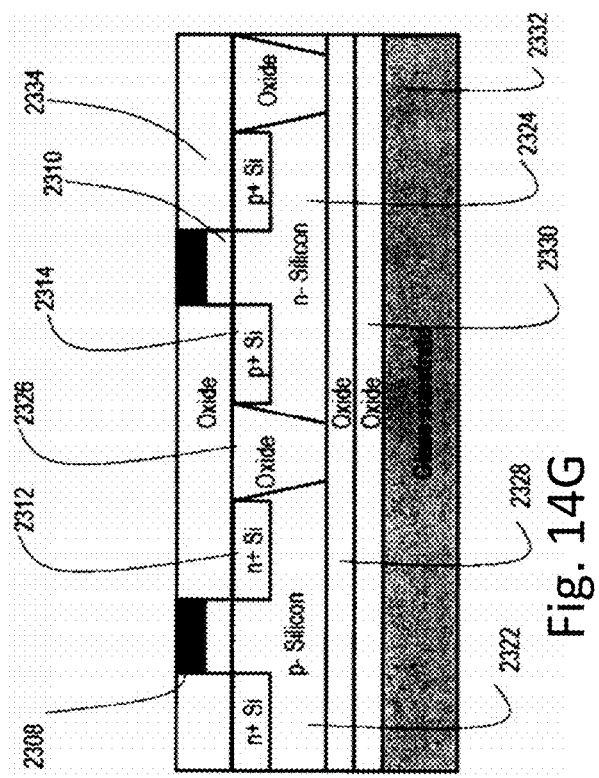
Figure 14G:
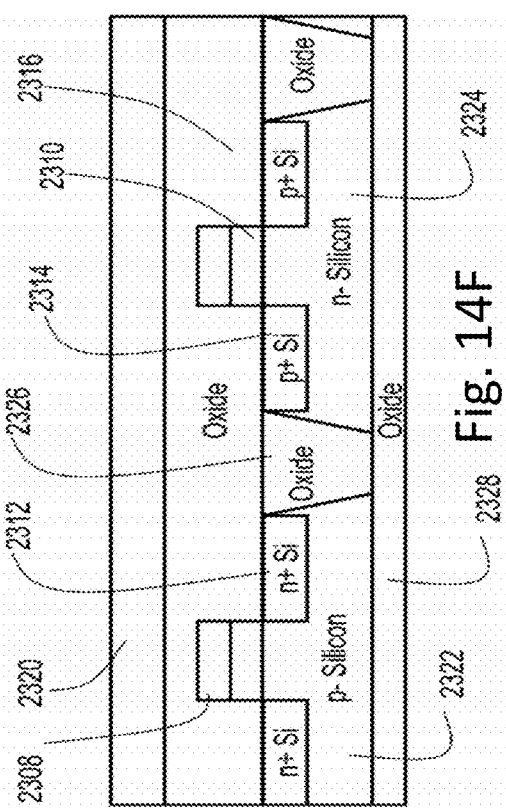
Figure 14H:
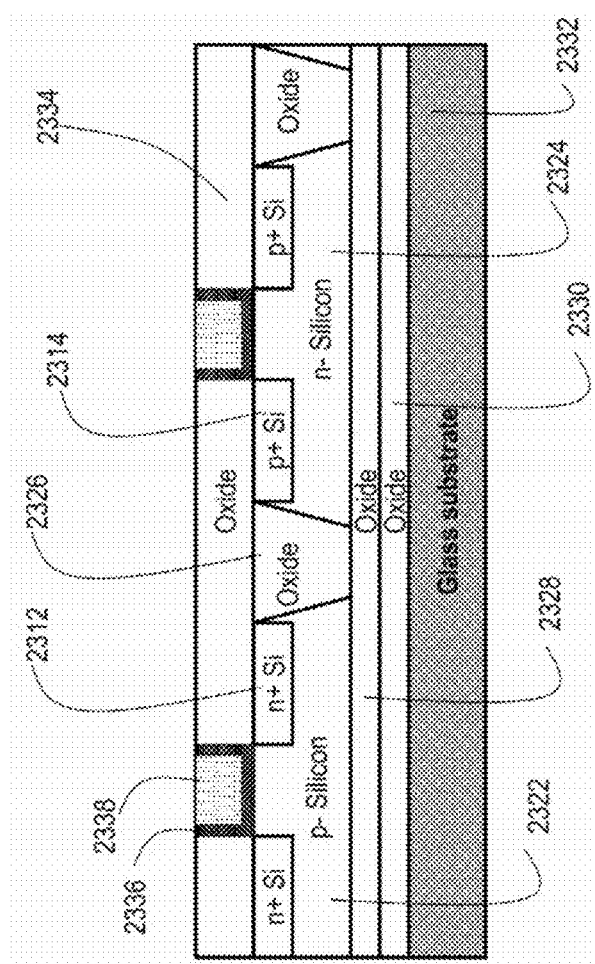

Step (A) is illustrated in FIG. 14A. A p− Silicon wafer 2302 is taken and a n well 2304 is formed on the p− Silicon wafer 2302. Various additional implants to optimize dopant profiles can also be done. Following this formation, an isolation process is conducted to form isolation regions 2306. A dummy gate dielectric 2310 made of silicon dioxide and a dummy gate electrode 2308 made of polysilicon are constructed. Step (B) is illustrated in FIG. 14B. Various elements of FIG. 14B, such as 2302, 2304, 2306, 2308 and 2310 have been described previously. Implants are done to form source-drain regions 2312 and 2314 for both nMOS and pMOS transistors. A rapid thermal anneal (RTA) is then done to activate dopants. Alternatively, a spike anneal or a laser anneal could be done. Step (C) is illustrated in FIG. 14C. Various elements of FIG. 14C such as 2302, 2304, 2306, 2308, 2310, 2312 and 2314 have been described previously. An oxide layer 2316 is deposited and planarized with CMP. Step (D) is described in FIG. 14D. Various elements of FIG. 14D such as 2302, 2304, 2306, 2308, 2310, 2312, 2314, and 2316 have been described previously. Hydrogen is implanted into the wafer at a certain depth indicated by 2318. Alternatively, helium can be implanted. Step (E) is illustrated in FIG. 14E. Various elements of FIG. 14E such as 2302, 2304, 2306, 2308, 2310, 2312, 2314, 2316, and 2318 have been described previously. Using a temporary bonding adhesive, the oxide layer is bonded to a temporary carrier wafer 2320. An example of a temporary bonding adhesive is a polyimide that can be removed by shining a laser. An example of a temporary carrier wafer is glass. Step (F) is described in FIG. 14F. The structure shown in FIG. 14E is cleaved at the hydrogen plane using a mechanical force. Alternatively, an anneal could be used. Following this cleave, a CMP is done to planarize the surface. An oxide layer is then deposited. FIG. 14F shows the structure after all these steps are done, with the deposited oxide layer indicated as 2328. After the cleave, the p− Silicon region is indicated as 2322, the n− Silicon region is indicated as 2324, and the oxide isolation regions are indicated as 2326. Various other elements in FIG. 14F such as 2308, 2320, 2312, 2314, 2310, and 2316 have been described previously. Step (G) is described in FIG. 14G. The structure shown in FIG. 14F is bonded to a glass substrate 2332 with an oxide layer 2330 using oxide-to-oxide bonding. Various elements in FIG. 14G such as 2308, 2326, 2322, 2324, 2312, 2314, and 2310 have been described previously. Oxide regions 2328 and 2330 are bonded together. The temporary carrier wafer from FIG. 14F is removed by shining a laser through it. A CMP process is then conducted to reach the surface of the gate electrode 2308. The oxide layer remaining is denoted as 2334. Step (H) is described in FIG. 14H. Various elements in FIG. 14H such as 2312, 2314, 2328, 2330, 2332, 2334, 2326, 2324, and 2322 have been described previously. The dummy gate dielectric and dummy gate electrode are etched away in this step and a replacement gate dielectric 2336 and a replacement gate electrode 2338 are deposited and planarized with CMP. Examples of replacement gate dielectrics could be hafnium oxide or aluminum oxide while examples of replacement gate electrodes could be TiN or TaN or some other material. Contact formation, metallization and other steps for building a display/microdisplay are then conducted. It can be observed that after attachment to the glass substrate, no process step requires a processing temperature above 400° C.

FIGS. 24A-F describe an embodiment of this invention, where single-crystal Silicon junction-less transistors are constructed above glass substrates at a temperature approximately less than 400° C. An ion-cut process (which is a smart layer transfer process) is utilized for this purpose. This process could include several steps that occur in a sequence from Step (A) to Step (F). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 15A:
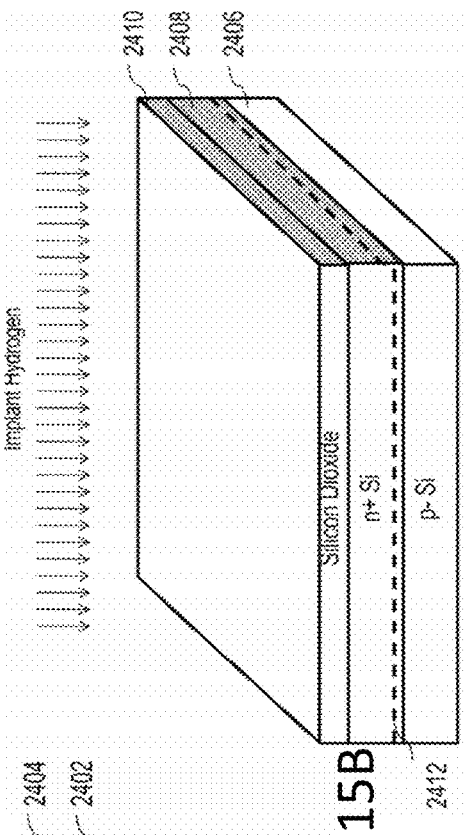
FIGS. 15A-15F are exemplary drawn illustrations of a display constructed using sub-400° C. processed single crystal junction-less transistors on a glass substrate.

Step (A) is illustrated in FIG. 15A. A glass substrate 2402 is taken and a layer of silicon oxide 2404 is deposited on the glass substrate 2402.

Figure 15B:
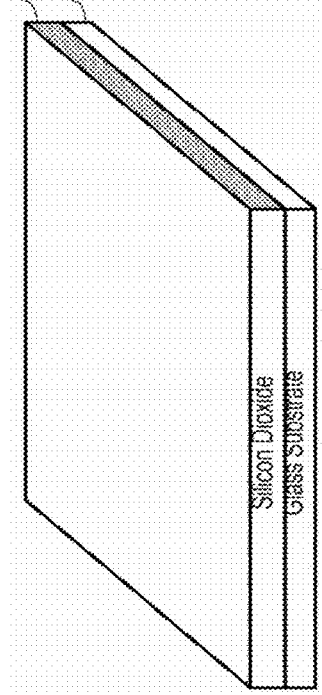
Figure 15C:
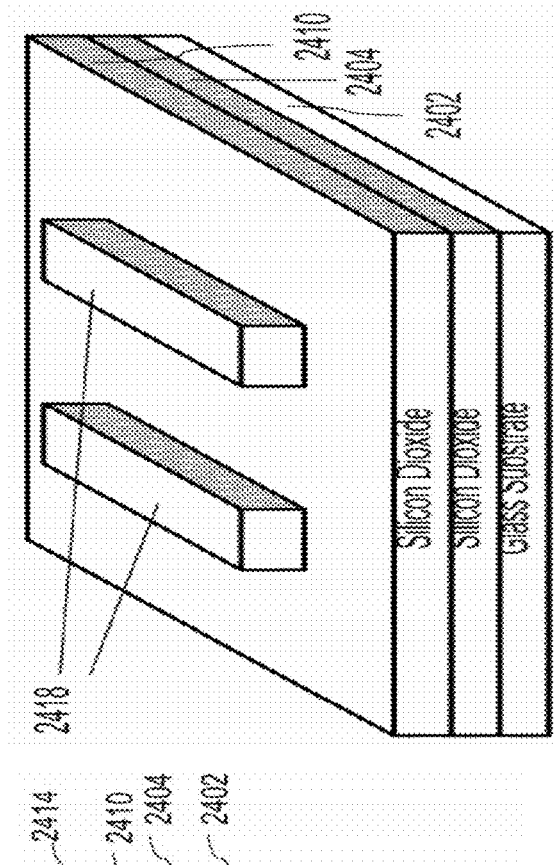
Figure 15D:
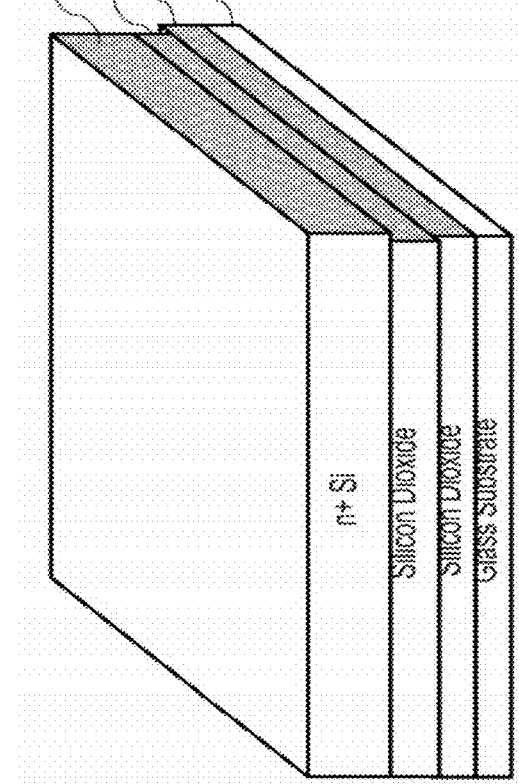

Step (B) is illustrated in FIG. 15B. A p− Silicon wafer 2406 is implanted with a n+ Silicon layer 2408 above which an oxide layer 2410 is deposited. A RTA or spike anneal or laser anneal is conducted to activate dopants. Following this, hydrogen is implanted into the wafer at a certain depth indicated by 2412. Alternatively, helium can be implanted. Step (C) is illustrated in FIG. 15C. The structure shown in FIG. 15B is flipped and bonded onto the structure shown in FIG. 15A using oxide-to-oxide bonding. This bonded structure is cleaved at its hydrogen plane, after which a CMP is done. FIG. 15C shows the structure after all these processes are completed. 2414 indicates the n+ Si layer, while 2402, 2404, and 2410 have been described previously. Step (D) is illustrated in FIG. 15D. A lithography and etch process is conducted to pattern the n+ Silicon layer 2414 in FIG. 15C to form n+ Silicon regions 2418 in FIG. 15D. The glass substrate is indicated as 2402 and the bonded oxide layers 2404 and 2410 are shown as well.

Figure 15F:
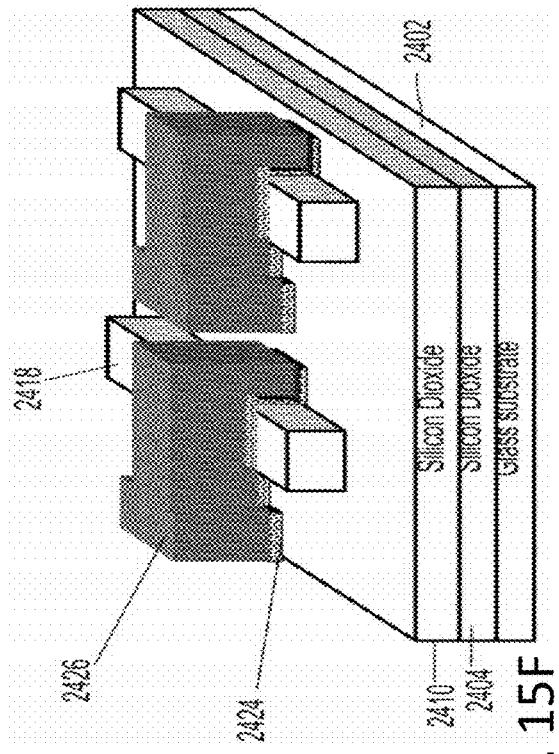
Figure 15E:
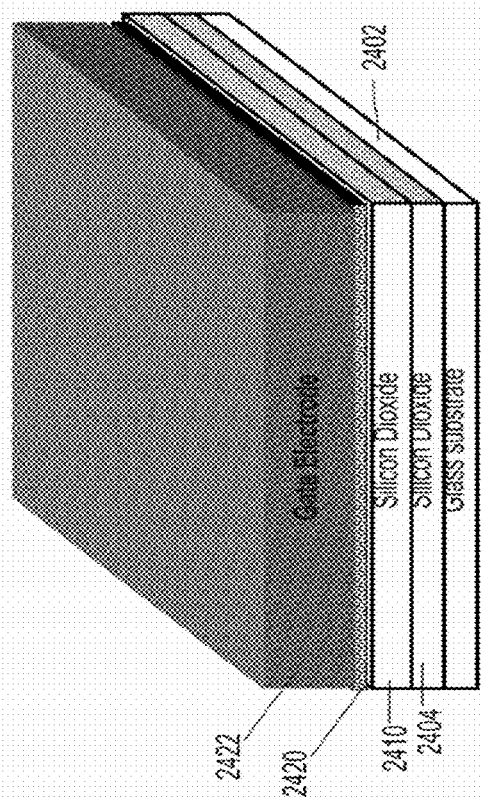

Step (E) is illustrated in FIG. 15E. A gate dielectric 2420 and gate electrode 2422 are deposited, following which a CMP is done. 2402 is as described previously. The n+ Si regions 2418 are not visible in this figure, since they are covered by the gate electrode 2422. Oxide regions 2404 and 2410 have been described previously.

Step (F) is illustrated in FIG. 15F. The gate dielectric 2420 and gate electrode 2422 from FIG. 15E are patterned and etched to form the structure shown in FIG. 15F. The gate dielectric after the etch process is indicated as 2424 while the gate electrode after the etch process is indicated as 2426. n+ Si regions are indicated as 2418 while the glass substrate is indicated as 2402. Oxide regions 2404 and 2410 have been described previously. It can be observed that a three-side gated junction-less transistor is formed at the end of the process described with respect of FIGS. 24A-F. Contacts, metallization and other steps for constructing a display/microdisplay are performed after the steps indicated by FIGS. 24A-F. It can be seen that the glass substrate is not exposed to temperatures greater than approximately 400° C. during any step of the above process for forming the junction-less transistor.

FIGS. 25A-D describe an embodiment of this invention, where amorphous Si or polysilicon junction-less transistors are constructed above glass substrates at a temperature less than 400° C. This process could include several steps that occur in a sequence from Step (A) to Step (D). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Figure 16B:
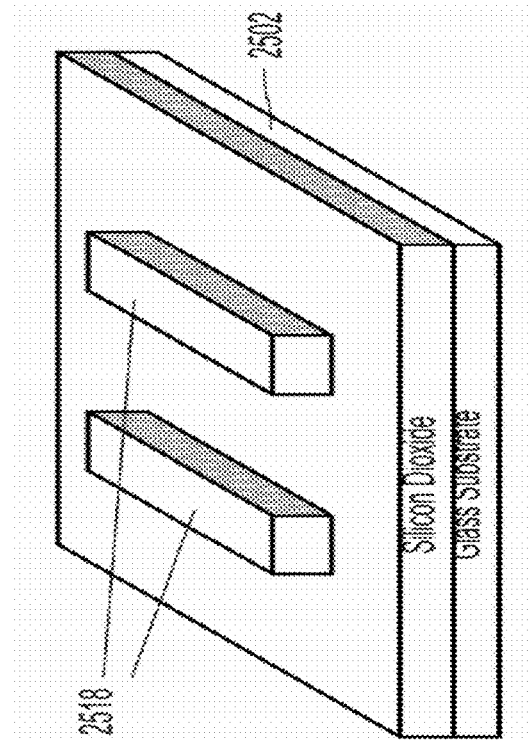
Figure 16A:
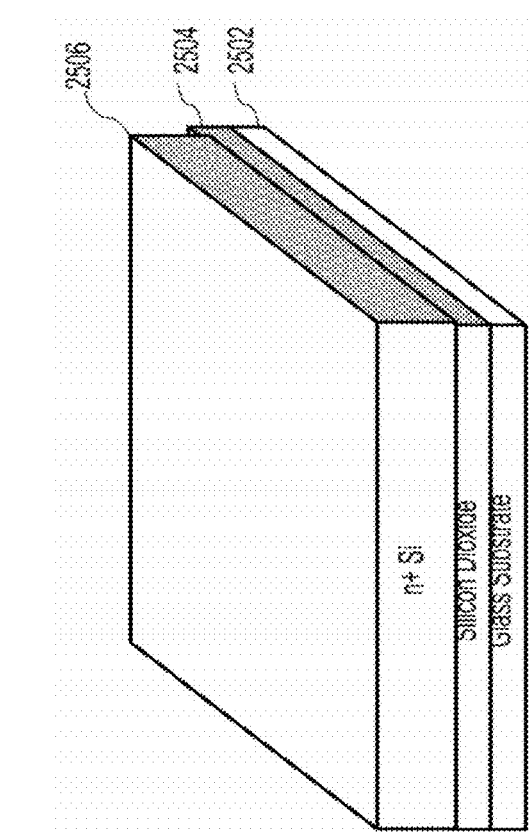

Step (A) is illustrated in FIG. 16A. A glass substrate 2502 is taken and a layer of silicon oxide 2504 is deposited on the glass substrate 2502. Following this deposition, a layer of n+ Si 2506 is deposited using low-pressure chemical vapor deposition (LPCVD) or plasma enhanced chemical vapor deposition (PECVD). This layer of n+ Si could optionally be hydrogenated. Step (B) is illustrated in FIG. 16B. A lithography and etch process is conducted to pattern the n+ Silicon layer 2506 in FIG. 16A to form n+ Silicon regions 2518 in FIG. 16B. 2502 and 2504 have been described previously. Step (C) is illustrated in FIG. 16C. A gate dielectric 2520 and gate electrode 2522 are deposited, following which a CMP is optionally done. 2502 is as described previously. The n+ Si regions 2518 are not visible in this figure, since they are covered by the gate electrode 2522. Step (D) is illustrated in FIG. 16D. The gate dielectric 2520 and gate electrode 2522 from FIG. 16C are patterned and etched to form the structure shown in FIG. 16D. The gate dielectric after the etch process is indicated as 2524 while the gate electrode after the etch process is indicated as 2526. n+ Si regions are indicated as 2518 while the glass substrate is indicated as 2502. It can be observed that a three-side gated junction-less transistor is formed at the end of the process described with respect of FIGS. 25A-D. Contacts, metallization and other steps for constructing a display/microdisplay are performed after the steps indicated by FIGS. 25A-D. It can be seen that the glass substrate is not exposed to temperatures greater than 400° C. during any step of the above process for forming the junction-less transistor.

FIGS. 26A-C illustrate an embodiment of this invention, where a microdisplay is constructed using stacked RGB LEDs and control circuits are connected to each pixel with solder bumps. This process could include several steps that occur in a sequence from Step (A) to Step (C). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 17A. Using procedures similar to FIG. 4A-S, the structure shown in FIG. 17A is constructed. Various elements of FIG. 17A are as follows:

2646—a glass substrate,

2644—an oxide layer, could be a conductive oxide such as ITO,

2634—an oxide layer, could be a conductive oxide such as ITO

2633—a an optional reflector, could be a Distributed Bragg Reflector or some other type of reflector,

2632—a P-type confinement layer that is used for a Blue LED (One example of a material for this region is GaN),

2630—a buffer layer that is typically used for a Blue LED (One example of a material for this region is AlGaN),

2628—a multiple quantum well used for a Blue LED (One example of materials for this region are InGaN/GaN),

2627—a N-type confinement layer that is used for a Blue LED (One example of a material for this region is GaN).

2648—an oxide layer, may be preferably a conductive metal oxide such as ITO,

2622—an oxide layer, may be preferably a conductive metal oxide such as ITO,

2621—an optional reflector (for example, a Distributed Bragg Reflector),

2620—a P-type confinement layer that is used for a Green LED (One example of a material for this region is GaN),

2618—a buffer layer that is typically used for a Green LED (One example of a material for this region is AlGaN),

2616—a multiple quantum well used for a Green LED (One example of materials for this region are InGaN/GaN),

2615—a N-type confinement layer that is used for a Green LED (One example of a material for this region is GaN),

2652—an oxide layer, may be preferably a conductive metal oxide such as ITO,

2610—an oxide layer, may be preferably a conductive metal oxide such as ITO,

2609—an optional reflector (for example, a Distributed Bragg Reflector),

2608—a P-type confinement layer used for a Red LED (One example of a material for this region is AlInGaP),

2606—a multiple quantum well used for a Red LED (One example of materials for this region are AlInGaP/GaInP),

2604—a P-type confinement layer used for a Red LED (One example of a material for this region is AlInGaP),

2656—an oxide layer, may be preferably a transparent conductive metal oxide such as ITO, and

2658—a reflector (for example, aluminum or silver).

Figures 17C, 18A:
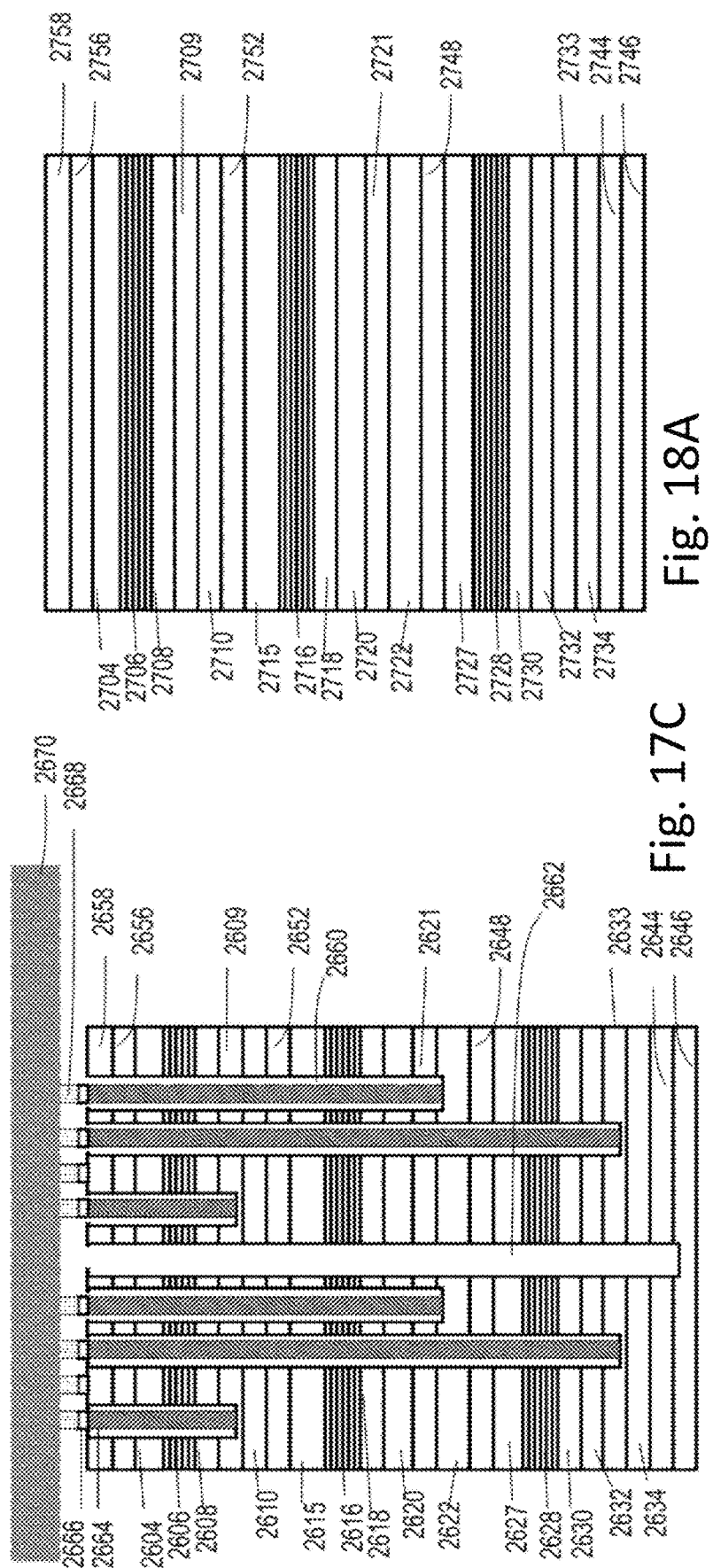

Step (B) is illustrated in FIG. 17B. Via holes 2662 are etched to the substrate layer 2646 to isolate different pixels in the microdisplay/display. Also, via holes 2660 are etched to make contacts to various layers of the stack. These via holes may be preferably not filled. An alternative is to fill the via holes with a compatible oxide and planarize the surface with CMP. Various elements in FIG. 17B such as 2646, 2644, 2634, 2633, 2632, 2630, 2628, 2627, 2648, 2622, 2621, 2620, 2618, 2616, 2615, 2652, 2610, 2609, 2608, 2606, 2604, 2656 and 2658 have been described previously. Step (C) is illustrated in FIG. 17C. Using procedures similar to those described in respect to FIGS. 4A-S, the via holes 2660 have contacts 2664 (for example, with Aluminum) made to them. Also, using procedures similar to those described in FIGS. 4A-S, nickel layers 2666, solder layers 2668, and a silicon sub-mount 2670 with circuits integrated on them are constructed. The silicon sub-mount 2670 has transistors to control each pixel in the microdisplay/display. Various elements in FIG. 17C such as 2646, 2644, 2634, 2633, 2632, 2630, 2628, 2627, 2648, 2622, 2621, 2620, 2618, 2616, 2615, 2652, 2610, 2609, 2608, 2606, 2604, 2656, 2660, 2662, and 2658 have been described previously. It can be seen that the structure shown in FIG. 17C can have each pixel emit a certain color of light by tuning the voltage given to the red, green and blue layers within each pixel. This microdisplay may be constructed using the ion-cut technology, a smart layer transfer technique.

FIGS. 27A-D illustrate an embodiment of this invention, where a microdisplay is constructed using stacked RGB LEDs and control circuits are integrated with the RGB LED stack. This process could include several steps that occur in a sequence from Step (A) to Step (D). Many of these steps share common characteristics, features, modes of operation, etc. When identical reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 18A. Using procedures similar to those illustrated in FIGS. 4A-S, the structure shown in FIG. 18A is constructed. Various elements of FIG. 18A are as follows:

2746—a glass substrate,

2744—an oxide layer, could be a conductive oxide such as ITO,

2734—an oxide layer, could be a conductive oxide such as ITO,

2733—a an optional reflector (e.g., a Distributed Bragg Reflector or some other type of reflector),

2732—a P-type confinement layer that is used for a Blue LED (One example of a material for this region is GaN),

2730—a buffer layer that is typically used for a Blue LED (One example of a material for this region is AlGaN),

2728—a multiple quantum well used for a Blue LED (One example of materials for this region are InGaN/GaN),

2727—a N-type confinement layer that is used for a Blue LED (One example of a material for this region is GaN),

2748—an oxide layer, may be preferably a conductive metal oxide such as ITO,

2722—an oxide layer, may be preferably a conductive metal oxide such as ITO,

2721—an optional reflector (e.g., a Distributed Bragg Reflector),

2720—a P-type confinement layer that is used for a Green LED (One example of a material for this region is GaN),

2718—a buffer layer that is typically used for a Green LED (One example of a material for this region is AlGaN),

2716—a multiple quantum well used for a Green LED (One example of materials for this region are InGaN/GaN),

2715—a N-type confinement layer that is used for a Green LED (One example of a material for this region is GaN),

2752—an oxide layer, may be preferably a conductive metal oxide such as ITO,

2710—an oxide layer, may be preferably a conductive metal oxide such as ITO,

2709—an optional reflector (e.g., a Distributed Bragg Reflector),

2708—a P-type confinement layer used for a Red LED (One example of a material for this region is AlInGaP),

2706—a multiple quantum well used for a Red LED (One example of materials for this region are AlInGaP/GaInP),

2704—a P-type confinement layer used for a Red LED (One example of a material for this region is AlInGaP),

2756—an oxide layer, may be preferably a transparent conductive metal oxide such as ITO,

2758—a reflector (e.g., aluminum or silver).

Figure 18D:
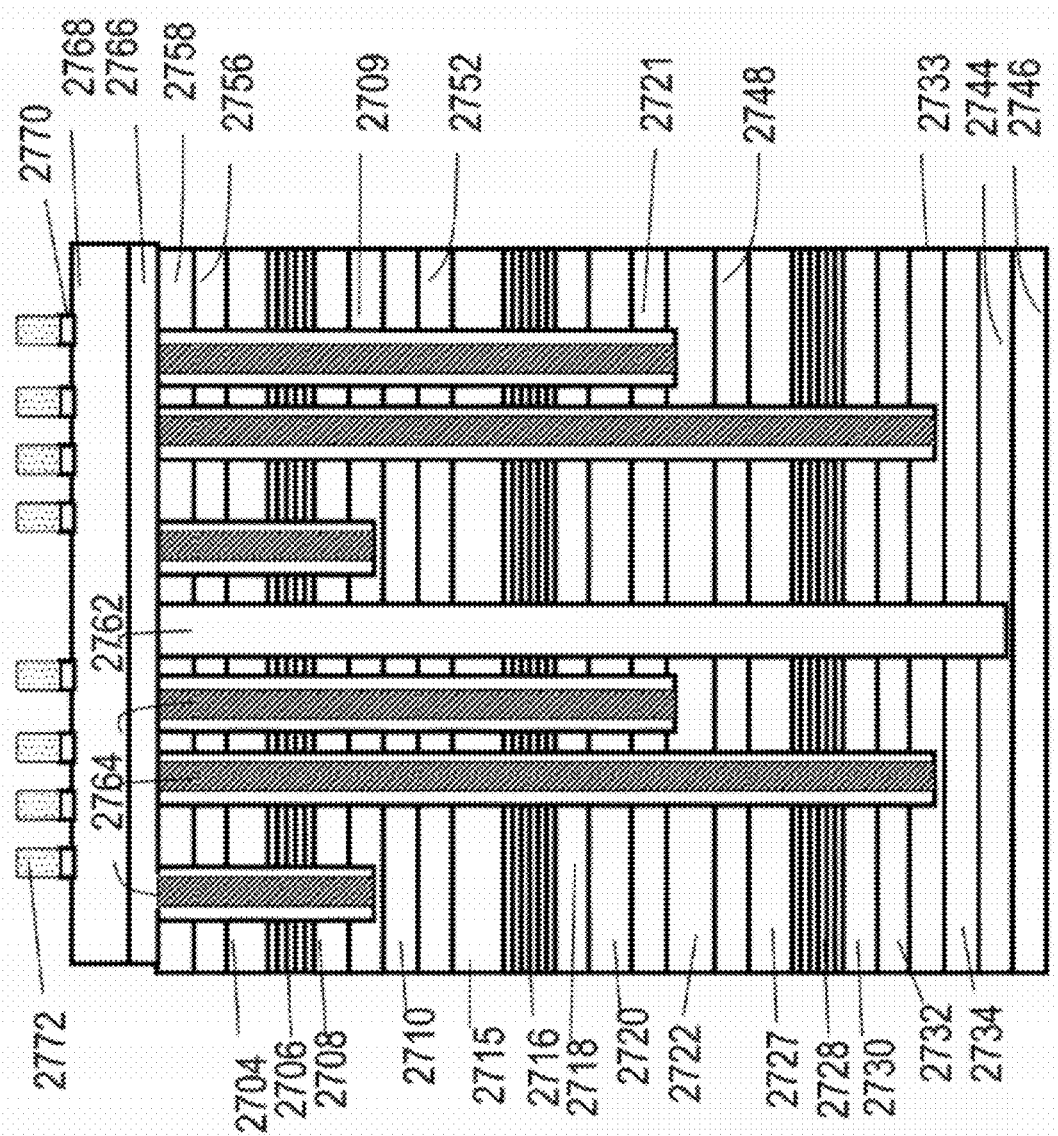

Step (B) is illustrated in FIG. 18B. Via holes 2762 are etched to the substrate layer 2746 to isolate different pixels in the microdisplay/display. Also, via holes 2760 are etched to make contacts to various layers of the stack. These via holes may be preferably filled with a compatible oxide and the surface can be planarized with CMP. Various elements of FIG. 18B such as 2746, 2744, 2734, 2733, 2732, 2730, 2728, 2727, 2748, 2722, 2721, 2720, 2718, 2716, 2715, 2752, 2710, 2709, 2708, 2706, 2704, 2756 and 2758 have been described previously. Step (C) is illustrated in FIG. 18C. Metal 2764 (for example) is constructed within the via holes 2760 using procedures similar to those described in respect to FIGS. 4A-S. Following this construction, an oxide layer 2766 is deposited. Various elements of FIG. 18C such as 2746, 2744, 2734, 2733, 2732, 2730, 2728, 2727, 2748, 2722, 2721, 2720, 2718, 2716, 2715, 2752, 2710, 2709, 2708, 2706, 2704, 2756, 2760, 2762 and 2758 have been described previously. Step (D) is illustrated in FIG. 18D. Using procedures described in co-pending U.S. patent application Ser. No. 12/901,890, the content of which is incorporated herein by reference, a single crystal silicon transistor layer 2768 can be monolithically integrated using ion-cut technology atop the structure shown in FIG. 18C. This transistor layer 2768 is connected to various contacts of the stacked LED layers (not shown in the figure for simplicity). Following this connection, nickel layer 2770 is constructed and solder layer 2772 is constructed. The packaging process then is conducted where the structure shown in FIG. 18D is connected to a silicon sub-mount. It can be seen that the structure shown in FIG. 18D can have each pixel emit a certain color of light by tuning the voltage given to the red, green and blue layers within each pixel. This microdisplay is constructed using the ion-cut technology, a smart layer transfer technique. This process where transistors are integrated monolithically atop the stacked RGB display can be applied to the LED concepts disclosed in association with FIGS. 4-10.

The embodiments of this invention described in FIGS. 26-27 may enable novel implementations of "smart-lighting concepts" (also known as visible light communications) that are described in "Switching LEDs on and off to enlighten wireless communications", EETimes, June 2010 by R. Colin Johnson. For these prior art smart lighting concepts, LED lights could be turned on and off faster than the eye can react, so signaling or communication of information with these LED lights is possible. An embodiment of this invention involves designing the displays/microdisplays described in FIGS. 26-27 to transmit information, by modulating wavelength of each pixel and frequency of switching each pixel on or off. One could thus transmit a high bandwidth through the visible light communication link compared to a LED, since each pixel could emit its own information stream, compared to just one information stream for a standard LED. The stacked RGB LED embodiment described in FIGS. 4A-S could also provide a improved smart-light than prior art since it allows wavelength tunability besides the ability to turn the LED on and off faster than the eye can react.

3-D Micro-Display

The three-dimensional (3D) display of images has been demonstrated by the use of holography to the use of 3D glasses that use either color or polarization. The main technique in common with these methods is to induce stereoscopic vision by making each eye see a slightly offset image on the screen. Though effective in fooling the human brain into seeing images in 3D, the problem with these techniques is that even though the desired effect can be achieved, the brain eventually is strained, resulting in headaches for several individuals. FIG. 19A illustrates the source of the straining of the brain. A system 3900 may be set up such that the viewer 3902 is observing an object 3910 projected on a display 3904. The source of the strain is from the fact that the actual image of the object 3910 is still a fixed distance on the screen, while the image of the object perceived in the brain 3912 can be within a few inches of the viewer 3902 or several miles away in perceived distance. As such, the eyes are focused on a screen several feet away while the brain perceives an image at a different location, and this separation of reality and image leads to brain and/or eye strain.

In micro-displays, where the actual images are small but through the use of lenses are magnified to possibly life-size as interpreted by the brain, this problem of eye/brain separation may also exist. The distances, however, are compressed by the magnification ratio of the lenses and thus the result is not as severe and is easier to rectify. A possible solution is to move the display physically so as to show images according to their apparent distance from the viewer. If the objects at their respective distances are shown in succession faster than the brain can perceive movement, then the brain will see all objects at various apparent distances all at once, hence creating a total image containing all the object distance information, and will appear as an actual 3D image.

As the brain perceives distance in greater detail when close than farther away, the physical steps of the plane of the display may be arranged in nonlinear fashion, with more steps related to distances closer to the viewer and less steps related to distances further away, that is, of increasing intervals as the distance grows larger with for example, a geometric relationship.

Assuming enough 3D details of the objects in the image are available, an external joystick may also be used to control the vantage point of the image or object/s to allow for virtual stage rotation.

FIG. 19B illustrates an embodiment of the invention, where a display system 3920 may be set-up such that viewer 3922 observes an image which may consist of far object 3930 and near object 3932 projected onto the display 3924. The display 3924 is enabled to physically move back and forth with respect to the viewer 3922 such that it may start from the far end displaying only the far object 3930 and move forward to the near end (nearer to viewer 3922) displaying only the near object 3932. Any objects that may be of intermediate distance from the viewer may then be displayed on the display 3924 during the sweep at their respective distances, but only one-at-a-time if the distances are distinct. In order to make the objects appear as one 3D image perceived by the brain, this forward and backward sweep of the display 3924 may be performed at a rate faster than about 24 cycles per second. If the image is intended to show progression as in a movie, then the forward and backward sweep of the display 3924 may be performed at a rate faster than the frame rate of the movie multiplied by 24 cycles per second. An actuator with a fast motor which may be used to achieve such actuation speed may include, for example, a piezo-electric motor (not shown).

FIG. 19C illustrates another embodiment of the invention, where a display system 3940 may be setup similar to display system 3920 in FIG. 19B with viewer 3942 observing an image projected onto the moving display 3944. The moving display 3944 may sweep forward and backward with respect to viewer 3942 similar to display system 3920 but the sweep steps 3946 may not be of constant value but may be of nonlinear magnitudes of the distance of the image objects. This takes advantage of the fact that the brain, by result of angular perception, recognizes differences in distances in greater detail when objects are closer and lesser detail when objects are further, so thus the display step resolution for closer objects is necessarily dense but may be progressively relaxed at greater object distances, such as shown by exemplary sweep steps 3946.

FIG. 19D illustrates another embodiment of the invention, where a display system 3960 may be setup similar to display system 3920 in FIG. 19B with viewer 3962 observing an image object 3970 projected onto the moving display 3964. Computer 3968 may contain 3D data of image object 3970 available for display and may be connected via link 3972 to the display 3964. Computer 3968 may also be connected via link 3974 to joystick 3966, which allows viewer 3962 to control the orientation of the image object 3970 according to available 3D data stored in computer 3968.

Adding to the RGB LED level a driver circuit and image control circuit could utilize layer transfer technologies, hybrid bonding technologies and post-bonding thinning technologies which could utilize techniques such as have been presented in at least U.S. patent application Ser. No. 16/649,660 and in at least U.S. Pat. Nos. 10,991,675 and 11,158,598, the entire contents of all of the foregoing are incorporated herein by reference.

A MicroLED display is a self-emissive display technology. There are at least two possible major routes to implement a display based on microLEDs. An individually singulated MicroLED could be tested and picked and transferred onto a driving circuit. Alternatively, as in at least one embodiment herein, a fully monolithic array of microLEDs could be fabricated on a wafer. In the latter approach, the yield of the monolithic microLED could be affected by various process steps including epitaxial process and patterning, which may result in a non-uniformity or failure in some pixels. In this regard, some embodiments of this invention are a few methods to overcome bad pixels in a monolithic microLED display.

In one embodiment of this bad pixel management, a pixel size is miniaturized as small as possible beyond the limit that human eye can recognize the defect. For example, the pixel size could be smaller than about 0.5 µm×0.5 µm or smaller than about 1 µm×1 µm.

In such a case, the driver circuit could be managed to compensate for the missing pixel by an extra lowering of light level by the surrounding pixels to keep the overall display light constant as is presented later herein.

In another embodiment of bad pixel management is a hybridized method of monolithic microLED based display as display followed by selective pick-and-transfer operation for repair. A key innovation of this approach is related to the elimination method of a bad pixel. A simplified process steps/flow for such is illustrated in FIG. 20A-20D. The backbone of microLED displays is fabricated based on monolithic integration as shown in FIG. 20A. Next, an inspection, for example optical, is conducted and the bad pixel address(es) are captured for repair as shown in FIG. 20B. Next, an etch, for example, such as, a focused ion beam process, may be applied to the bad pixel to remove/eliminate it, as illustrated in FIG. 20C. Accordingly, the bad pixel address is logged in the inspection step, thus the focused ion beam selectively etches only those bad pixels without damaging the operative/good pixels. The etching may be conducted until the bottom pad electrodes are substantially exposed (not drawn). Finally, as illustrated in FIG. 20D, a singulated microLED which has undergone and passed testing is picked and placed into the etched pixel hole. This approach combines the advantages of low cost and high throughput of monolithic microLED display and the repairability of individually picked-and-placed micro LED.

In another embodiment of bad pixel management is about using a redundancy pair of microLED pixels. In the previous art, for example U.S. Pat. No. 10,964,900 B2, incorporated herein by reference, a redundant pair of microLEDs per primary color per pixel was used to form a pixel. The redundant microLED could be utilized to compensate for the irregularity of the overall pixel. In this prior art, the redundant pair of microLEDs is formed in-plane or a set of microLEDs are placed side by side. This arrangement would limit spatial resolution. In this embodiment of the invention, a redundancy pair of microLEDs is vertically stacked, wherein at least two independent primary colors per pixel is aligned vertically, as illustrated in FIG. 21. Depending on wavelength transmission limits, material thickness, and engineering tradeoffs and considerations, a wafer sized stack of 3 microLEDs may be constructed, thus delivering full RGB within each pixel.

In another option for simple vertical redundancy, one embodiment of the present invention presents a redundant through layer via structure. As shown in FIG. 22, an individual microLED pixel may include primary electrodes as well as through layer bypass vias. The primary electrode would be connected directly to the driving circuit or indirectly to the driving circuit via through layer bypass vias. The top portion of the through layer bypass via may be aligned to the bottom of the primary electrode.

As illustrated in FIG. 23, another inventive embodiment may include vertically stacking the microLEDs with redundant through layer bypass vias. Such a practice could be used to, but not limited to, form the repair. A primary microLED layer is monolithically formed or pick-and-placed onto a display driving circuit layer. Then, a second microLED layer is stacked onto the first microLED layer. The primary electrode of the first microLED is directly connected to the circuit layer. The primary electrode of the second microLED may be indirectly connected to the circuit layer thru a through layer bypass via originating in the first microLED layer.

Figure 24:
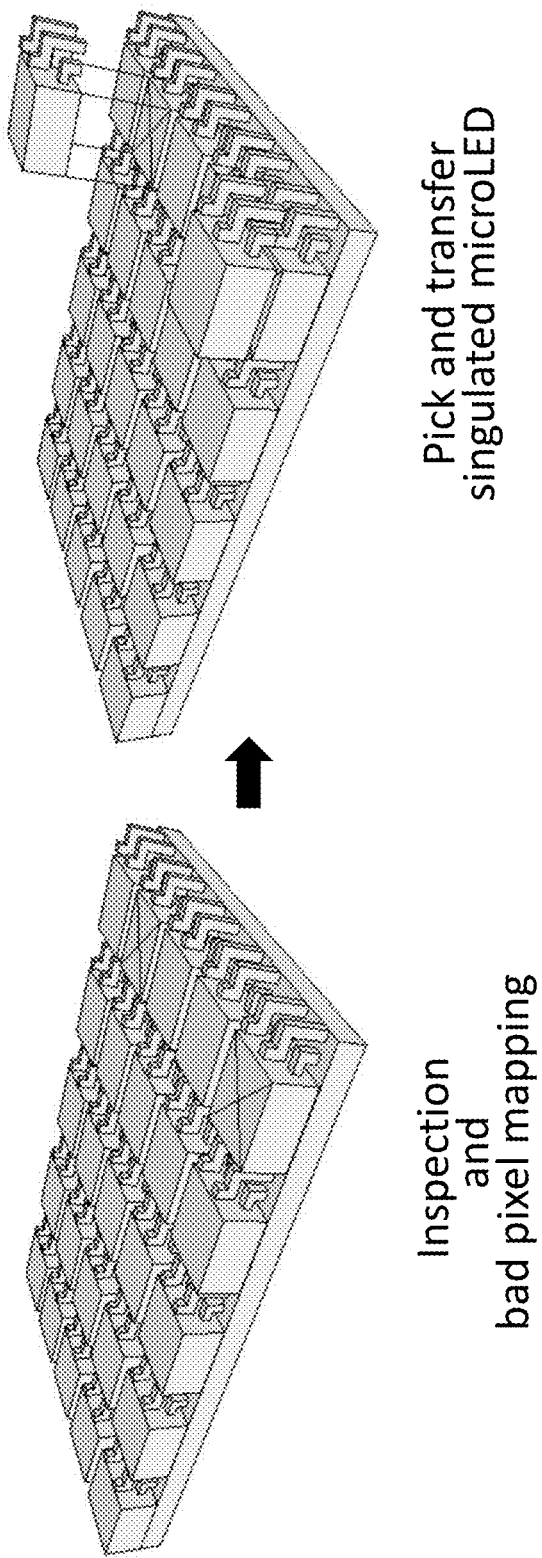
FIG. 24 is an exemplary drawn illustration of pick-and-transfer repair based on the microLED having through layer bypass vias.

Leveraging those approaches using redundant through layer bypass vias, an alternative method and structure of bad pixel management based on a hybridized method of monolithic microLED displays as a base display followed by selective pick-and-transfer for repair is presented in this inventive embodiment. In this embodiment, the bad pixel does not necessarily need to be eliminated as illustrated in the FIG. 20A-20D. FIG. 24 illustrates an exemplary process step of pick-and-transfer repair based on the microLED having a through layer bypass via. The optical inspection is conducted on the microLED display and the bad pixel address are captured for repair. While bad pixels exist, singulated microLED which undergone and passed the test are picked and placed on the bad pixel according to the bad pixel address logged in the inspection step.

In another embodiment of this invention, the driving circuit would include a compensation circuit that can be tailored and tuned to mitigate the irregularities. The driving circuit may include a non-volatile memory or circuit such as embedded flash, resistive switching memory, antifuse or other non-voltage memory that stores the information for compensate the irregularity base on test result. The function compensation circuit may include a selector between the primary microLED or the redundant microLED, weights of the driving strength of individual microLED.

In another embodiment of this invention, the driving circuit would include a compensation circuit that can compensate the bad pixel without physically repairing it. When the test detects a bad pixel, the compensation circuit disables that specific bad pixel. In this case, the display would show a dark pixel, which might disturb the vision of the display user as it would appear as a black dot. In order to compensate for such an 'empty' pixel, neighboring pixels such as two or four or eight neighboring pixels could be overweighted in brightness so that the overdriving could compensate for the emptiness/darkness of the bad pixel.

Persons of ordinary skill in the art will appreciate that while image "objects" has been referred to as display targets, these may equivalently be replaced by the term image "pixels". Many other modifications within the scope of the illustrated embodiments of the invention will suggest themselves to such skilled persons after reading this specification. Thus the invention is to be limited only by the appended claims, if any. Persons of ordinary skill in the art will appreciate that while image "objects" have been referred to as display targets, these may equivalently be replaced by the term image "pixels".

Persons of ordinary skill in the art will appreciate that while image "objects" has been referred to as display targets, these may equivalently be replaced by the term image "pixels". Moreover, the nonlinear steps of the display forward-backward sweep described in FIG. 39 FIG. 19C may be of any resolution and may involve any type of nonlinear relationships with viewer distance as desired. Many other modifications within the scope of the illustrated embodiments of the invention will suggest themselves to such skilled persons after reading this specification. Thus the invention is to be limited only by the appended claims Persons of ordinary skill in the art will appreciate that while image "objects" has been referred to as display targets, these may equivalently be replaced by the term image "pixels". Moreover, the nonlinear steps of the display forward-backward sweep described in FIG. 19C may be of any resolution and may involve any type of nonlinear relationships with viewer distance as desired.

Many other modifications within the scope of the illustrated embodiments of the invention will suggest themselves to such skilled persons after reading this specification. Thus the invention is to be limited only by the appended claims

We claim:

1. A 3D micro display, the 3D micro display comprising:
a first level comprising a first single crystal layer, said first single crystal layer comprises a plurality of LED driving circuits;
a second level comprising a first plurality of light emitting diodes (LEDs), said first plurality of LEDs comprising a second single crystal layer,
wherein said first level is disposed on top of said second level,
wherein said second level comprises at least ten individual first LED pixels; and
a bonding structure,
wherein said bonding structure comprises oxide to oxide bonding.

2. The 3D micro display according to claim 1,
wherein a plurality of said at least ten individual first LED pixels are individually driven, and
wherein each of said plurality of said at least ten individual first LED pixels is driven by at least one of said plurality LED driving circuits.

3. The 3D micro display according to claim 1, further comprising:
a bottom surface of said first single crystal layer; and
a top surface of said second single crystal layer,
wherein a vertical distance is a distance from said bottom surface of said first single crystal layer to said top surface of said second single crystal layer, and
wherein said vertical distance is less than ten microns and greater than 0.1 microns.

4. The 3D micro display according to claim 1, further comprising:
a second plurality of light emitting diodes (LEDs),
wherein said first plurality of LEDs emits a first light with a first wavelength,
wherein said second plurality of LEDs emits a second light with a second wavelength, and
wherein said first wavelength and said second wavelength differ by greater than 10 nm.

5. The 3D micro display according to claim 1,
wherein said first single crystal layer thickness is greater than 10 nm and smaller than 50 micrometers.

6. The 3D micro display according to claim 1,
wherein said second single crystal layer thickness is greater than 10 nm and smaller than 50 micrometers.

7. The 3D micro display according to claim 1,
wherein at least one LED driving circuit comprises n type devices and p type devices.

8. A 3D micro display, the 3D micro display comprising:
a first level comprising a first single crystal layer, said first single crystal layer comprises a plurality of LED driving circuits;
a second level comprising a first plurality of light emitting diodes (LEDs), said first plurality of LEDs comprising a second single crystal layer,
wherein said first level is disposed on top of said second level,
wherein said second level comprises at least ten individual first LED pixels; and
a bonding structure,
wherein said first level is bonded to said second level, and
wherein said bonded comprises oxide to oxide bonding.

9. The 3D micro display according to claim 8,
wherein a plurality of said at least ten individual first LED pixels are individually driven, and
wherein each of said plurality of said at least ten individual first LED pixels is driven by a unique at least one of said plurality LED driving circuit.

10. The 3D micro display according to claim 8, further comprising:
a bottom surface of said first single crystal layer; and
a top surface of said second single crystal layer,
wherein a vertical distance is a distance from said bottom surface of said first single crystal layer to said top surface of said second single crystal layer, and
wherein said vertical distance is less than ten microns and greater than 0.1 microns.

11. The 3D micro display according to claim 8, further comprising:
a second plurality of light emitting diodes (LEDs),
wherein said first plurality of LEDs emits a first light with a first wavelength,
wherein said second plurality of LEDs emits a second light with a second wavelength, and
wherein said first wavelength and said second wavelength differ by greater than 10 nm.

12. The 3D micro display according to claim 8,
wherein said first single crystal layer thickness is greater than 10 nm and smaller than 50 micrometers.

13. The 3D micro display according to claim 8,
wherein said second single crystal layer thickness is greater than 10 nm and smaller than 50 micrometers.

14. The 3D micro display according to claim 8,
wherein at least one of said plurality of LED driving circuit comprises n type devices and p type devices.

15. A 3D micro display, the 3D micro display comprising:
a first level comprising a first single crystal layer, said first single crystal layer comprises plurality of LED driving circuits;
a second level comprising a first plurality of light emitting diodes (LEDs), said first plurality of LEDs comprising a second single crystal layer,
wherein said first level is disposed on top of said second level,
wherein said second level comprises at least ten individual first LED pixels,
wherein said at least 10 individual LED pixels have been made individual by an etch process; and
a bonding structure,
wherein said first level is bonded to said second level, and
wherein said bonded comprises oxide to oxide bonding.

16. The 3D micro display according to claim 15,
wherein a plurality of said at least ten individual first LED pixels are individually driven, and
wherein each of said plurality of said at least ten individual first LED pixels is driven by at least one of said plurality of LED driving circuits.

17. The 3D micro display according to claim 15, further comprising:
a bottom surface of said first single crystal layer; and
a top surface of said second single crystal layer, wherein a vertical distance is a distance from said bottom surface of said first single crystal layer to said top surface of said second single crystal layer, and wherein said vertical distance is less than ten microns and greater than 0.1 microns.

18. The 3D micro display according to claim 15, further comprising:

a second plurality of light emitting diodes (LEDs), wherein said first plurality of LEDs emits a first light with a first wavelength, wherein said second plurality of LEDs emits a second light with a second wavelength, and wherein said first wavelength and said second wavelength differ by greater than 10 nm.

19. The 3D micro display according to claim 15, wherein said first single crystal layer thickness is greater than 10 nm and smaller than 50 micrometers.

20. The 3D micro display according to claim 15, wherein at least one of said plurality of LED driving circuits comprises n type devices and p type devices.

* * * * *